(12) United States Patent
Kawashima et al.

(10) Patent No.: US 11,762,250 B2
(45) Date of Patent: *Sep. 19, 2023

(54) DISPLAY DEVICE AND ELECTRONIC DEVICE

(71) Applicant: SEMICONDUCTOR ENERGY LABORATORY CO., LTD., Atsugi (JP)

(72) Inventors: Susumu Kawashima, Kanagawa (JP); Naoto Kusumoto, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/963,243

(22) Filed: Oct. 11, 2022

(65) Prior Publication Data

US 2023/0036898 A1 Feb. 2, 2023

Related U.S. Application Data

(63) Continuation of application No. 17/047,149, filed as application No. PCT/IB2019/053250 on Apr. 19, 2019, now Pat. No. 11,513,405.

(30) Foreign Application Priority Data

Apr. 26, 2018 (JP) ................. 2018-085668

(51) Int. Cl.
*G09G 3/30* (2006.01)
*G02F 1/1362* (2006.01)
(Continued)

(52) U.S. Cl.
CPC ........ *G02F 1/13624* (2013.01); *G02F 1/1368* (2013.01); *G02F 1/136286* (2013.01);
(Continued)

(58) Field of Classification Search
CPC ......... G09G 3/3688; G09G 2300/0417; G09G 2300/0443; G09G 2300/0804;
(Continued)

(56) References Cited

U.S. PATENT DOCUMENTS 6,528,951 B2   3/2003   Yamazaki et al.
7,298,347 B2   11/2007  Yamazaki et al.
(Continued)

FOREIGN PATENT DOCUMENTS

CN   001329368 A   1/2002
CN   001591532 A   3/2005
(Continued)

OTHER PUBLICATIONS

International Search Report (Application No. PCT/IB2019/053250) dated Jul. 16, 2019.
(Continued)

*Primary Examiner* — Thuy N Pardo
(74) *Attorney, Agent, or Firm* — Fish & Richardson P.C.

(57) ABSTRACT

A display device capable of improving image quality is provided. A display device includes a plurality of pixel blocks in a display region. The pixel blocks each include a first circuit and a plurality of second circuits. The first circuit has a function of adding a plurality of pieces of data supplied from a source driver. The second circuit includes a display element and has a function of performing display in accordance with the added data. One pixel has a configuration including one second circuit and an component of the first circuit that is shared. When the first circuit is shared by a plurality of pixels, the aperture ratio can be increased.

10 Claims, 35 Drawing Sheets

(51) Int. Cl.
*G02F 1/1368* (2006.01)
*H01L 27/12* (2006.01)
*G09G 3/3225* (2016.01)
*G09G 3/3266* (2016.01)
*G09G 3/36* (2006.01)
*H04N 23/57* (2023.01)
*H10K 59/121* (2023.01)

(52) U.S. Cl.
CPC ...... *H01L 27/1225* (2013.01); *H01L 27/1255* (2013.01); *G09G 3/3225* (2013.01); *G09G 3/3266* (2013.01); *G09G 3/3677* (2013.01); *G09G 2300/0426* (2013.01); *G09G 2300/0465* (2013.01); *G09G 2300/0852* (2013.01); *G09G 2310/0286* (2013.01); *G09G 2320/0233* (2013.01); *G09G 2330/021* (2013.01); *H04N 23/57* (2023.01); *H10K 59/1213* (2023.02); *H10K 59/1216* (2023.02)

(58) Field of Classification Search
CPC ... G09G 2300/0819; G09G 2300/0842; G09G 2300/0861; G09G 2310/0259; G09G 2310/066; G09G 2320/0252; G09G 3/36; H01L 27/326; H01L 27/32; H01L 29/786; G09F 9/30; G02F 1/133
USPC ................. 345/76, 88, 174, 214, 90, 91, 211
See application file for complete search history.

(56) References Cited

U.S. PATENT DOCUMENTS

| | | | |
|---|---|---|---|
| 7,375,711 B2 | 5/2008 | Horiuchi et al. | |
| 7,602,380 B2 | 10/2009 | Yoshida et al. | |
| 7,674,650 B2 | 3/2010 | Akimoto et al. | |
| 7,680,988 B1 | 3/2010 | Nickolls et al. | |
| 7,732,819 B2 | 6/2010 | Akimoto et al. | |
| 7,910,490 B2 | 3/2011 | Akimoto et al. | |
| 8,274,077 B2 | 9/2012 | Akimoto et al. | |
| 8,466,463 B2 | 6/2013 | Akimoto et al. | |
| 8,629,069 B2 | 1/2014 | Akimoto et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,860,108 B2 | 10/2014 | Yamazaki et al. | |
| 8,912,541 B2 | 12/2014 | Yamazaki et al. | |
| 8,976,090 B2 | 3/2015 | Yamamoto et al. | |
| 9,099,562 B2 | 8/2015 | Akimoto et al. | |
| 9,601,052 B2 | 3/2017 | Jeon | |
| 10,140,940 B2 | 11/2018 | Aoki | |
| 10,304,962 B2 | 5/2019 | Akimoto et al. | |
| 10,545,377 B2 | 1/2020 | Mizuno et al. | |
| 2008/0308805 A1 | 12/2008 | Akimoto et al. | |
| 2010/0134458 A1 | 6/2010 | Suyama | |
| 2011/0104851 A1 | 5/2011 | Akimoto et al. | |
| 2011/0121290 A1 | 5/2011 | Akimoto et al. | |
| 2011/0157264 A1 | 6/2011 | Seshadri et al. | |
| 2012/0218247 A1* | 8/2012 | Yamauchi | G09G 3/3648 345/211 |
| 2012/0223978 A1 | 9/2012 | Yamamoto et al. | |
| 2013/0286001 A1* | 10/2013 | Nakano | G09G 3/3618 345/91 |
| 2013/0292671 A1 | 11/2013 | Yamazaki et al. | |
| 2014/0361960 A1* | 12/2014 | Yamauchi | G09G 3/3233 345/76 |
| 2015/0109347 A1* | 4/2015 | Wen | G09G 3/3607 345/88 |
| 2015/0264341 A1* | 9/2015 | Seshadri | G09G 3/003 345/214 |
| 2015/0379947 A1* | 12/2015 | Sang | G09G 3/3607 349/37 |
| 2016/0202819 A1* | 7/2016 | Chen | G06F 3/04184 345/174 |
| 2017/0025080 A1* | 1/2017 | Aoki | H01L 27/1225 |
| 2017/0263204 A1 | 9/2017 | Tanaka et al. | |
| 2018/0061376 A1 | 3/2018 | Aoki et al. | |
| 2018/0174507 A1 | 6/2018 | Ohara et al. | |
| 2019/0051759 A1 | 2/2019 | Akimoto et al. | |
| 2019/0096304 A1 | 3/2019 | Hu | |
| 2019/0228703 A1 | 7/2019 | Gu et al. | |
| 2019/0251909 A1* | 8/2019 | Talebzadeh | G09G 3/3233 |
| 2019/0326444 A1 | 10/2019 | Akimoto et al. | |
| 2019/0327809 A1* | 10/2019 | Watsuda | H03K 19/20 |
| 2019/0355303 A1* | 11/2019 | Yamazaki | G09G 3/006 |
| 2020/0150490 A1 | 5/2020 | Mizuno et al. | |

FOREIGN PATENT DOCUMENTS

| | | |
|---|---|---|
| CN | 001734315 A | 2/2006 |
| CN | 101997005 A | 3/2011 |
| CN | 102654979 A | 9/2012 |
| CN | 107783745 A | 3/2018 |
| EP | 1168291 A | 1/2002 |
| EP | 1635250 A | 3/2006 |
| JP | 2007-096055 A | 4/2007 |
| JP | 2007-123861 A | 5/2007 |
| JP | 2011-119674 A | 6/2011 |
| JP | 2012-145655 A | 8/2012 |
| JP | 2012-185328 A | 9/2012 |
| JP | 2017-027012 A | 2/2017 |
| JP | 2018-021974 A | 2/2018 |
| KR | 2014-0127689 A | 11/2014 |
| WO | WO-2013/129216 | 9/2013 |

OTHER PUBLICATIONS

Written Opinion (Application No. PCT/IB2019/053250) dated Jul. 16, 2019.

Chinese Office Action (Application No. 201980026665.0) dated Jun. 8, 2022.

* cited by examiner

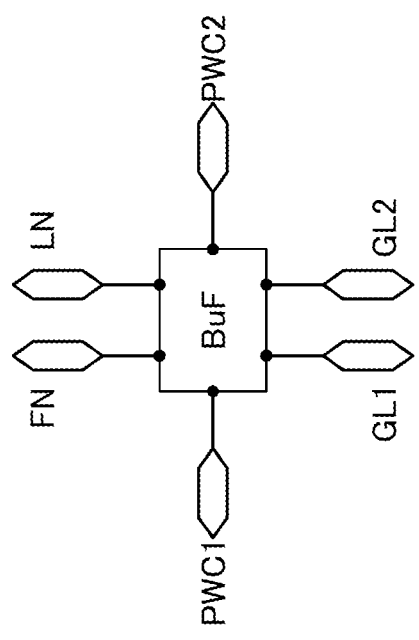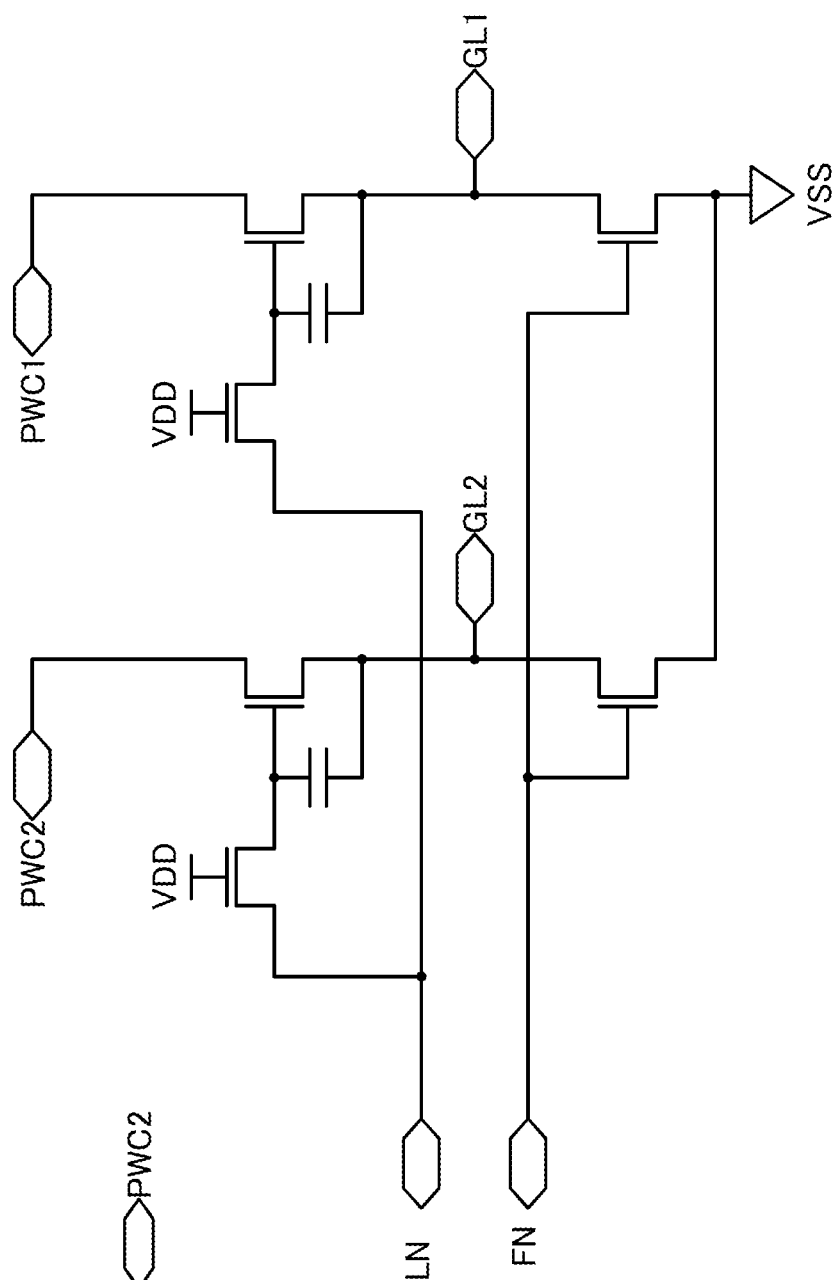

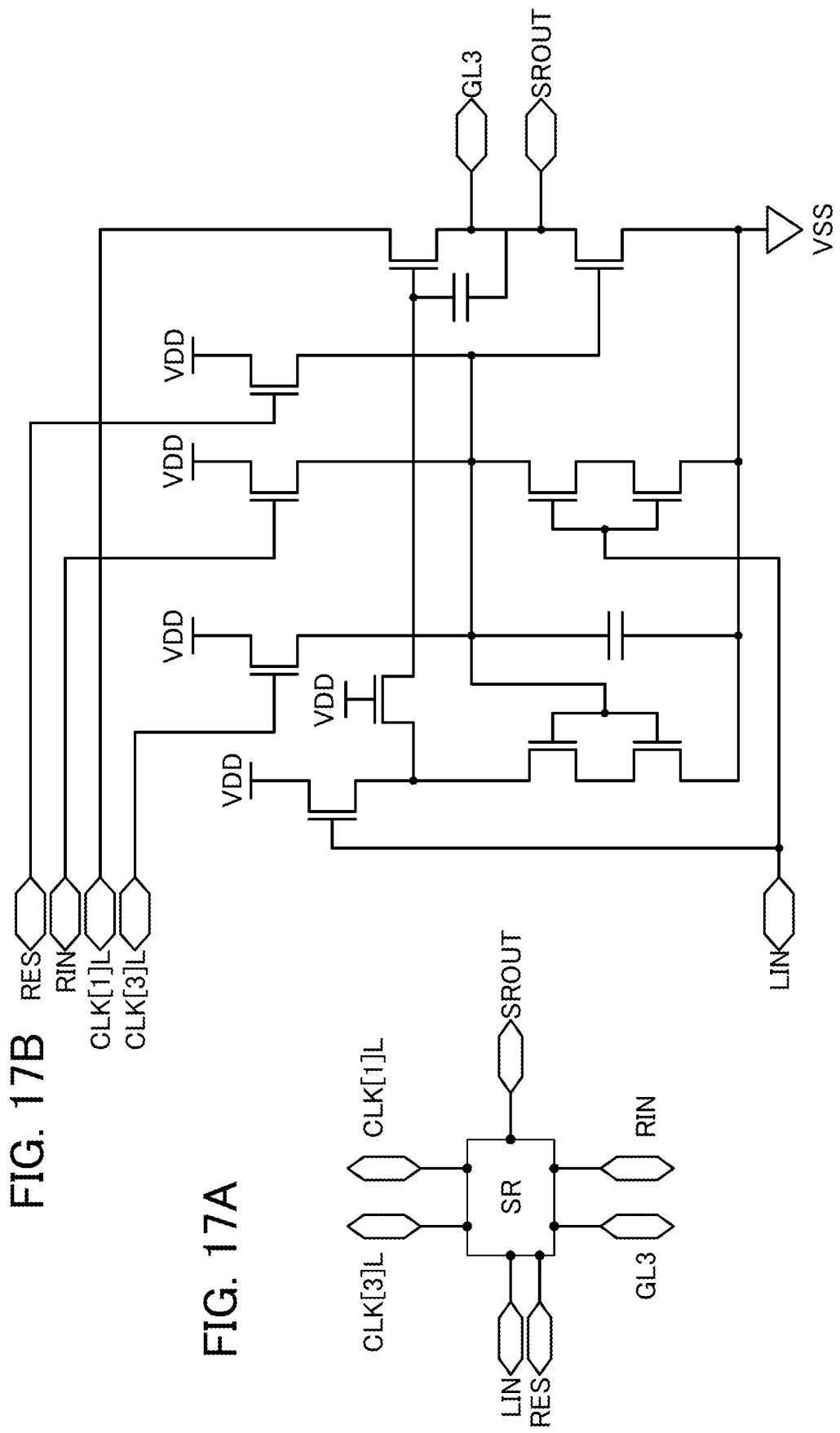

Type 1

Type 2

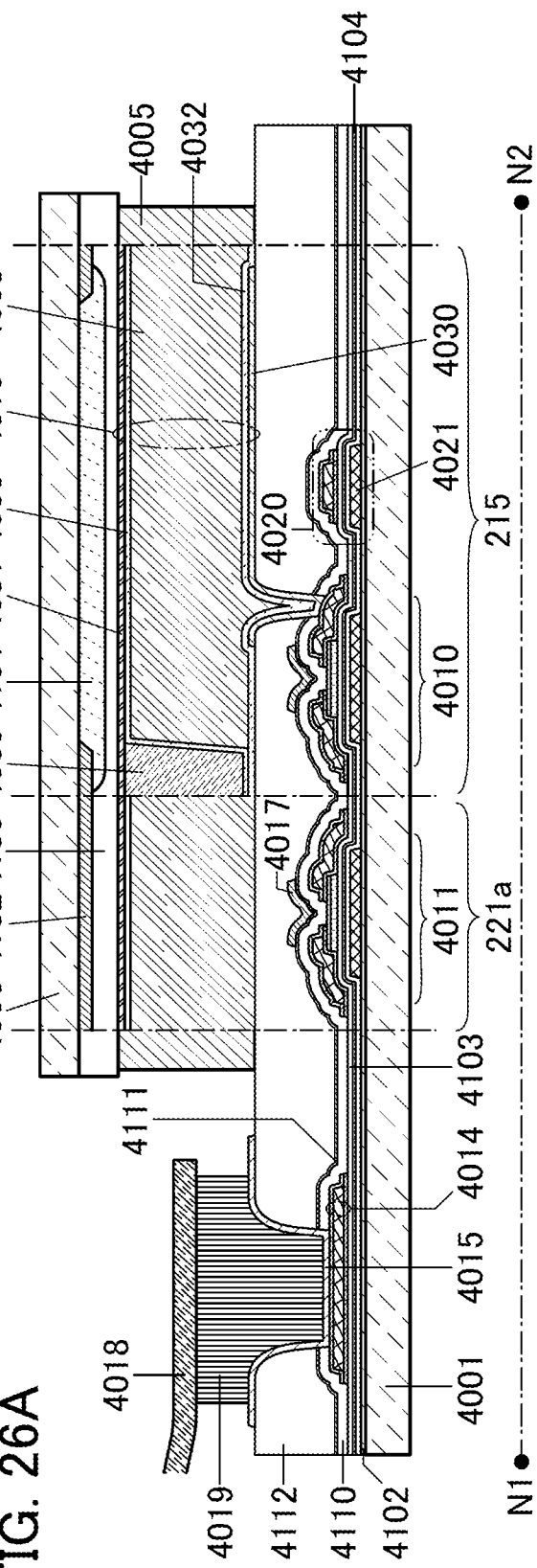
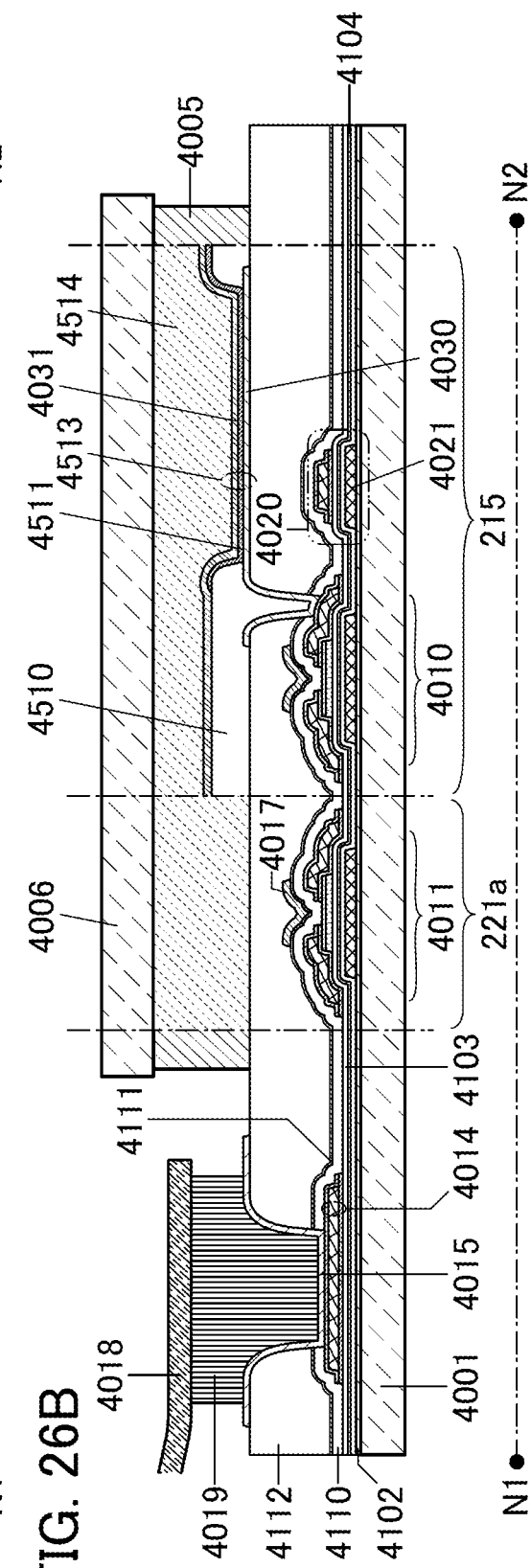
FIG. 26A
FIG. 26B

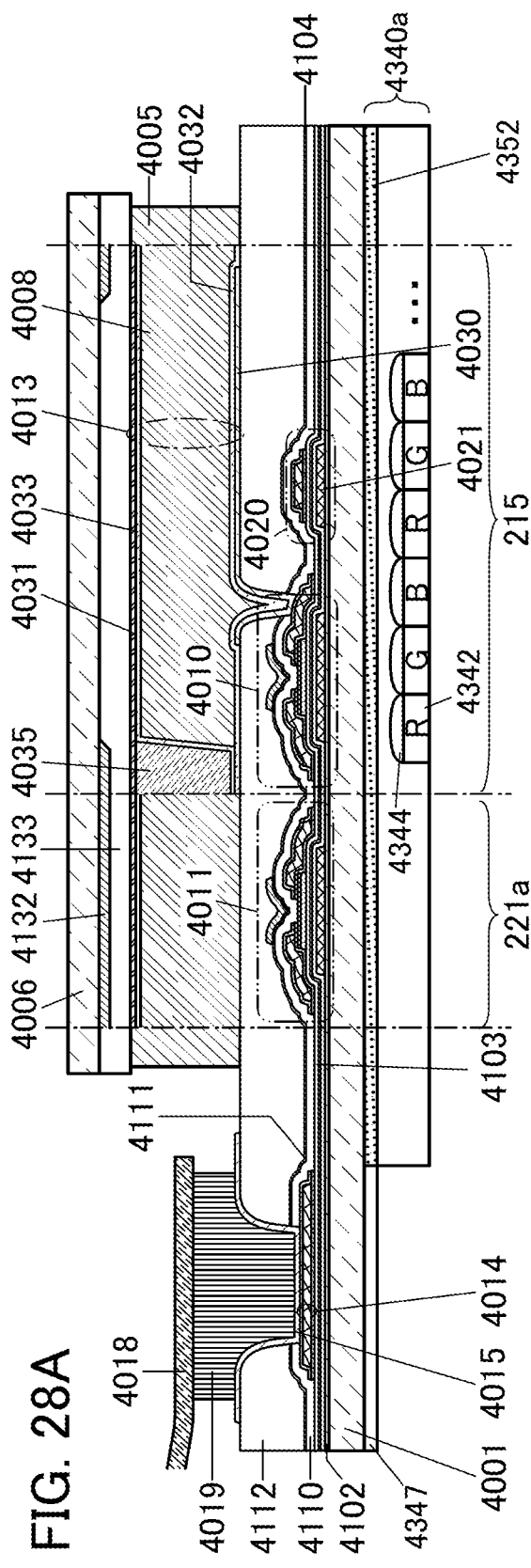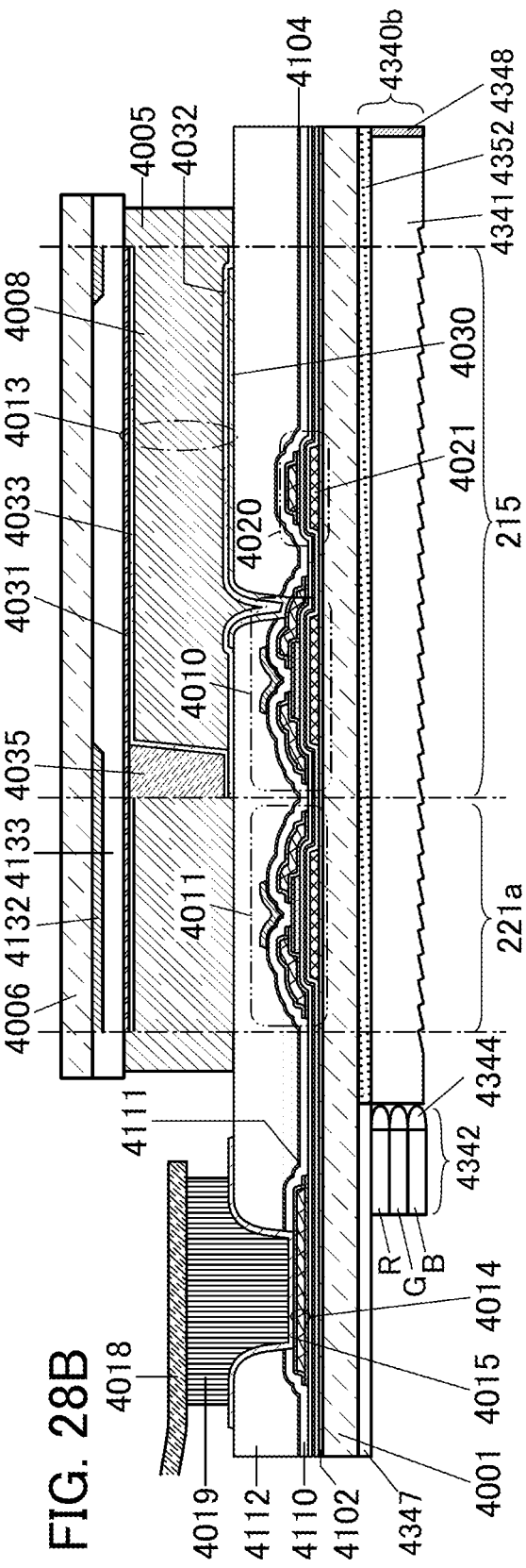

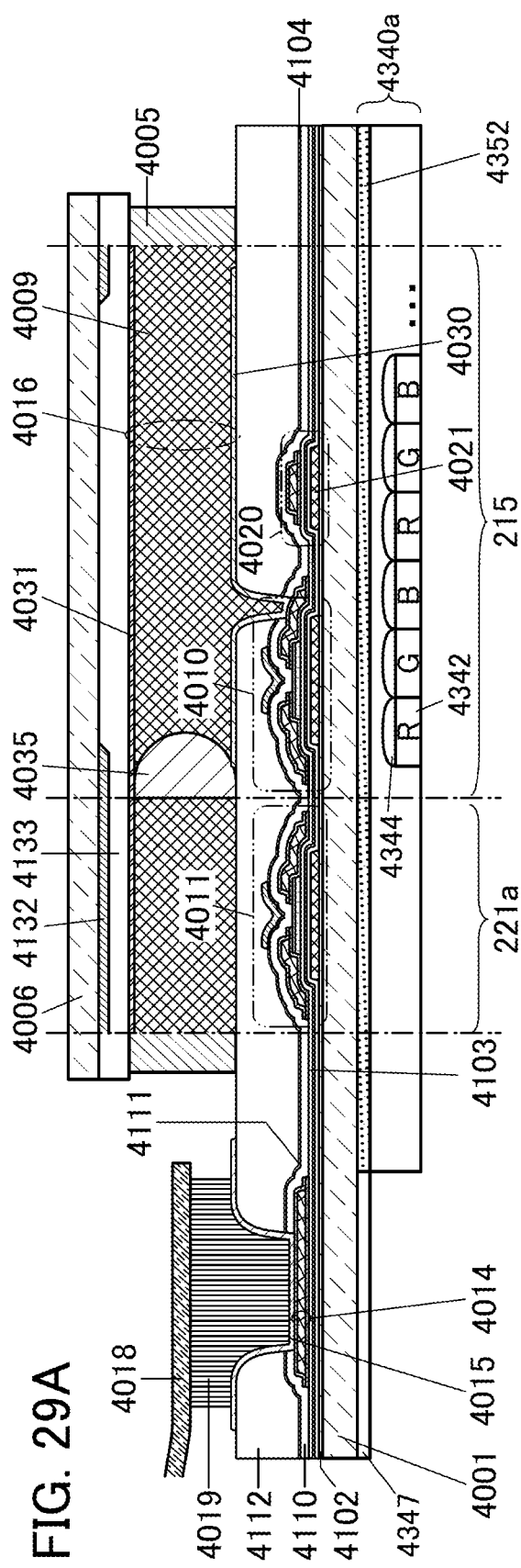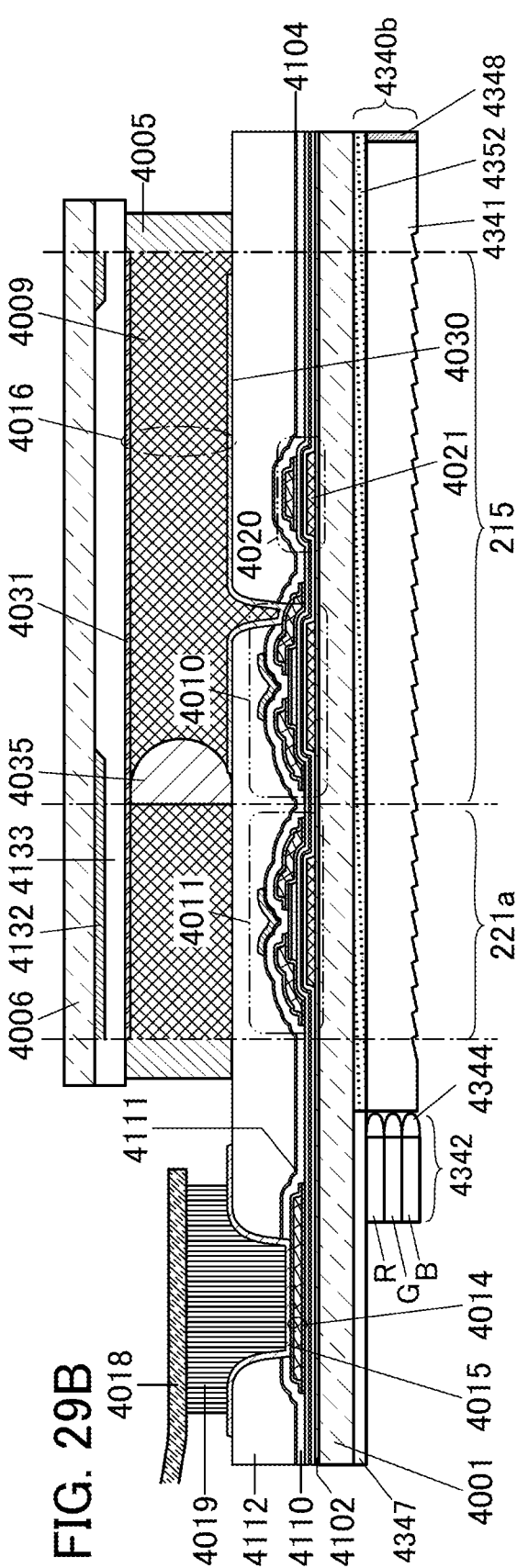

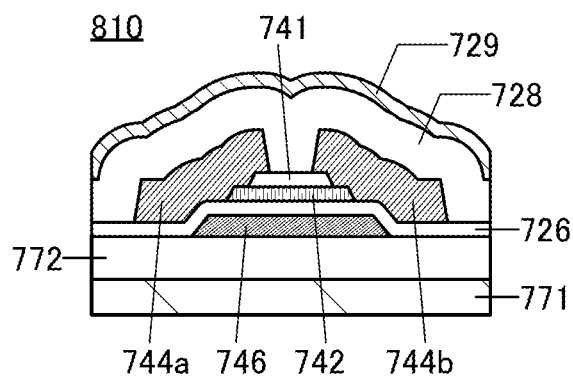
FIG. 31A1
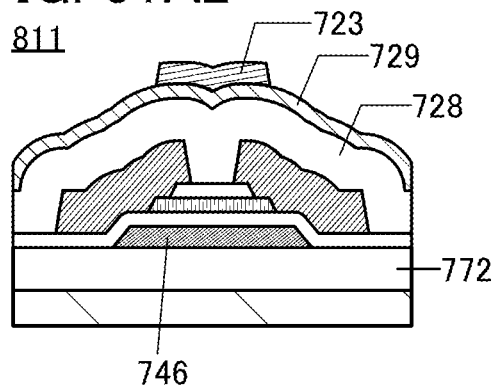
FIG. 31A2
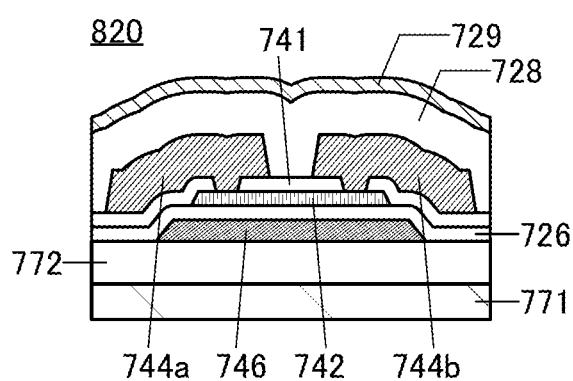
FIG. 31B1
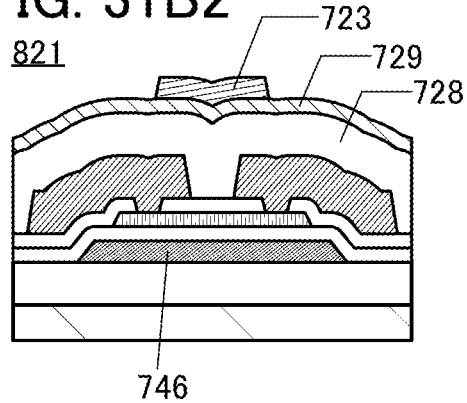
FIG. 31B2
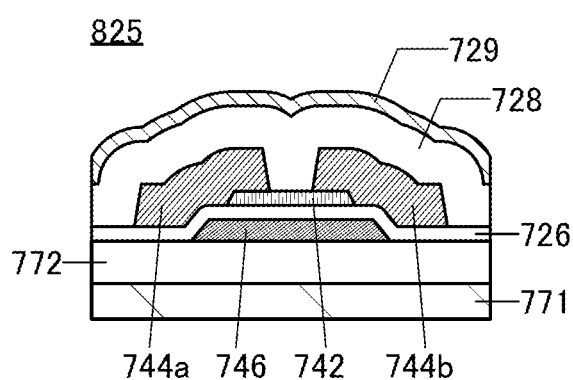
FIG. 31C1
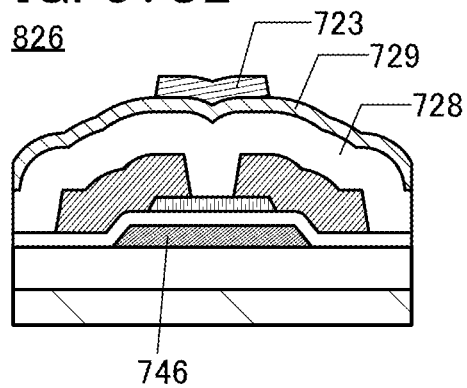
FIG. 31C2

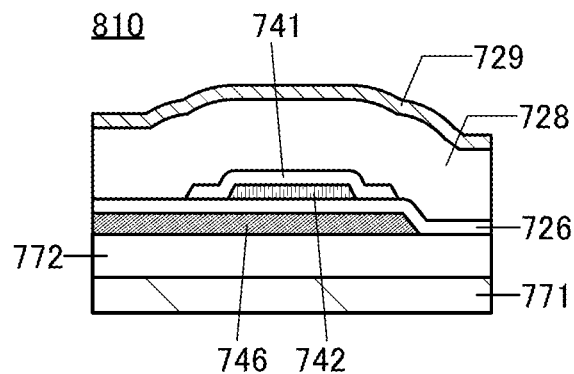
FIG. 32A1
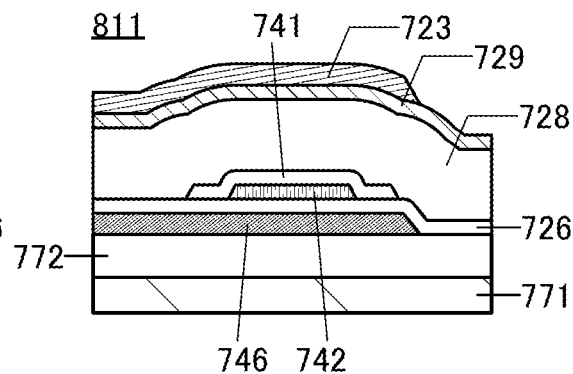
FIG. 32A2
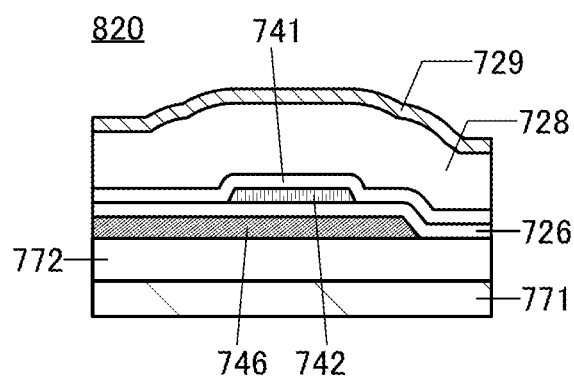
FIG. 32B1
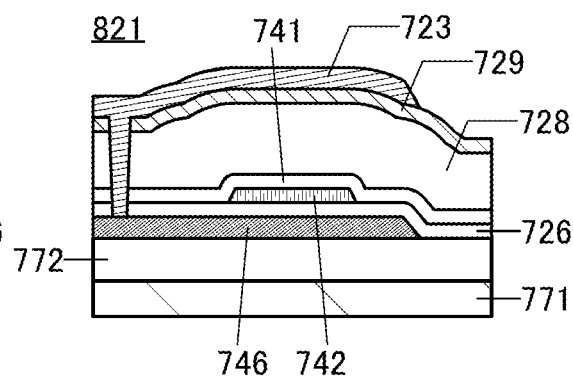
FIG. 32B2
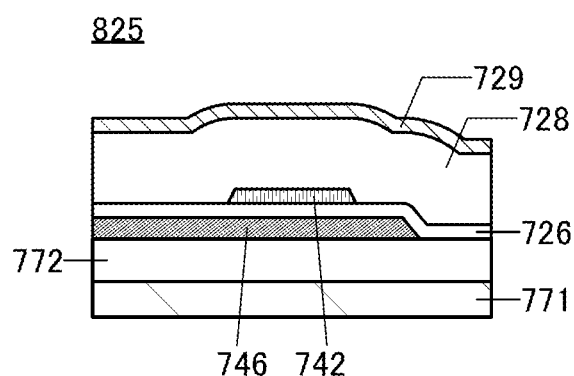
FIG. 32C1
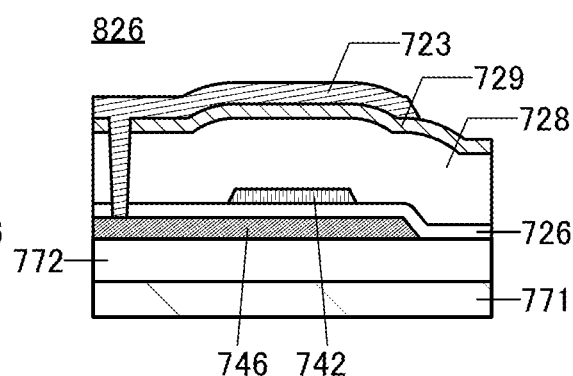
FIG. 32C2

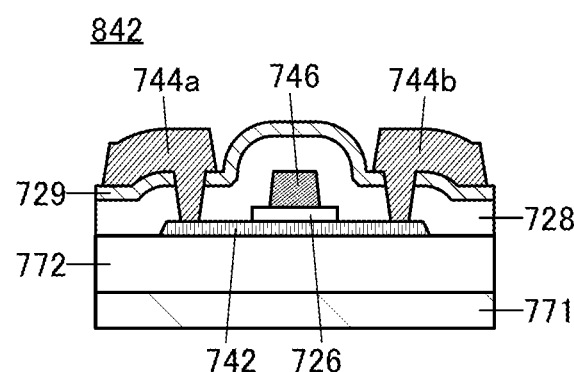
FIG. 33A1
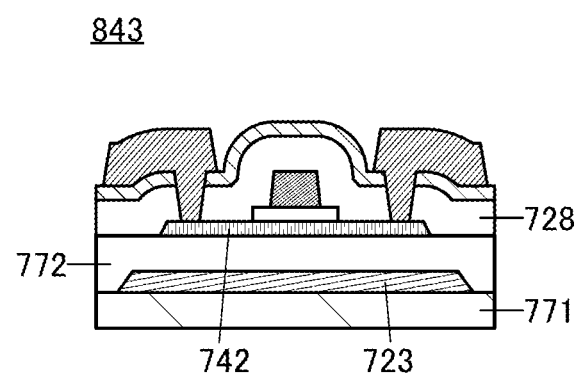
FIG. 33A2
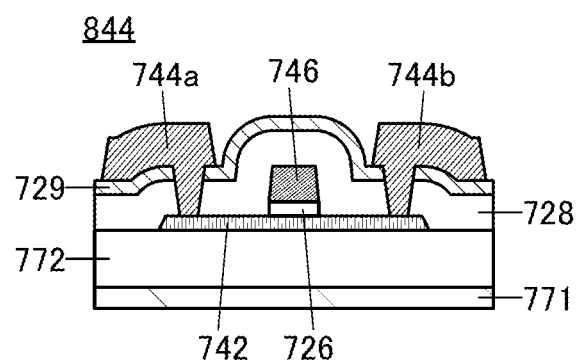
FIG. 33B1
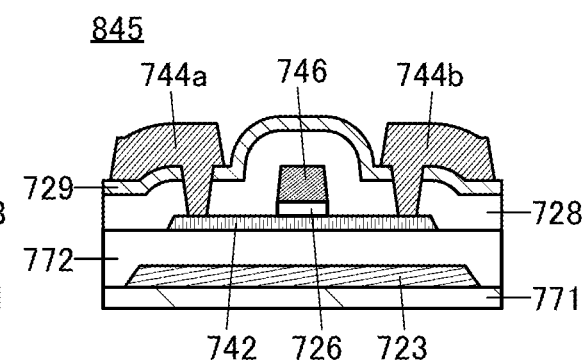
FIG. 33B2
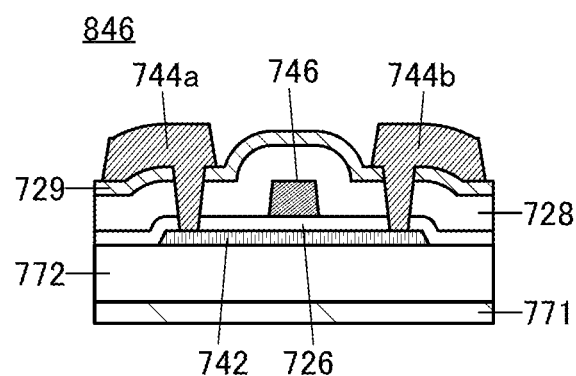
FIG. 33C1
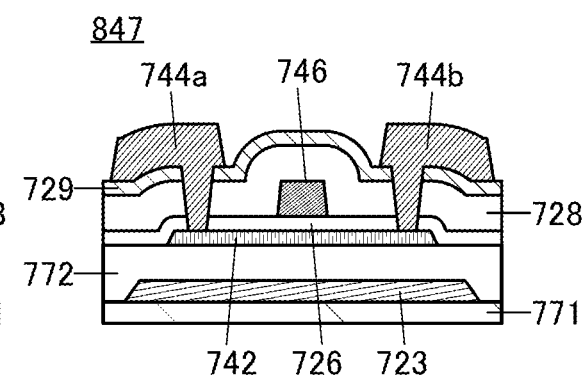
FIG. 33C2

FIG. 34A1
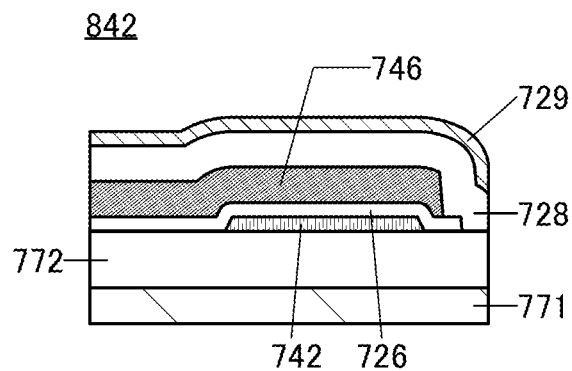
FIG. 34A2
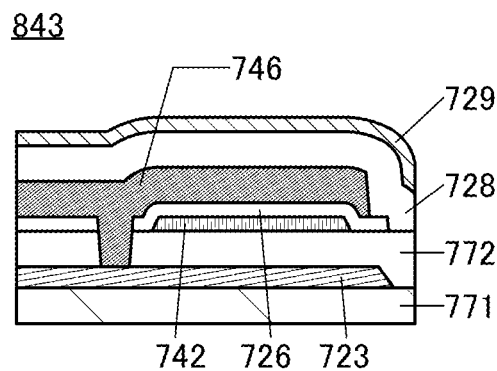
FIG. 34B1
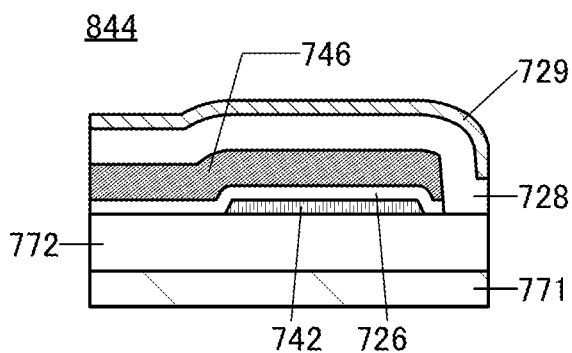
FIG. 34B2
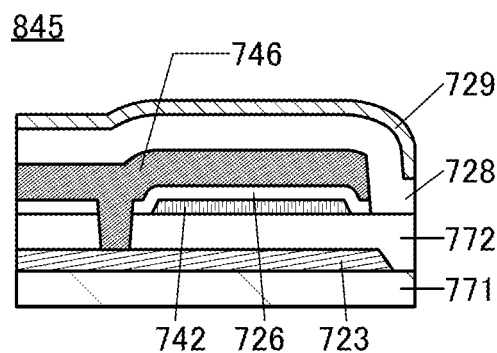
FIG. 34C1
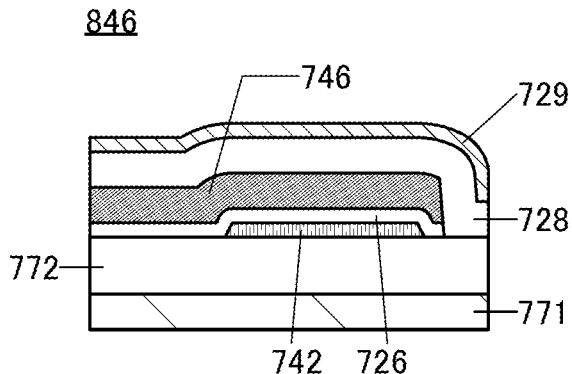
FIG. 34C2
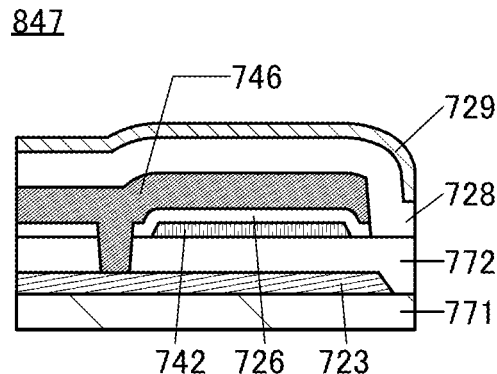

DISPLAY DEVICE AND ELECTRONIC DEVICE

CROSS REFERENCE TO RELATED APPLICATIONS

This application is a continuation of U.S. application Ser. No. 17/047,149, filed Oct. 13, 2020, now allowed, which is incorporated by reference and is a U.S. National Phase Application under 35 U.S.C. § 371 of International Application PCT/IB2019/053250, filed on Apr. 19, 2019, which is incorporated by reference and claims the benefit of a foreign priority application filed in Japan on Apr. 26, 2018, as Application No. 2018-085668.

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specifically, the following can be given as an example of the technical field of one embodiment of the present invention disclosed in this specification: a semiconductor device, a display device, a liquid crystal display device, a light-emitting device, a lighting device, a power storage device, a memory device, an imaging device, a method for operating any of them, or a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming transistors using metal oxide formed over a substrate has been attracting attention. For example, a technique in which a transistor formed using zinc oxide or In—Ga—Zn-based oxide is used as a switching element or the like of a pixel of a display device is disclosed in Patent Document 1 and Patent Document 2.

Patent Document 3 discloses a memory device using a transistor with an extremely low off-state current in a memory cell.

Various improvements and applications of liquid crystal display devices have been attempted. For example, Patent Document 4 discloses a transparent display that performs display by an field sequential operation.

REFERENCE

Patent Document

[Patent Document 1] Japanese Published Patent Application No. 2007-123861
[Patent Document 2] Japanese Published Patent Application No. 2007-96055
[Patent Document 3] Japanese Published Patent Application No. 2011-119674
[Patent Document 4] Japanese Published Patent Application No. 2018-21974

SUMMARY OF THE INVENTION

Problems to be Solved by the Invention

The resolution of display devices has been increased; hardware capable of displaying images of an 8K4K (pixel number: 7680×4320) or higher resolution has been developed. In addition, the HDR (high dynamic range) display technique, which increases image quality by luminance adjustment, has been introduced.

To perform clear gradation display, the width of data potentials that can be supplied to a display element is desired to be wide. Meanwhile, the output voltage of a source driver for a liquid crystal display device is approximately 15 V, for example, and supplying a higher voltage to the display element requires a high output source driver to be used. A high output source driver consumes high power, and requires a new driver IC to be developed in some cases.

Moreover, displaying a moving image more smoothly requires the frame frequency to be increased; however, since the increase in the number of pixels shortens a horizontal period, increasing the frame frequency is difficult. Achieving a structure where the frame frequency is easily increased makes the application to a field-sequential liquid crystal display device or the like easier.

Solutions of such problems described above are expected; meanwhile it is preferable to form a pixel circuit with a smaller number of components because increasing the constituent elements of the pixel circuit reduces the aperture ratio.

Thus, an object of one embodiment of the present invention is to provide a display device capable of improving image quality. Another object is to provide a display device capable of supplying voltage higher than or equal to the output voltage of a source driver to a display element. Another object is to provide a display device capable of enhancing the luminance of a displayed image. Another object is to provide a display device capable of increasing the frame frequency. Another object is to provide a display device in which the aperture ratio of a pixel can be increased.

Another object is to provide a display device with low power consumption. Another object is to provide a highly reliable display device. Another object is to provide a novel display device or the like. Another object is to provide a method for driving any of the above display devices. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to a display device capable of improving image quality.

One embodiment of the present invention is a display device including a plurality of pixel blocks. The pixel blocks each include a first circuit and a plurality of second circuits, the first circuit and the second circuits are electrically connected to each other, the first circuit has a function of adding first data and second data and generating third data, and the second circuits have a function of retaining the third data and a function of performing display in accordance with the third data.

The first circuit includes a first transistor, a second transistor, and a first capacitor, one of a source and a drain of the first transistor is electrically connected to one electrode of the first capacitor, and the other electrode of the first capacitor is electrically connected to the other of a source and a drain of the second transistor.

A third transistor may be further included, one of a source and a drain of the third transistor may be electrically connected to the other electrode of the first capacitor, and the other of the source and the drain of the first transistor and the other of the source and the drain of the second transistor may be electrically connected to each other.

The second circuit can include the third transistor and a third circuit, the one of the source and the drain of the third transistor can be electrically connected to the one of the source and the drain of the first transistor, the other of the source and the drain of the third transistor can be electrically connected to the third circuit, and the third circuit can include a display element.

The third circuit can include a fourth transistor, a second capacitor, and a light-emitting element functioning as the display element, a gate of the fourth transistor can be electrically connected to the other of the source and the drain of the third transistor, the other of a source and a drain of the fourth transistor can be electrically connected to one electrode of the light-emitting element, the one electrode of the light-emitting element can be electrically connected to one electrode of the second capacitor, and the other electrode of the second capacitor can be electrically connected to the gate of the fourth transistor.

A fifth transistor may be further included, one of a source and a drain of the fifth transistor may be electrically connected to the one electrode of the light-emitting element, the other of the source and the drain of the fifth transistor may be electrically connected to one of the source and the drain of the fourth transistor, and the other of the source and the drain of the fifth transistor may be electrically connected to the one electrode of the second capacitor.

Alternatively, the third circuit may include a liquid crystal element as the display element, and one electrode of the liquid crystal element may be electrically connected to the one of the source and the drain of the third transistor. A third capacitor may be further included, and one electrode of the third capacitor may be electrically connected the one electrode of the liquid crystal element.

In addition, a fourth circuit and a fifth circuit may be included. The fourth circuit can have a function of controlling the first circuit, and the fifth circuit can have a function of controlling the second circuit.

The pixel block may include a plurality of pixels, any one of the plurality of pixels may include a plurality of components of the first circuit, and a length in a vertical direction of the pixel including the plurality of components of the first circuit may be larger than a length in the vertical direction of another pixel.

It is preferable that the transistor included in the pixel block include metal oxide in a channel formation region, and that the metal oxide contain In, Zn, and M (M is Al, Ti, Ga, Sn, Y, Zr, La, Ce, Nd, or Hf).

Effect of the Invention

With the use of one embodiment of the present invention, a display device capable of improving image quality can be provided. Alternatively, a display device capable of supplying voltage higher than or equal to the output voltage of a source driver to a display element can be provided. Alternatively, a display device capable of enhancing the luminance of a displayed image can be provided. Alternatively, a display device capable of increasing the frame frequency can be provided. Alternatively, a display device in which the aperture ratio of a pixel can be increased can be provided.

Alternatively, a display device with low power consumption can be provided. Alternatively, a highly reliable display device can be provided. Alternatively, a novel display device or the like can be provided. Alternatively, a method for driving any of the above display devices can be provided. Alternatively, a novel semiconductor device or the like can be provided.

BRIEF DESCRIPTION OF THE DRAWINGS

FIGS. 16(A) and (B) Diagrams illustrating a gate driver.
FIGS. 17(A) and (B) Diagrams illustrating a gate driver.
FIGS. 26(A) and (B) Diagrams each illustrating a display device.
FIGS. 28(A) and (B) Diagrams each illustrating a display device.
FIGS. 29(A) and (B) Diagrams each illustrating a display device.
FIG. 31 (A1) to (C2) Diagrams illustrating transistors.
FIG. 32 (A1) to (C2) Diagrams illustrating transistors.
FIG. 33 (A1) to (C2) Diagrams illustrating transistors.
FIG. 34 (A1) to (C2) Diagrams illustrating transistors.

MODE FOR CARRYING OUT THE INVENTION

Figure 1:
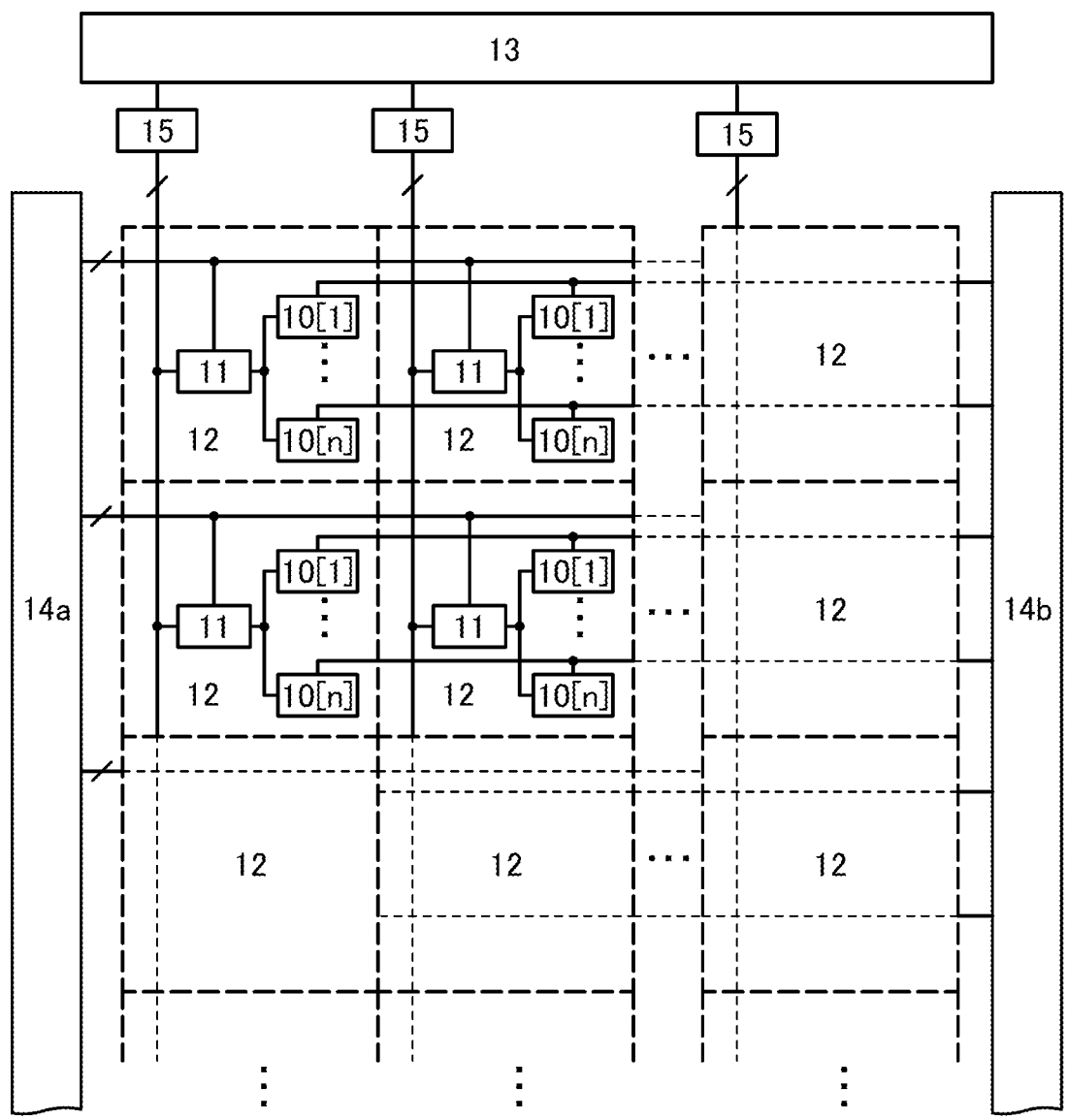
FIG. 1 A diagram illustrating a display device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where elements are illustrated in a circuit diagram as if they were directly connected to each other, the elements may actually be connected to each other through a plurality of conductors; in this specification, even such a configuration is included in direct connection.

Embodiment 1

In this embodiment, a display device that is one embodiment of the present invention will be described with reference to drawings.

One embodiment of the present invention is a display device including a plurality of pixel blocks in a display region. The pixel blocks each include a first circuit and a plurality of second circuits electrically connected to the first circuit. The first circuit has a function of adding a plurality of pieces of data supplied from a source driver. Therefore, a voltage higher than or equal to the output of the source driver can be generated.

The second circuit includes a display element and has a function of performing display in accordance with the added data. One pixel has a configuration including one second circuit and an component of the first circuit that is shared. The first circuit has a larger number of constituent elements (including wirings) and a larger occupation area than the second circuit; therefore, the aperture ratio can be increased when the first circuit is shared by a plurality of pixels.

FIG. 1 is a diagram illustrating a display device of one embodiment of the present invention. The display device includes a pixel block 12, a source driver 13, gate drivers 14a and 14b, and a circuit 15. An example in which two gate drivers are provided is shown; however, the number of gate drivers may be one.

A display region is composed of a plurality of pixel blocks 12 disposed regularly. The pixel block 12 includes a circuit 11 and n (n is a natural number of 2 or more) circuits 10. The circuit 11 is electrically connected to each of the circuits 10.

The circuit 11 and one circuit 10 function as one pixel. That is, the circuit 11 is shared by a plurality of pixels.

The circuit 10 has a function of adding second data to first data by capacitive coupling and generating third data. The circuit 10 includes a display element and has a function of retaining the third data and a function of performing display with the display element in accordance with the third data.

Then circuits 10 included in one pixel block 12 can be disposed in a direction in which a source line extends (in a vertical direction). As the number of the circuits 10 is increased, the aperture ratio can be increased because the components of the circuit 11 are placed so as to be dispersed in the occupation regions of the pixels.

The aperture ratio is increased as the number of the circuits 10 included in the pixel block 12 is increased; and in consideration of time for writing image data, it is preferable to place a plurality of pixel blocks per line.

In the case of a high-resolution display device, writing needs to be performed in a short horizontal period. When the number of the circuits 10 is too large, the capacitance of a wiring connecting the circuit 11 and the circuit 10 becomes large, which causes a defect in which writing is not completed within a horizontal period. Therefore, it is preferable that the number of the circuits 10 included in the pixel block be set appropriately in consideration of a plurality of conditions such as the aperture ratio, the resolution (horizontal period), and the capacitance of the wiring connecting the circuit 11 and the circuit 10.

To efficiently increase the aperture ratio, n is greater than or equal to 5 and less than or equal to 100, preferably greater than or equal to 10 and less than or equal to 50, further preferably greater than or equal to 20 and less than or equal to 40, according to simulation results described later. When n is within the range, the capacitance of the wiring connecting the circuit 11 and the circuit 10 is estimated to be sufficiently small; therefore, the influence of the horizontal period can be ignored. Note that in the case where the horizontal period can be secured sufficiently, n may be approximately 100 to 1000.

Figure 2:
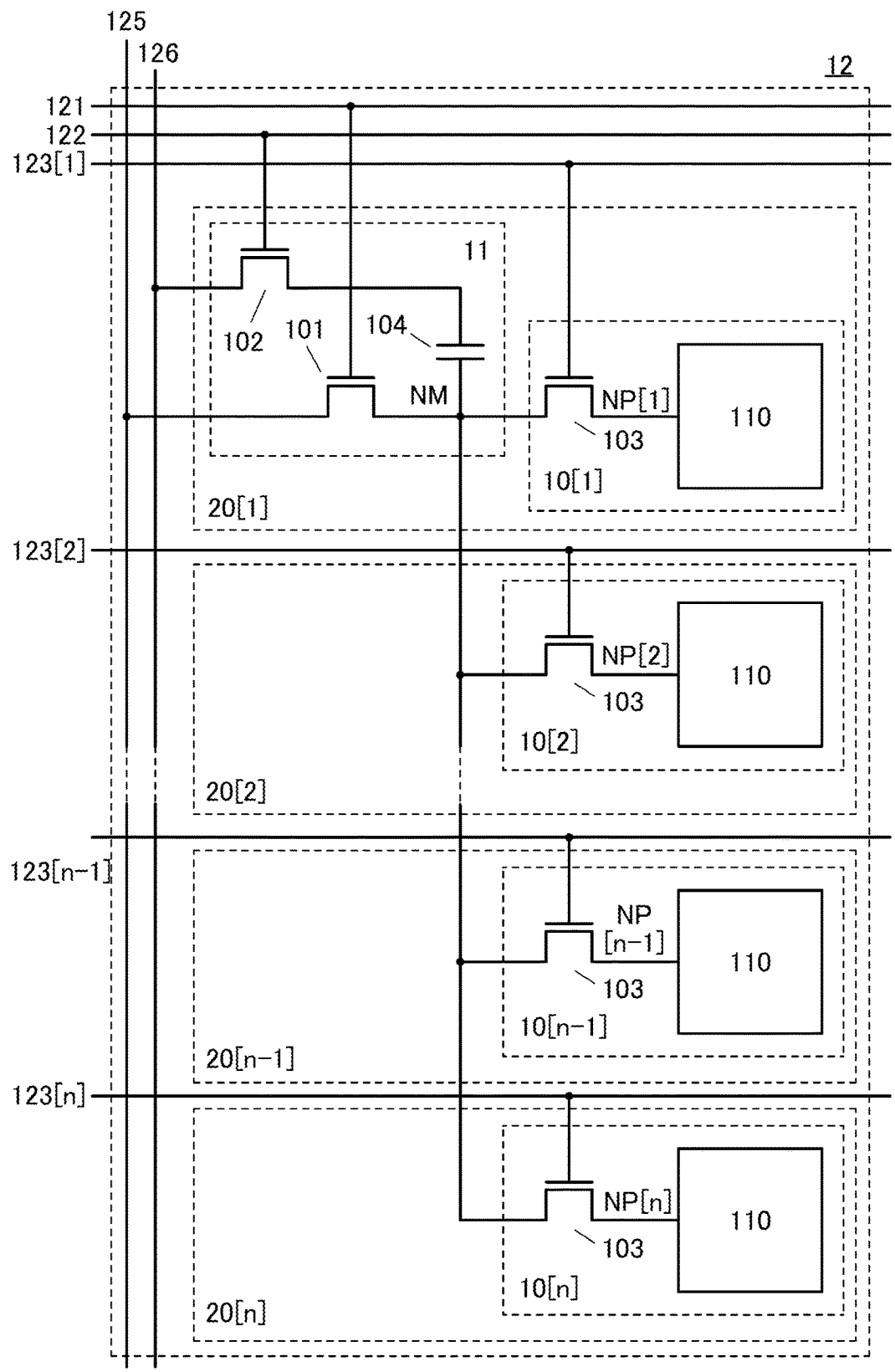
FIG. 2 A diagram illustrating a pixel block.

FIG. 2 illustrates a specific example of the pixel block 12. The pixel block 12 includes the circuit 11 and the plurality of circuits 10 (circuits 10[1] to 10[n]). Here, regions in each of which any one of the circuits 10[1] to 10[n] is placed are pixels 20[1] to 20[n].

The circuit 11 can have a configuration including a transistor 101, a transistor 102, and a capacitor 104. One of a source and a drain of the transistor 101 is electrically connected to one electrode of the capacitor 104. The other electrode of the capacitor 104 is electrically connected to one of a source and a drain of the transistor 102.

The circuit 10 can have a configuration including a transistor 103 and a circuit block 110. The circuit block 110 can have a configuration including a transistor, a capacitor, a display element, and the like. One of a source and a drain of the transistor 103 is electrically connected to the one of the source and the drain of the transistor 101. The other of the source and the drain of the transistor 103 is electrically connected to the circuit block 110.

Here, a wiring that connects the one of the source and the drain of the transistor 101, the one electrode of the capacitor 104, and the one of the source and the drain of the transistor 103 is referred to as a node NM. A wiring that connects the other of the source and the drain of the transistor 103 and the circuit block 110 is referred to as a node NP. The node NP can be floating, and the display element included in the circuit block 110 operates in accordance with the potential of the node NP.

Connections of the components of the circuits 10 and 11 and a variety of wirings are described. A gate of the transistor 101 is electrically connected to a wiring 121. A gate of the transistor 102 is electrically connected to a wiring 122. A gate of the transistor 103 is electrically connected to a wiring 123. The other of the source and the drain of the transistor 101 is electrically connected to a wiring 125. The other of the source and the drain of the transistor 102 is electrically connected to a wiring 126.

The wirings 121, 122, and 123 (123 [1] to 123[n]) each have a function of a gate line. For example, the wirings 121 and 122 are electrically connected to the gate driver 14a. The wiring 123 is electrically connected to the gate driver 14b. The wirings 125 and 126 each have a function of a source line and are electrically connected to the source driver 13 through the circuit 15 (see FIG. 1).

Figure 3:
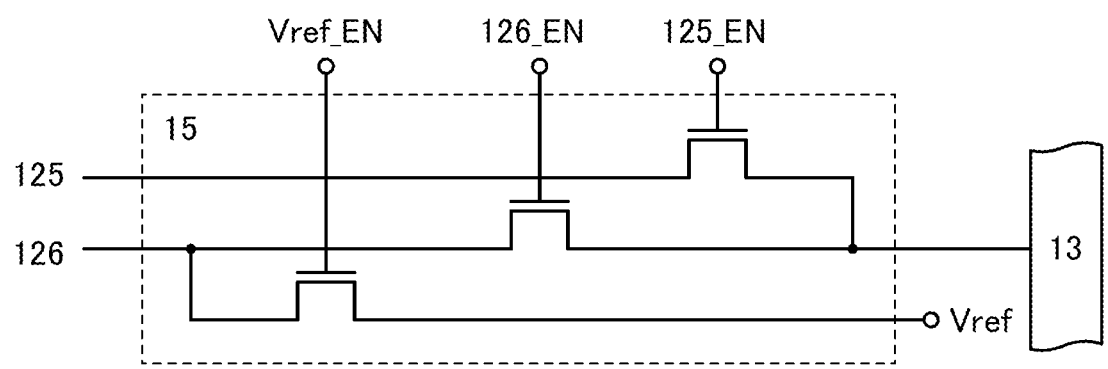
FIG. 3 A diagram illustrating a selection circuit.

The circuit 15 can have a configuration illustrated in FIG. 3, for example. The circuit 15 has a function of a selection circuit and can output a potential input from the source driver 13 to the wiring 125 or the wiring 126. In addition, a potential "$V_{ref}$" (e.g., a reference potential such as 0 V) can be output to the wiring 126. Output control of the potentials is performed by controlling transistors connected to the wirings with signals $V_{ref}$_EN, 125_EN, and 126_EN. Note that the circuit 15 is not provided in some cases.

In the circuit 11, first, first data (weight: W) is written to the node NM. At this time, "$V_{ref}$" is supplied to the other electrode of the capacitor 104, and the capacitor 104 is made to retain "W—$V_{ref}$". Next, the node NM is set to be floating and second data (data: D) is supplied to the other electrode of the capacitor 104, whereby the potential of the node NM becomes "W-$V_{ref}$+D" owing to capacitive coupling.

Here, when "W"="D", "$V_{ref}$"=0 V, and the capacitance of the node NM is sufficiently small, the potential of the node NM becomes "2D" or "2 W", so that a potential that is approximately twice the output of the source driver 13 can be output to the node NM. Therefore, even with a general driver IC, use for application that requires high voltage (e.g., a liquid crystal element that requires high voltage for grayscale control) is possible. Alternatively, since a voltage that is supplied from the source driver 13 in order to drive a general liquid crystal element or light-emitting element can be approximately ½, the power consumption of the display device can be reduced.

Correction data may be supplied as the first data (weight: W). For example, when luminance correction data is added to image data, variation in the luminance unique to the display device can be corrected. Alternatively, correction data may be used for HDR display because the luminance can be corrected pixel by pixel. In the case where a light-emitting element is used as the display element, the display quality is affected by variation in the threshold voltage of a driving transistor; thus, the display quality may be improved by supplying, as the first data (weight: W), threshold-voltage correction data for the transistor. Note that the first data (weight: W) and the second data (data: D) may be interchanged.

In one embodiment of the present invention, the transistor 103 of a specified circuit 10 is turned on in accordance with an operation of adding the above-described potential, and the potential of the node NP (=the potential of the node NM) is determined. Such an operation is performed on the circuit 10[1] to the circuit 10[n] successively, whereby the potential of the node NP of each of the circuits 10 can be determined. That is, different image data can be supplied to each pixel.

The node NM and the node NP function as storage nodes. The transistor connected to the corresponding node is turned on, whereby data can be written to the node. The transistor is turned off, whereby the data can be retained in the node. The use of a transistor with an extremely low off-state current as the transistor enables leakage current to be reduced and the potential of the node be retained for a long time. As the transistor, a transistor using metal oxide in a channel formation region (hereinafter referred to as an OS transistor) can be used, for example.

Specifically, OS transistors are preferably used as the transistors 101, 102, and 103. An OS transistor may also be used for any of the components included in the circuit block 110. In the case of operating within a range where the amount of leakage current is acceptable, a transistor including Si in a channel formation region (hereinafter, Si transistor) may be used. Alternatively, an OS transistor and a Si transistor may be used together. Examples of a Si transistor include a transistor including amorphous silicon and a transistor including crystalline silicon (typically, low-temperature polysilicon or single crystal silicon).

As a semiconductor material used for an OS transistor, metal oxide whose energy gap is greater than or equal to 2 eV, preferably greater than or equal to 2.5 eV, more preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yA/μm (current per micrometer of a channel width). An OS transistor has features such that impact ionization, an avalanche breakdown, a short-channel effect, or the like does not occur, which are different from those of a Si transistor. Thus, the use of an OS transistor enables formation of a highly reliable circuit. Moreover, variations in electrical characteristics due to crystallinity unevenness, which are caused in Si transistors, are less likely to occur in OS transistors.

A semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements of a sputtering target used to form a film of the In-M-Zn oxide satisfy In≥M and Zn≥M. The atomic ratio between metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio between metal elements in the formed semiconductor layer may vary from the above atomic ratio between metal elements in the sputtering target in a range of ±40%.

An oxide semiconductor with low carrier density is used for the semiconductor layer. For example, the semiconductor layer may use an oxide semiconductor whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low density of defect states and can thus be regarded as having stable characteristics.

Note that, examples of a material for the semiconductor layer are not limited to those described above, and a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, the amount of oxygen vacancies is increased in the semiconductor layer, and the semiconductor layer becomes n-type. Thus, the concentration of silicon or carbon (measured by secondary ion mass spectrometry) in the semiconductor layer is set to $2\times10^{18}$ atoms/cm$^3$ or lower, preferably $2\times10^{17}$ atoms/cm$^3$ or lower.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (measured by secondary ion mass spectrometry) is set to $1\times10^{18}$ atoms/cm$^3$ or lower, preferably $2\times10^{16}$ atoms/cm$^3$ or lower.

When the oxide semiconductor in the semiconductor layer contains nitrogen, electrons functioning as carriers are generated and the carrier density increases, so that the semiconductor layer easily becomes n-type. Thus, a transistor using an oxide semiconductor that contains nitrogen is likely to be normally on. Hence, the concentration of nitrogen in the semiconductor layer (measured by secondary ion mass spectrometry) is preferably set to $5\times10^{18}$ atoms/cm$^3$ or lower.

Specifically, when hydrogen is contained in an oxide semiconductor included in the semiconductor layer, hydrogen reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. Examples of a non-single-crystal structure include a c-axis aligned crystalline oxide semiconductor (CAAC-OS) including a c-axis aligned crystal, a polycrystalline structure, a microcrystalline structure, and an amorphous structure. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

The composition of a cloud-aligned composite oxide semiconductor (CAC-OS), which is one embodiment of a non-single-crystal semiconductor layer, is described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions containing the selected metal element(s) as a main component(s) are observed in part of the CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the XRD measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanometer-sized electron beam), a ring-like region (ring region) with high luminance and a plurality of bright spots in the ring region are observed. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region containing $GaO_{X3}$ as a main component and the region containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{Z2}$ or $InO_{X1}$ as a main component, the conductivity of an oxide semiconductor is generated. Accordingly, when the region containing $In_{X2}Zn_{Y2}O_{Z2}$ or $InO_{X1}$ as a main component are distributed like a cloud in an oxide semiconductor, high field-effect mobility (μ) can be achieved.

By contrast, the insulating property of the region containing $GaO_{X3}$ or the like as a main component is superior to that of the region containing $In_{X2}Zn_{Y2}O_{Z2}$ or $InO_{X1}$ as a main component. In other words, when the region containing $GaO_{X3}$ or the like as a main component is distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element using a CAC-OS has high reliability. Thus, the CAC-OS is suitably used as a material in a variety of semiconductor devices.

Although FIG. 2 illustrates the configuration in which the circuit 11 is placed in the pixel 20[1], the circuit 11 may be placed in another pixel. Alternatively, as illustrated in FIG. 4, the components of the circuit 11 may be placed so as to be dispersed in a plurality of regions.

For example, the transistor 101 can be placed in the pixel 20[1], the transistor 102 can be placed in the pixel 20[2], and the capacitor 104 can be divided and placed in the pixel 20[n−1] and the pixel 20[n]. In this manner, the number of components such as the transistors and the capacitors in the pixels and the occupation areas thereof can be reduced by dispersing the components of the circuit 11, so that the aperture ratio can be increased.

Figure 4:
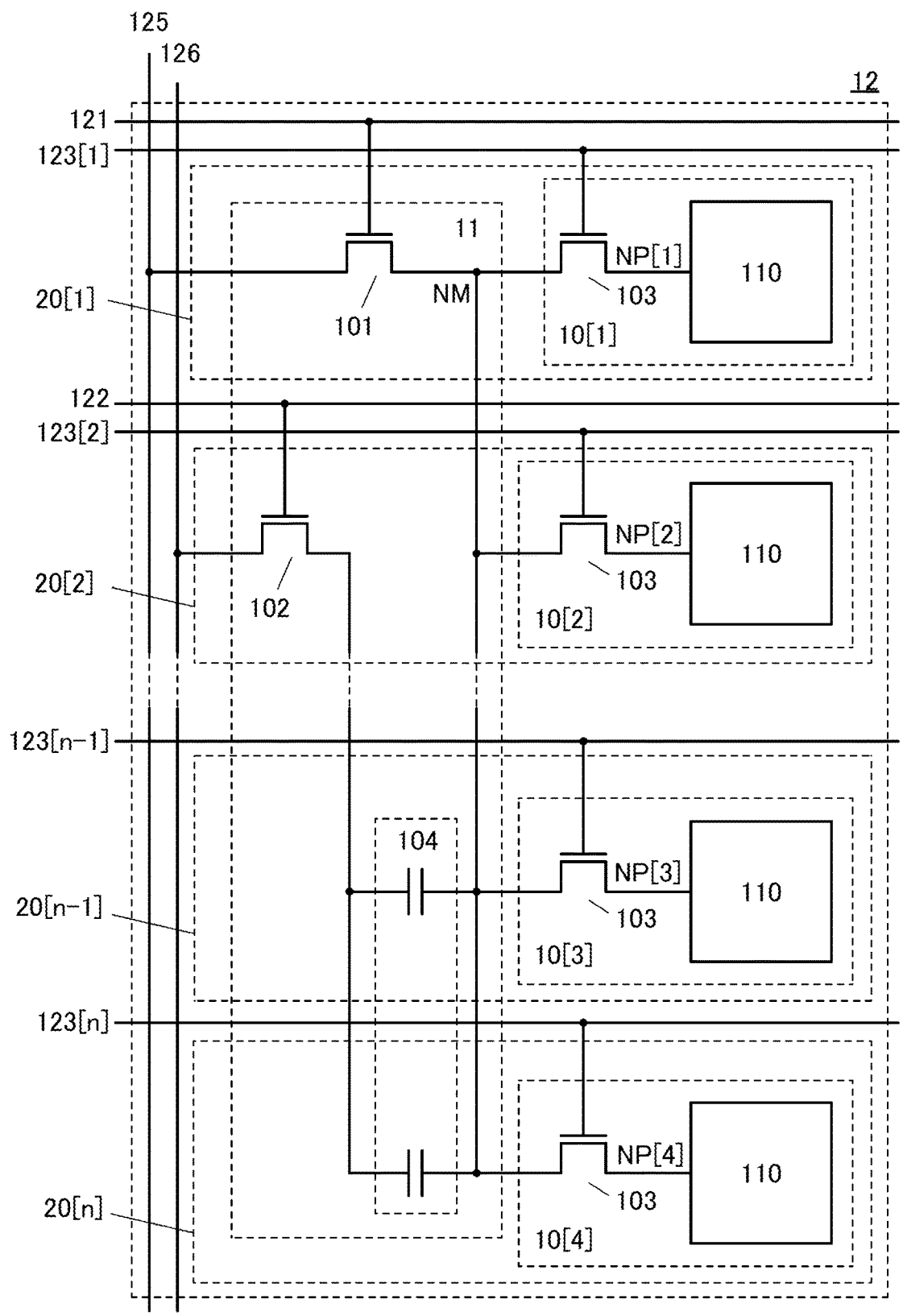
FIG. 4 A diagram illustrating a pixel block.

Although not illustrated in FIG. 4, a pixel in which none of the components of the circuit 11 is placed may be provided. Alternatively, two or more of the components thereof may be placed in one pixel. The capacitor may be placed in one pixel without being divided. Alternatively, the number of divisions of the capacitor may be increased and the capacitor may be divided and placed in three or more pixels.

Figure 5:
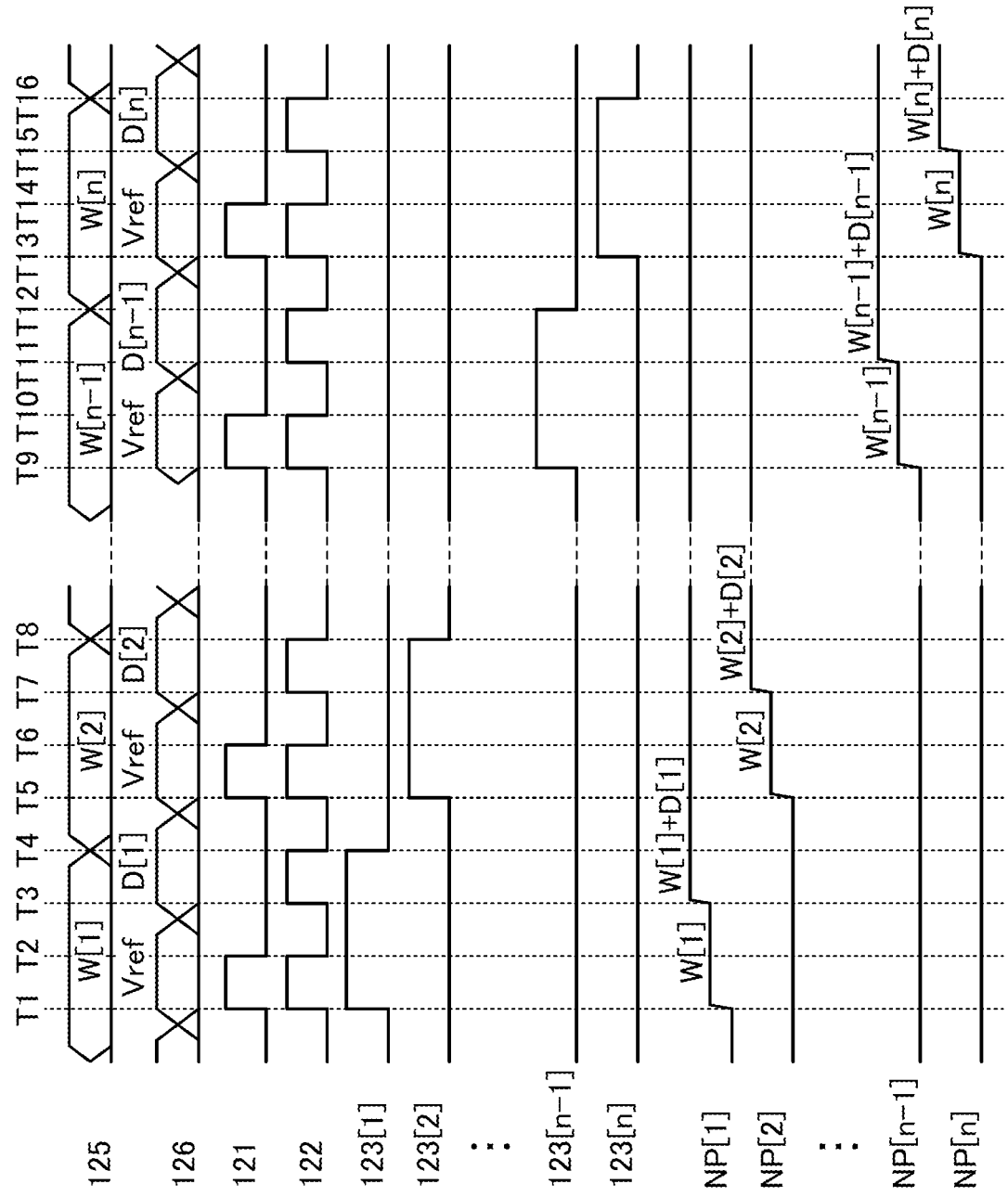
FIG. 5 A timing chart showing operations of the pixel block.

Next, an operation method of the pixel block 12 illustrated in FIG. 2 or FIG. 4 will be described with reference to a timing chart shown in FIG. 5. Note that in the following description, a high potential is represented by "H" and a low potential is represented by "L". In addition, weight and image data supplied to the pixel 20[1] are "W[1]" and "D[1]", respectively; weight and image data supplied to the pixel 20[2] are "W[2.]" and "D[2]", respectively; weight and image data supplied to the pixel 20[n−1] are "W[n−1]" and "D[n−1]", respectively; and weight and image data supplied to the pixel 20[n] are "W[n]" and "D[n]", respectively. As "$V_{ref}$", 0 V, a GND potential, or a certain reference potential can be used, for example.

Note that in potential distribution, potential coupling, or potential loss, detailed changes due to a circuit configuration, operation timing, or the like are not considered. In addition, a change in potential due to capacitive coupling using a capacitor depends on the capacitance ratio of the capacitor and load connected to the capacitor; however, for clear description, the capacitance value of the circuit block 110 is assumed to be sufficiently small.

First, an operation of writing "W[1]" in the pixel 20[1] is described.

At time T1, "W[1]" is supplied to the wiring 125, "$V_{ref}$" is supplied to the wiring 126, and the potentials of the wirings 121, 122, and 123[1] are set to "H", whereby the transistor 102 is turned on and the potential of the other electrode of the capacitor 104 becomes "$V_{ref}$". The operation is a reset operation for an addition operation (capacitive coupling operation) to be performed later.

Furthermore, the transistors 101 and 103 are turned on, and the potential of the wiring 125 is written to a node NP[1]. This operation is an operation of writing weight, and the potential of the node NP[1] becomes "W[1]".

At time T2, the potentials of the wirings 121 and 122 are set to "L" and the potential of the wiring 123[1] is set to "H", whereby the transistors 101 and 102 are turned off. At this time, "W[1]" is retained in the node NP[1]. In addition, "W[1]-$V_{ref}$" is retained in the capacitor 104. The operation of writing "W[1]" in the pixel 20[1] has been described so far.

Next, an operation of adding "D[1]" in the pixel 20[1] is described.

At time T3, "D[1]" is supplied to the wiring 126, the potential of the wiring 121 is set to "L", and the potentials of the wirings 122 and 123[1] are set "H", whereby the transistors 102 and 103 are turned on. At this time, the potential of the other electrode of the capacitor 104 becomes "D[1]", and "D[1]" is added to the potential of the node NP[1] owing to capacitive coupling. This operation is an addition operation, and the potential of the node NP[1] becomes "W[1]-$V_{ref}$+D[1]". At this time, when "$V_{ref}$"=0, the potential of the node NP[1] becomes "W[1]+D[1]". The potential of the node NP[1] is supplied to the display element, and display is performed.

At time T4, the potentials of the wirings 121, 122, and 123[1] are set to "L", whereby the transistor 103 is turned off, the potential of the node NP[1] is retained, and the display is kept until an operation of the next frame. The above is the description of the operations of the pixel 20[1].

Next, an operation of writing "W[2.]" in the pixel 20[2] is described.

At time T5, "W[2]" is supplied to the wiring 125, "$V_{ref}$" is supplied to the wiring 126, and the potentials of the wirings 121, 122, and 123[2] are set to "H", whereby the transistor 102 is turned on and the potential of the other electrode of the capacitor 104 becomes "$V_{ref}$".

Furthermore, the transistors 101 and 103 are turned on, and the potential of the wiring 125 is written to a node NP[2]. The operation is an operation of writing weight, and the potential of the node NP[2] becomes "W[2]".

At time T6, the potentials of the wirings 121 and 122 are set to "L" and the potential of the wiring 123[2] is set to "H", whereby the transistors 101 and 102 are turned off. At this time, "W[2.]" is retained in the node NP[2]. In addition, "W[2]-$V_{ref}$" is retained in the capacitor 104. The operation of writing "W[2.]" in the pixel 20[2] has been described so far.

Next, an operation of adding "D[2]" in the pixel 20[2] is described.

At time T7, "D[2]" is supplied to the wiring 126, the potential of the wiring 121 is set to "L", and the potentials of the wirings 122 and 123[1] are set to "H", whereby the transistors 102 and 103 are turned on. At this time, the potential of the other electrode of the capacitor 104 becomes "D[2]", and "D[2]" is added to the potential of the node NP[1] owing to capacitive coupling. This operation is an addition operation, and the potential of the node NP[1] becomes "W[2]-$V_{ref}$+D[2]". At this time, when "$V_{ref}$"=0, the potential of the node NP[2] becomes "W[2]+D[2]". The potential of the node NP[2] is supplied to the display element, and display is performed.

At time T8, the potentials of the wirings 121, 122, and 123[2] are set to "L", whereby the transistor 103 is turned off, the potential of the node NP[2] is retained, and the display is kept until an operation of the next frame. The above is the description of the operations of the pixel 20[2].

The potential of the node NP[2] is supplied to the display element, and display is performed. The above is the description of the operations of the pixel 20[2]. By applying the same operations to the pixel 20[n−1] from time T9 to time T12, display in accordance with "W[n−1]+D[n−1]" can be performed in the pixel 20[n−1]. By applying the same operations to the pixel 20[n] from time T13 to time T16, display in accordance with "W[n]+D[n]" can be performed in the pixel 20[n].

In the above manner, the pixel block 12 can be operated.

Figure 6A:
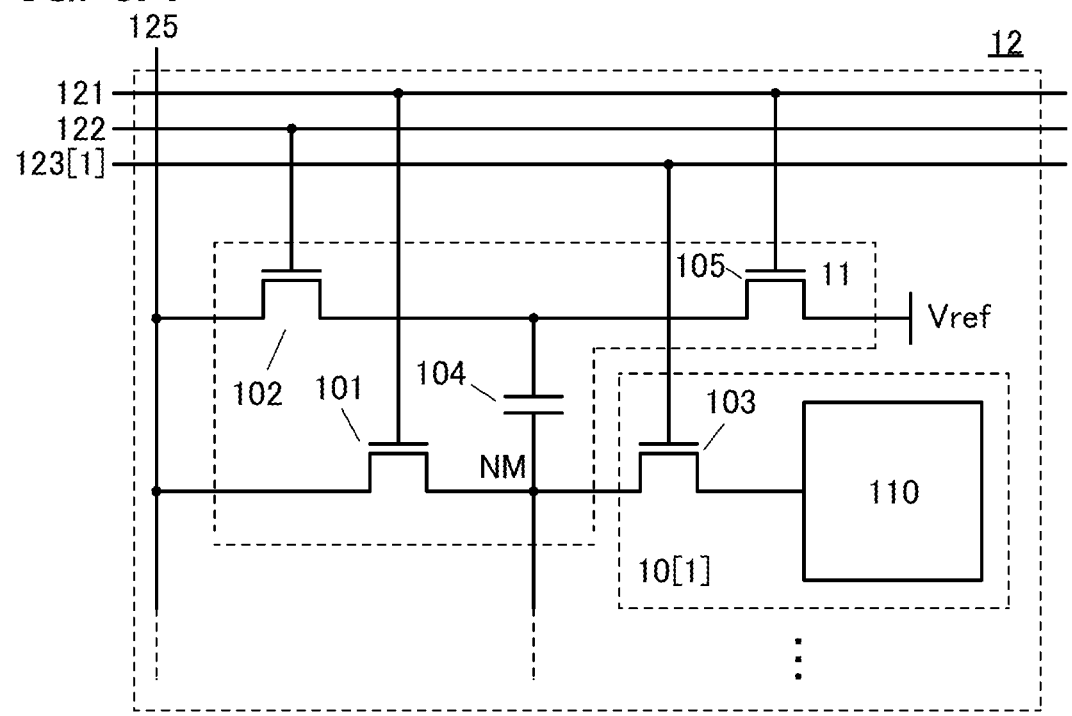
FIGS. 6(A) and (B) Diagrams each illustrating a pixel block.

Note that the circuit 11 may have a configuration illustrated in FIG. 6(A). The circuit 11 illustrated in FIG. 6(A) is different from the circuit 11 illustrated in FIG. 2 or FIG. 4 in that a transistor 105 is included and the number of source lines is one.

A gate of the transistor 105 is electrically connected to the wiring 122. One of a source and a drain of the transistor 105 is electrically connected to the other electrode of the capacitor 104. The other of the source and the drain of the transistor 105 is electrically connected to a wiring capable of supplying "$V_{ref}$". The other of the source and the drain of the transistor 101 and the other of the source and the drain of the transistor 102 are electrically connected to the wiring 125.

In the configuration of the circuit 11 illustrated in FIG. 2 or 4, the data (D) and "$V_{ref}$" are switched and supplied from the wiring 126; in the configuration of the circuit 11 illustrated in FIG. 6(A), "$V_{ref}$" is supplied from a dedicated path, so that the weight (W) and the data (D) can be switched and supplied from the wiring 125. Therefore, one source line can be omitted.

Figure 7:
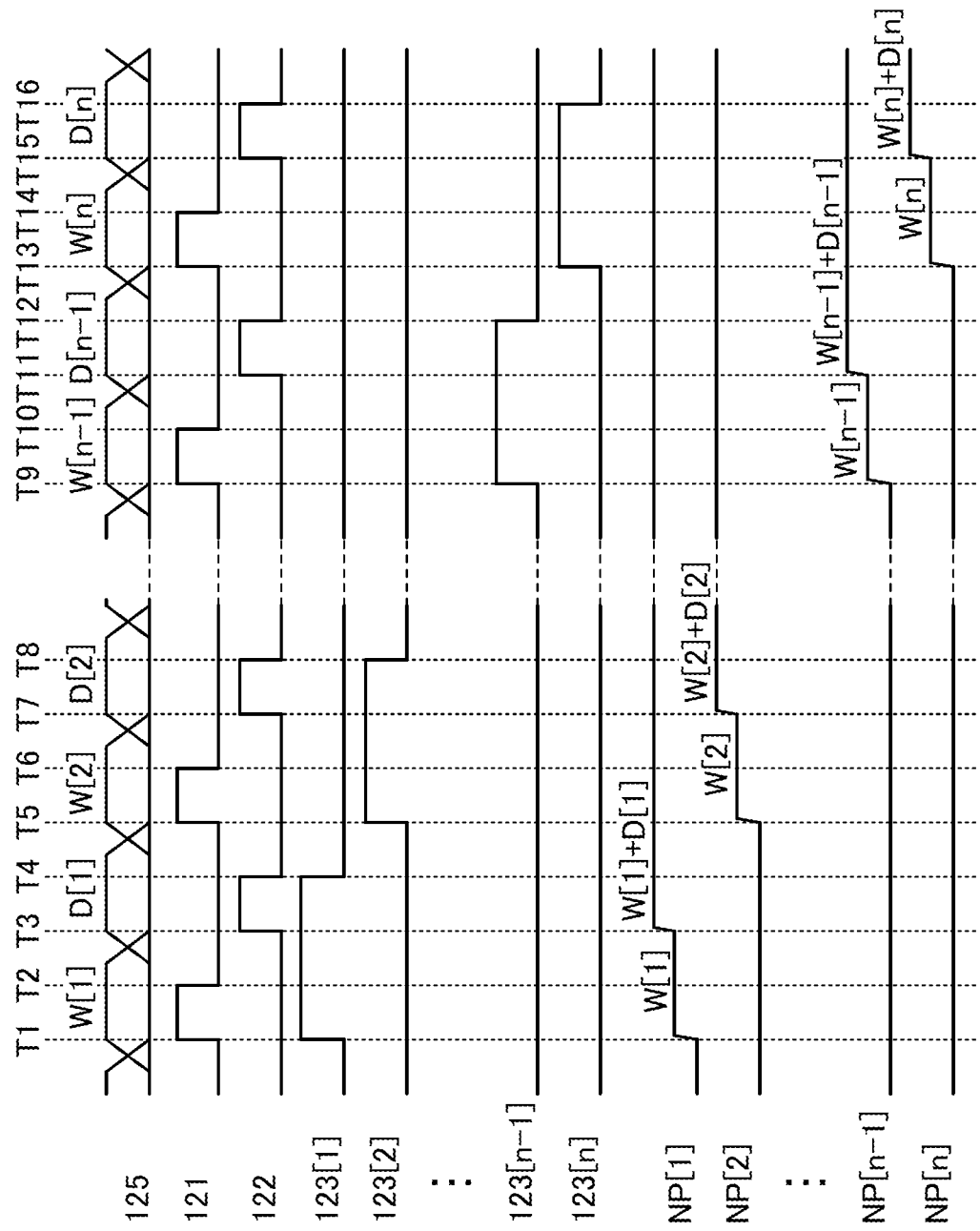
FIG. 7 A timing chart showing operations of the pixel block.

Operations in the case where the circuit 11 illustrated in FIG. 6(A) is used in the pixel block 12 illustrated in FIG. 2 or FIG. 4 are described with reference to a timing chart shown in FIG. 7.

At time T1, "W[1]" is supplied to the wiring 125 and the potentials of the wirings 121 and 123[1] are set to "H", whereby the transistor 105 is turned on, and the potential of the other electrode of the capacitor 104 becomes "$V_{ref}$". The operation is a reset operation for an addition operation (capacitive coupling operation) to be performed later.

Furthermore, the transistors 101 and 103 are turned on, and the potential of the wiring 125 is written to the node NP[1]. This operation is an operation of writing weight, and the potential of the node NP[1] becomes "W[1]".

At time T2, the potential of the wiring 121 is set to "L" and the potential of the wiring 123[1] is set to "H", whereby the transistors 101 and 105 are turned off. At this time, "W[1]" is retained in the node NP [1]. In addition, "W[1]−$V_{ref}$" is retained in the capacitor 104. The operation of writing "W[1]" in the pixel 20[1] has been described so far.

At time T3, "D[1]" is supplied to the wiring 125, the potential of the wiring 121 is set to "L", and the potentials of the wirings 122 and 123[1] are set "H", whereby the transistors 102 and 103 are turned on. At this time, the potential of the other electrode of the capacitor 104 becomes "D[1]", and "D[1]" is added to the potential of the node NP[1] owing to capacitive coupling. This operation is an addition operation, and the potential of the node NP[1] becomes "W[1]−$V_{ref}$+D[1]". At this time, when "$V_{ref}$"=0, the potential of the node NP[1] becomes "W[1]+D[1]". The potential of the node NP[1] is supplied to the display element, and display is performed.

At time T4, the potentials of the wirings 121, 122, and 123[1] are set to "L", whereby the transistor 103 is turned off, the potential of the node NP[1] is retained, and the display is kept until an operation of the next frame. The above is the description of the operations of the pixel 20[1].

By applying the same operations to the pixel 20[2] from time T5 to time T8, display in accordance with "W[2]+D[2]" can be performed in the pixel 20[2]. By applying the same operations to the pixel 20[n−1] from time T9 to time T12, display in accordance with "W[n−1]+D[n−1]" can be performed in the pixel 20[n−1]. By applying the same operations to the pixel 20[n] from time T13 to time T16, display in accordance with "W[n]+D[n]" can be performed in the pixel 20[n].

Figure 6B:
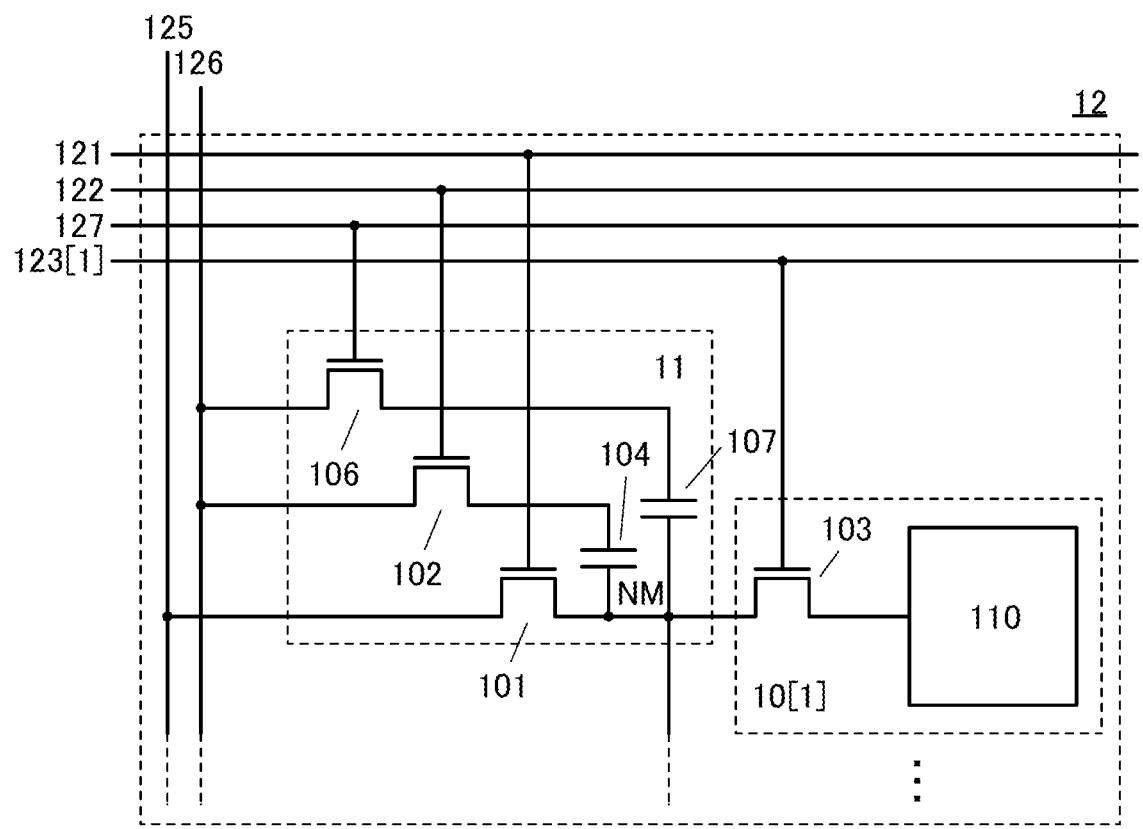

The circuit 11 may have a configuration illustrated in FIG. 6(B). The circuit 11 illustrated in FIG. 6(B) is different from the circuit 11 illustrated in FIG. 2 or FIG. 4 in that a transistor 106 and a capacitor 107 are included.

One electrode of the capacitor 107 is electrically connected to the node NM. The other electrode of the capacitor 107 is electrically connected to one of a source and a drain of the transistor 106. A gate of the transistor 106 is electrically connected to a wiring 127 having a function of a gate line. The other of the source and the drain of the transistor 106 is electrically connected to a wiring 128 having a function of a source line.

The circuit 11 illustrated in FIG. 6(B) includes two capacitors connected in series to the node NM and can perform a variety of operations. For example, the following use is possible: correction data of the threshold voltage of a driving transistor of a light-emitting element is written to one of the capacitors, and luminance correction data is written to the other of the capacitors to perform image correction. Alternatively, in an operation using a liquid crystal element, the capacitors are used separately according to the polarity of a signal corresponding to an inversion operation, so that the polarities of charges accumulated in both electrodes of the capacitors can be always constant. Therefore, the amount of a charge supplied during the inversion operation can be reduced, so that the power consumption of the display device can be reduced.

Figure 8A:
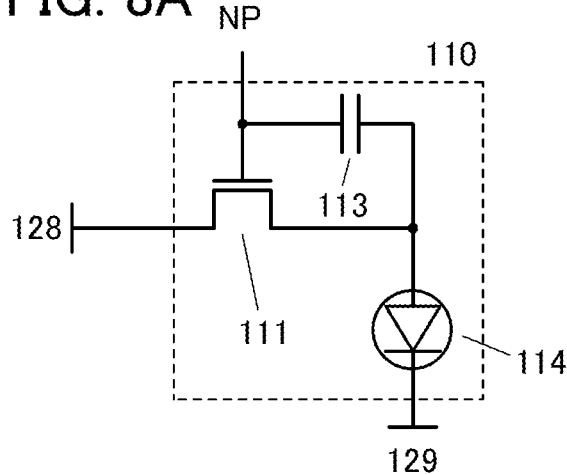
FIG. 8(A) to (D) Diagrams each illustrating a circuit block.
Figure 8B:
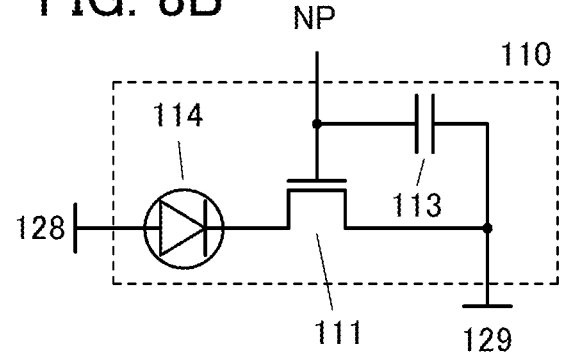
Figure 8C:
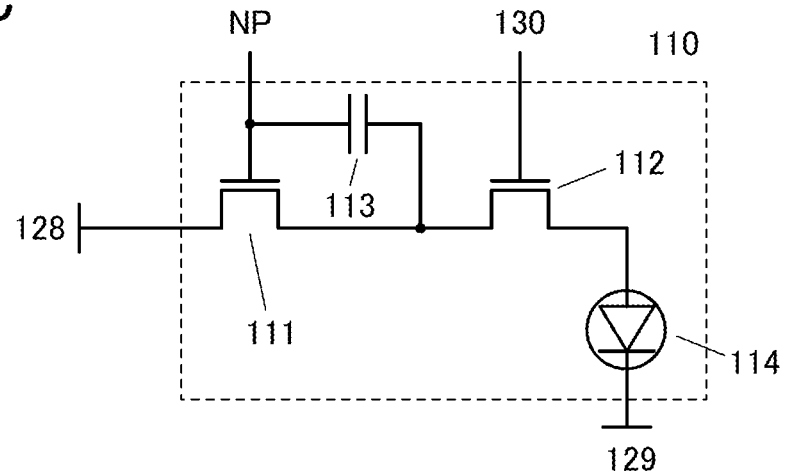

FIGS. 8(A) to 8(C) each illustrate a configuration example including a light-emitting element as the display element, which can be applied to the circuit block 110.

The configuration illustrated in FIG. 8(A) includes a transistor 111, a capacitor 113, and a light-emitting element 114. One of a source and a drain of the transistor 111 is electrically connected to one electrode of the light-emitting element 114. The one electrode of the light-emitting element 114 is electrically connected to one electrode of the capacitor 113. The other electrode of the capacitor 113 is electrically connected to a gate of the transistor 111. The gate of the transistor 111 is electrically connected to the node NP.

The other of the source and the drain of the transistor 111 is electrically connected to the wiring 128. The other electrode of the light-emitting element 114 is electrically connected to a wiring 129. The wirings 128 and 129 have a function of supplying power. For example, the wiring 128 is capable of supplying a high potential power. The wiring 129 is capable of supplying a low potential power.

In the configuration illustrated in FIG. 8(A), current flows through the light-emitting element 114 when the potential of the node NM becomes higher than or equal to the threshold voltage of the transistor 111. Therefore, light emission of the light-emitting element 114 is started in some cases at the time when the weight (W) is written to the node NP, and the application might be limited.

Alternatively, as illustrated in FIG. 8(B), the one electrode of the light-emitting element 114 can be electrically connected to the wiring 128, and the other electrode of the light-emitting element 114 can be electrically connected to the other of the source and the drain of the transistor 111. The configuration can be applied to other circuits blocks 110 including light-emitting elements 114.

FIG. 8(C) is a configuration in which a transistor 112 is added to the configuration of FIG. 8(A). One of a source and a drain of the transistor 112 is electrically connected to the one of the source and the drain of the transistor 111. The other of the source and the drain of the transistor 112 is electrically connected to the light-emitting element 114. A gate of the transistor 112 is electrically connected to the wiring 127. The wiring 127 can have a function of a signal line that controls the conduction of the transistor 112.

In the configuration, current flows through the light-emitting element 114 when the potential of the node NP is higher than or equal to the threshold voltage of the transistor 111 and the transistor 112 is turned on. Thus, light emission of the light-emitting element 114 can be started at any time after the operation of adding the weight (W) and the data (D).

Figure 8D:
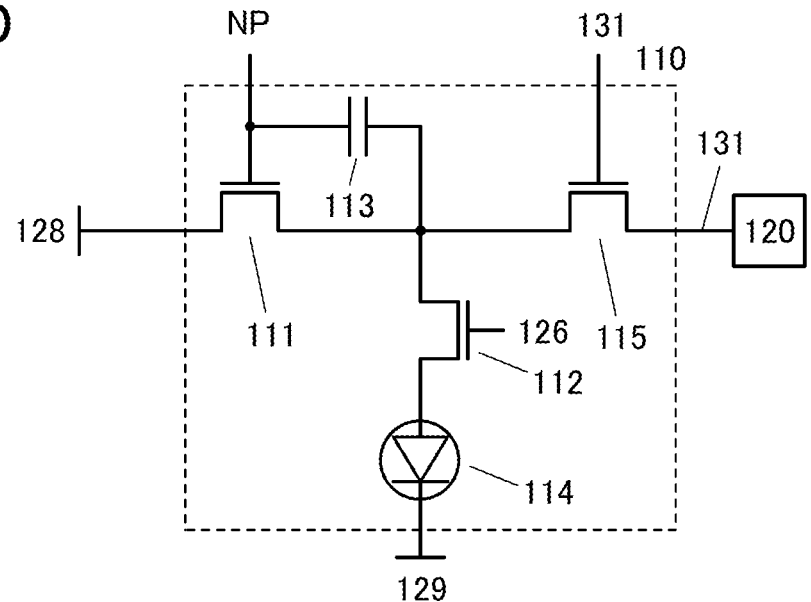

FIG. 8(D) is a configuration in which a transistor 115 is added to the configuration of FIG. 8(C). One of a source and a drain of the transistor 115 is electrically connected to the one of the source and the drain of the transistor 111. The other of the source and the drain of the transistor 115 is electrically connected to a wiring 131. A gate of the transistor 115 is electrically connected to a wiring 132. The wiring 132 can have a function of a signal line that controls the conduction of the transistor 115.

The wiring 131 can be electrically connected to a supply source of a certain potential such as a reference potential. The certain potential is supplied from the wiring 131 to the one of the source and the drain of the transistor 111, whereby write of image data can be stable.

In addition, the wiring 131 can be connected to a circuit 120 and can also have a function of a monitor line. The circuit 120 can have one or more of the supply source of a certain potential, a function of obtaining electric characteristics of the transistor 111, and a function of generating correction data.

FIGS. 9(A) to 9(D) each illustrate an example of a configuration including a liquid crystal element as the display element, which can be applied to the circuit block 110.

Figure 9A:
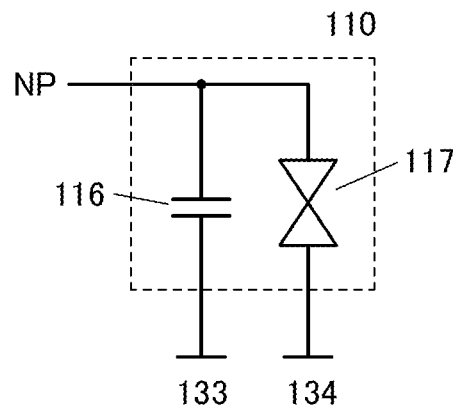
FIG. 9(A) to (D) Diagrams each illustrating a circuit block.

The configuration illustrated in FIG. 9(A) includes a capacitor 116 and a liquid crystal element 117. One electrode of the liquid crystal element 117 is electrically connected to one electrode of the capacitor 116. The one electrode of the capacitor 116 is electrically connected to the node NP.

The other electrode of the capacitor 116 is electrically connected to a wiring 133. The other electrode of the liquid crystal element 117 is electrically connected to a wiring 134. The wirings 133 and 134 have a function of supplying power. The wirings 133 and 134 are capable of supplying a reference potential such as GND or 0 V or a given potential, for example.

Figure 9B:
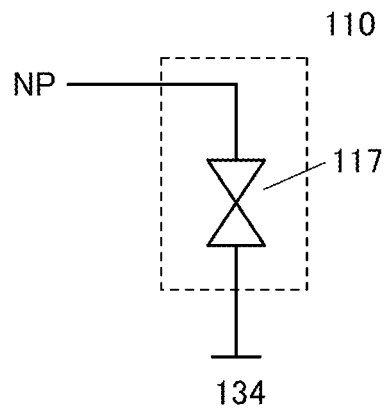

Note that the capacitor 116 may be omitted as illustrated in FIG. 9(B). As described above, an OS transistor can be used as the transistor connected to the node NP. Since an OS transistor has extremely low leakage current, display can be kept for a comparatively long time even when the capacitor 116 functioning as a storage capacitor is omitted. In addition, omitting the capacitor 116 is effective not only for the structure of the transistor but also in the case where a display period is made short in a high-speed operation as in a field-sequential driving. The aperture ratio can be improved by omitting the capacitor 116. Alternatively, the transmittance of the pixel can be improved.

In the configurations in FIGS. 9(A) and 9(B), the operation of the liquid crystal element 117 is started when the potential of the node NP is determined to be higher than or equal to the operation threshold of the liquid crystal element 117. Thus, an display operation is started in some cases at the time when the weight is written to the node NP, and the application might be limited. In a transmissive liquid crystal display device, however, an unnecessary display operation can be made less visible when the operation of, for example, turning off a backlight until the operation of adding the weight (W) and data (D) is terminated is also performed.

Figure 9C:
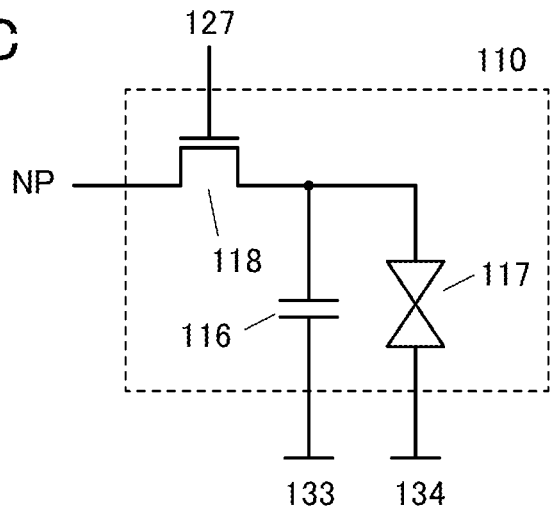

FIG. 9(C) illustrates a configuration in which a transistor 118 is added to the configuration of FIG. 9(A). One of a source and a drain of the transistor 118 is electrically connected to the one electrode of the capacitor 116. The other of the source and the drain of the transistor 118 is electrically connected to the node NP. A gate of the transistor 118 is electrically connected to a wiring 130. The wiring 130 can have a function of a signal line that controls the conduction of the transistor 118.

In the configuration, the potential of the node NP is applied to the liquid crystal element 117 when the transistor 118 is turned on. Thus, the operation of the liquid crystal element can be started at any time after the operation of adding the weight (W) and the data (D).

While the transistor 118 is in a non-conduction state, the potentials supplied to the capacitor 116 and the liquid crystal element 117 are retained continuously; thus, the potentials supplied to the capacitor 116 and the liquid crystal element 117 are preferably reset before the image data is rewritten. For the reset, a reset potential may be supplied to the source line (e.g., the wiring 125 or 126) to which a pixel is connected, whereby the transistor 101 and the transistor 118 are turned on at the same time, for example.

Figure 9D:
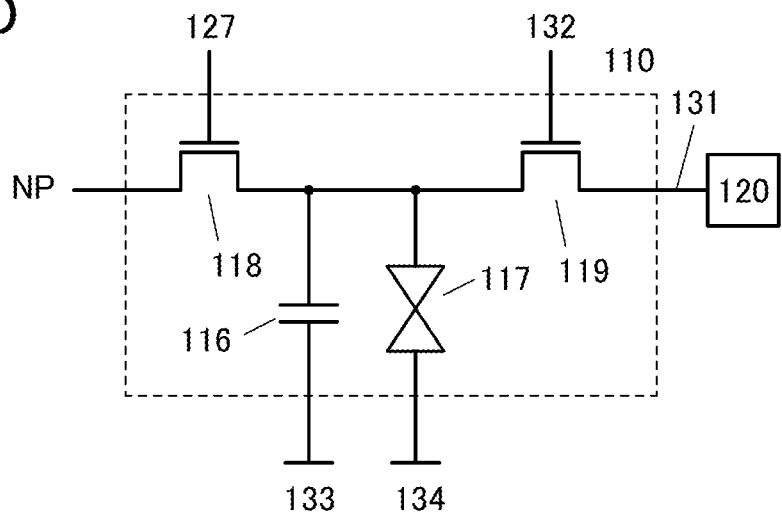

FIG. 9(D) illustrates a configuration in which a transistor 119 is added to the configuration of FIG. 9(C). One of a source and a drain of the transistor 119 is electrically connected to the one electrode of the liquid crystal element 117. The other of the source and the drain of the transistor 119 is electrically connected to the wiring 131. A gate of the transistor 119 is electrically connected to the wiring 132. The wiring 132 can have a function of a signal line that controls the conduction of the transistor 119.

The circuit 120 electrically connected to the wiring 131 is as described above using FIG. 8(C) and also may have a function of resetting the potentials supplied to the capacitor 116 and the liquid crystal element 117.

Figure 10A:
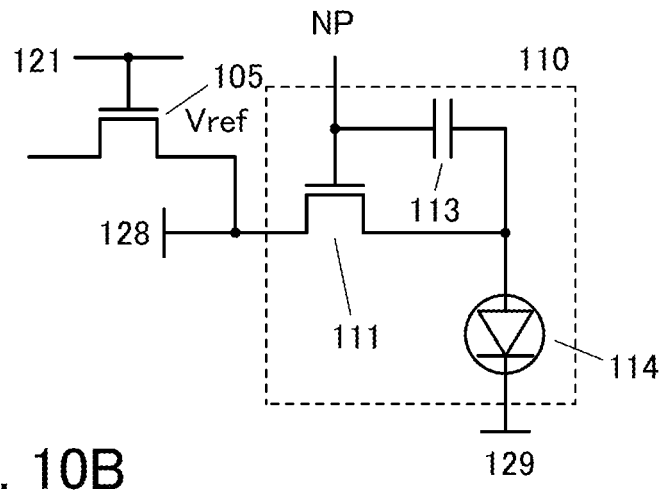
FIG. 10(A) to (C) Diagrams each illustrating a circuit block.
Figure 10B:
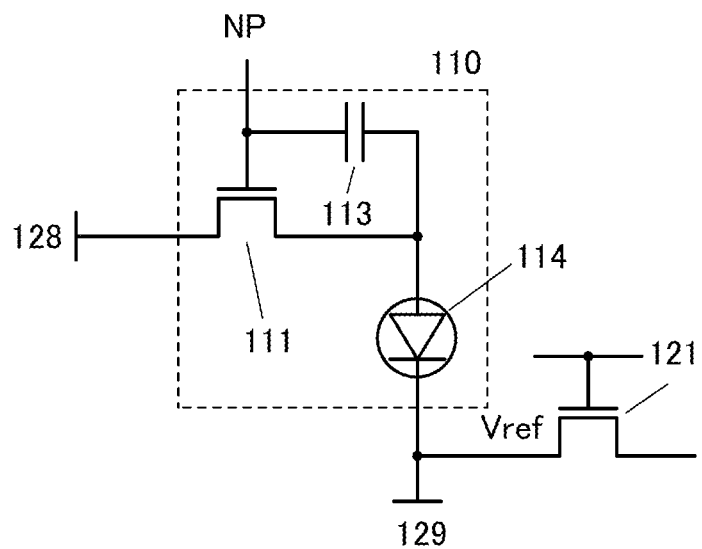
Figure 10C:
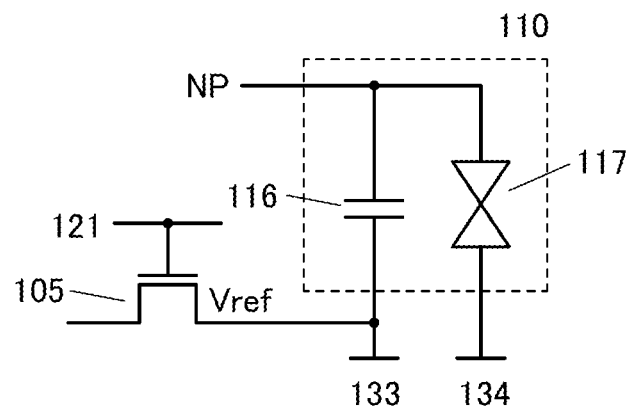

FIGS. 10(A) to 10(C) each illustrate a specific examples of a wiring for supplying "$V_{ref}$" illustrated in FIG. 6(A). As illustrated in FIG. 10(A), the wiring 128 can be used as the wiring for supplying "$V_{ref}$" in the case where a light-emitting element is used as the display element. Since "$V_{ref}$" is preferably 0 V, GND, or a low potential, the wiring 128 also has a function of supplying at least any of these potentials. To the wiring 128, "$V_{ref}$" is supplied at the timing when data is written to the node NP, and a high potential power is supplied at the timing when the light-emitting element 114 emits light. Alternatively, as illustrated in FIG. 10(B), the wiring 129 which supplies a low potential may be used as the wiring for supplying "$V_{ref}$".

In the case where a liquid crystal element is used as a display element as illustrated in FIG. 10(C), the wiring 133 can be used as the wiring for supplying "$V_{ref}$". Alternatively, the wiring 134 may be used. Note that regardless of the kind of the display element, a dedicated common wiring for supplying "$V_{ref}$" may be provided.

Figure 11A:
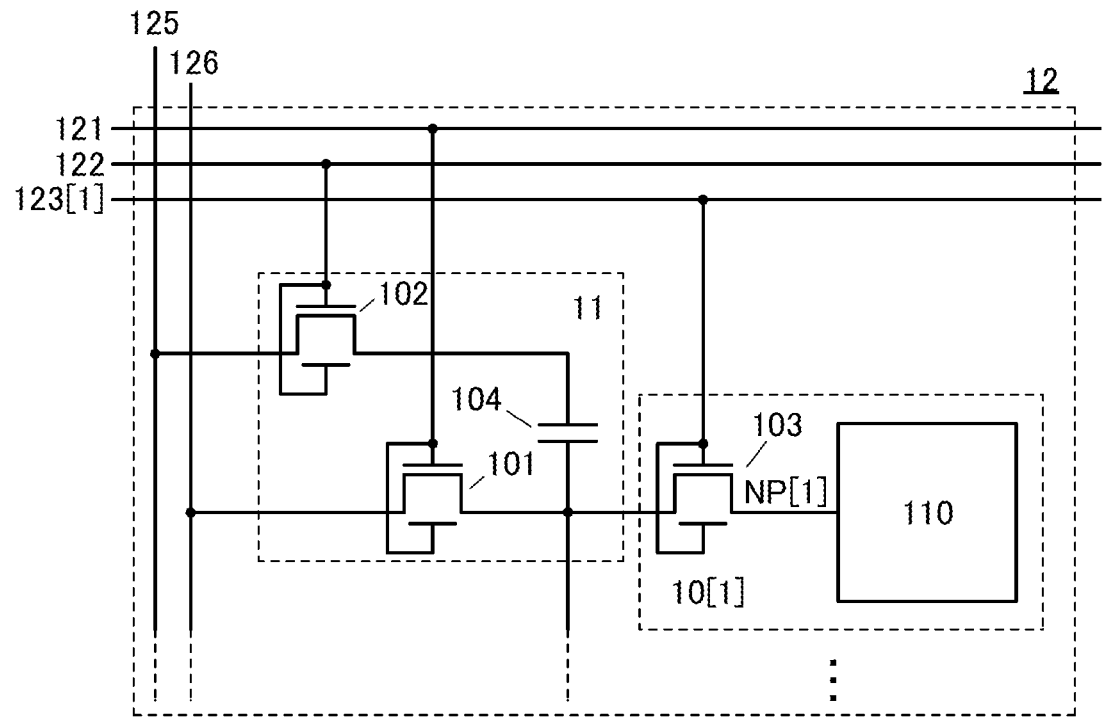
FIGS. 11(A) and (B) Diagrams each illustrating a pixel block.
Figure 11B:
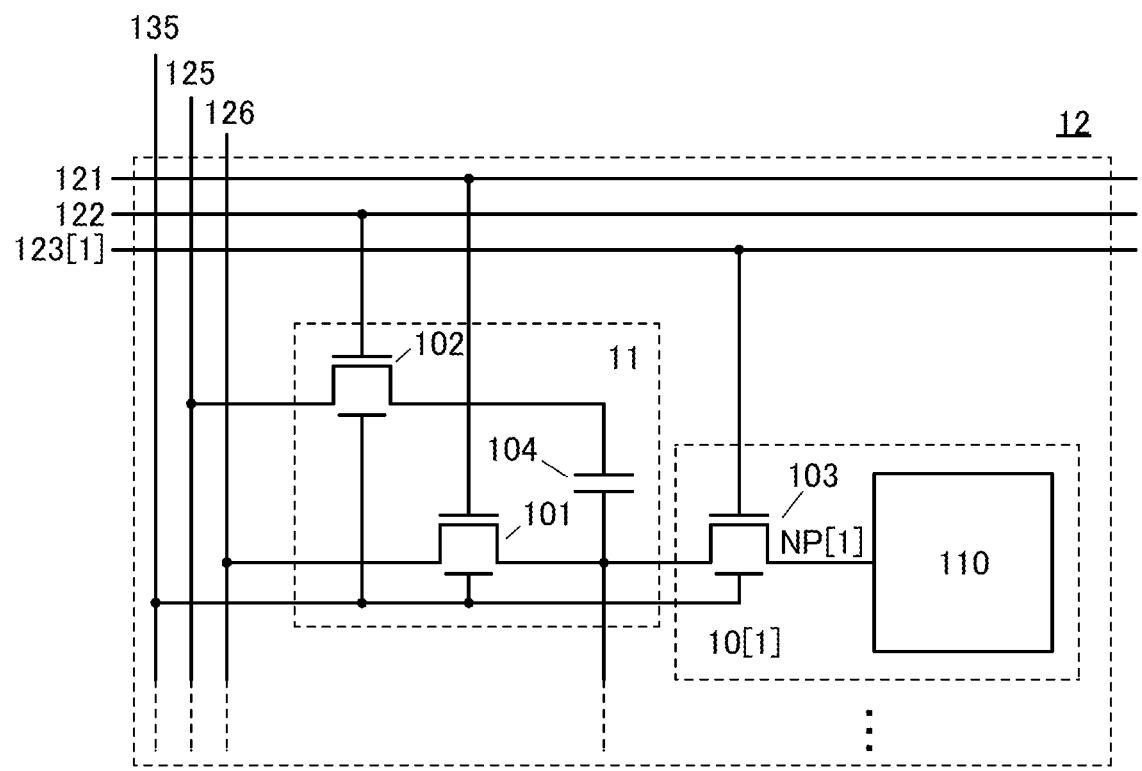

In one embodiment of the present invention, as illustrated in examples of FIGS. 11(A) and 11(B), a configuration in which the transistors included in the pixel block 12 are provided with back gates may be employed. FIG. 11(A) illustrates a configuration in which the back gates are electrically connected to the front gates, which has an effect of increasing on-state currents. FIG. 11(B) illustrates a configuration in which the back gates are electrically connected to a wiring 135 capable of supplying a constant potential, which enables control of the threshold voltages of the transistors.

As shown in the timing chart of FIG. 4 and the like, a gate signal "H" is shifted and input to the circuit 10 at a certain interval. In contrast, an operation of inputting the gate signal "H" or "L" in accordance with the operation period of one of the circuits 10 is needed for the circuit 11. In addition, such an operation is repeated for the number of circuits 10 included in the pixel block 12.

Therefore, the gate driver 14a, which controls the circuits 11, and the gate driver 14b, which controls the circuits 10, are preferably provided as illustrated in FIG. 1. The gate drivers that control the circuits 10 and the circuits 11 are provided separately, whereby the number of PWC (pulses width control) signals that are needed for the operation can be smaller than the number of the circuits 10 included in the pixel block 12.

Figure 12:
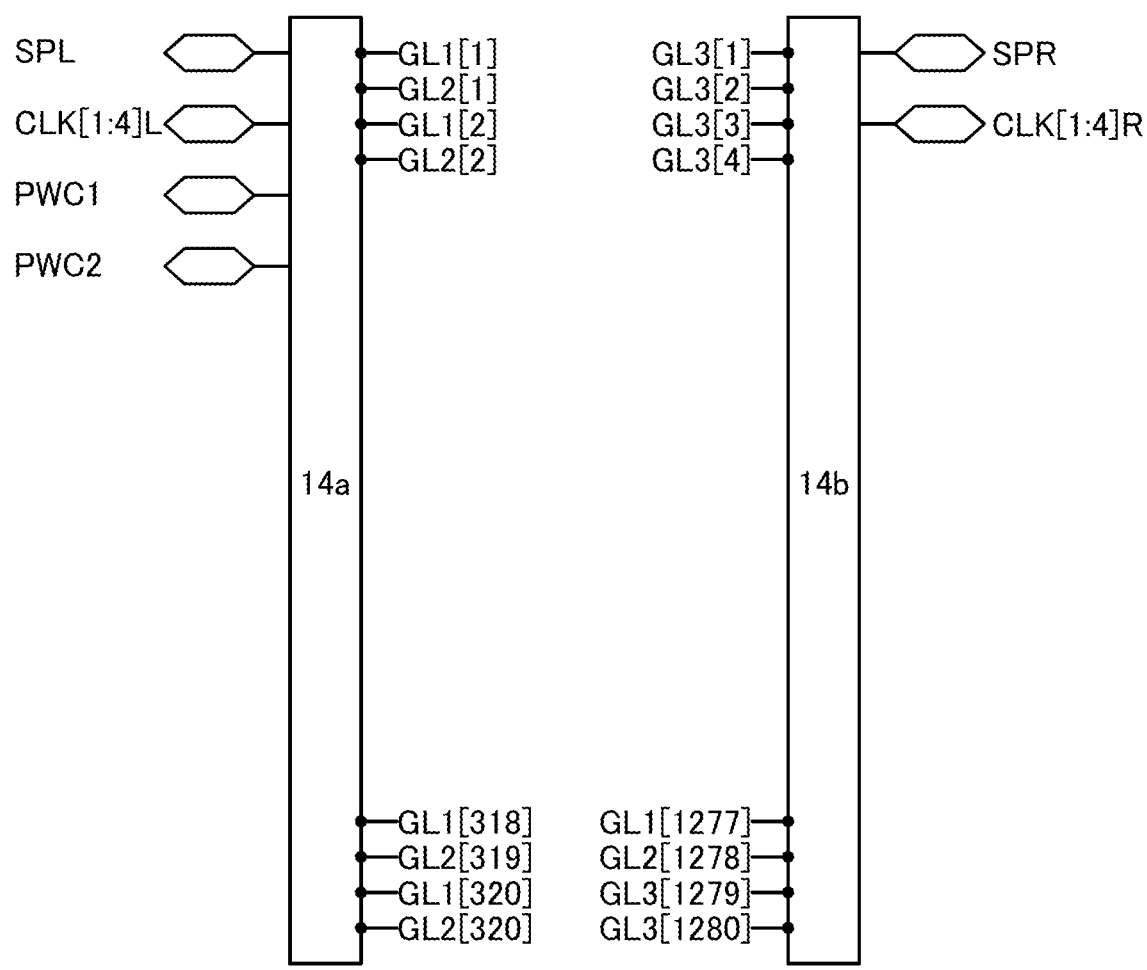
FIG. 12 A diagram illustrating a gate driver.

For example, FIG. 12 illustrates input/output signals of the gate drivers 14a and 14b. Note that here, the number of row of pixels is 1280, and the number of pixels (the circuits 10) included in the pixel block 12 is 4.

The signals input to the gate driver 14a can be SPL (a start pulse signal for the gate driver 14a), CLK[1:4]L (a clock signal for the gate driver 14a), and PWC1 and PWC2 (pulse width control signals of gate signals), and output thereof can be performed for GL1[1] to GL1[320] and GL2[1] to GL2[320] that are gate lines. Here, GL1 corresponds to the wirings 125, and GL2 corresponds to the wiring 126. In addition, 320 accords with the number of the pixel blocks 12 provided in the vertical direction.

The signals input to the gate driver 14*b* can be SPR (a start pulse signal for the gate driver 14*b*) and CLK[1:4]R (a clock signal for the gate driver 14*b*), and output thereof can be performed for GL3[1] to GL3[1280] that are gate lines. Here, GL3 corresponds to the wiring 123. In addition, 1280 accords with the number of the pixels 20 provided in the vertical direction.

Figure 13:
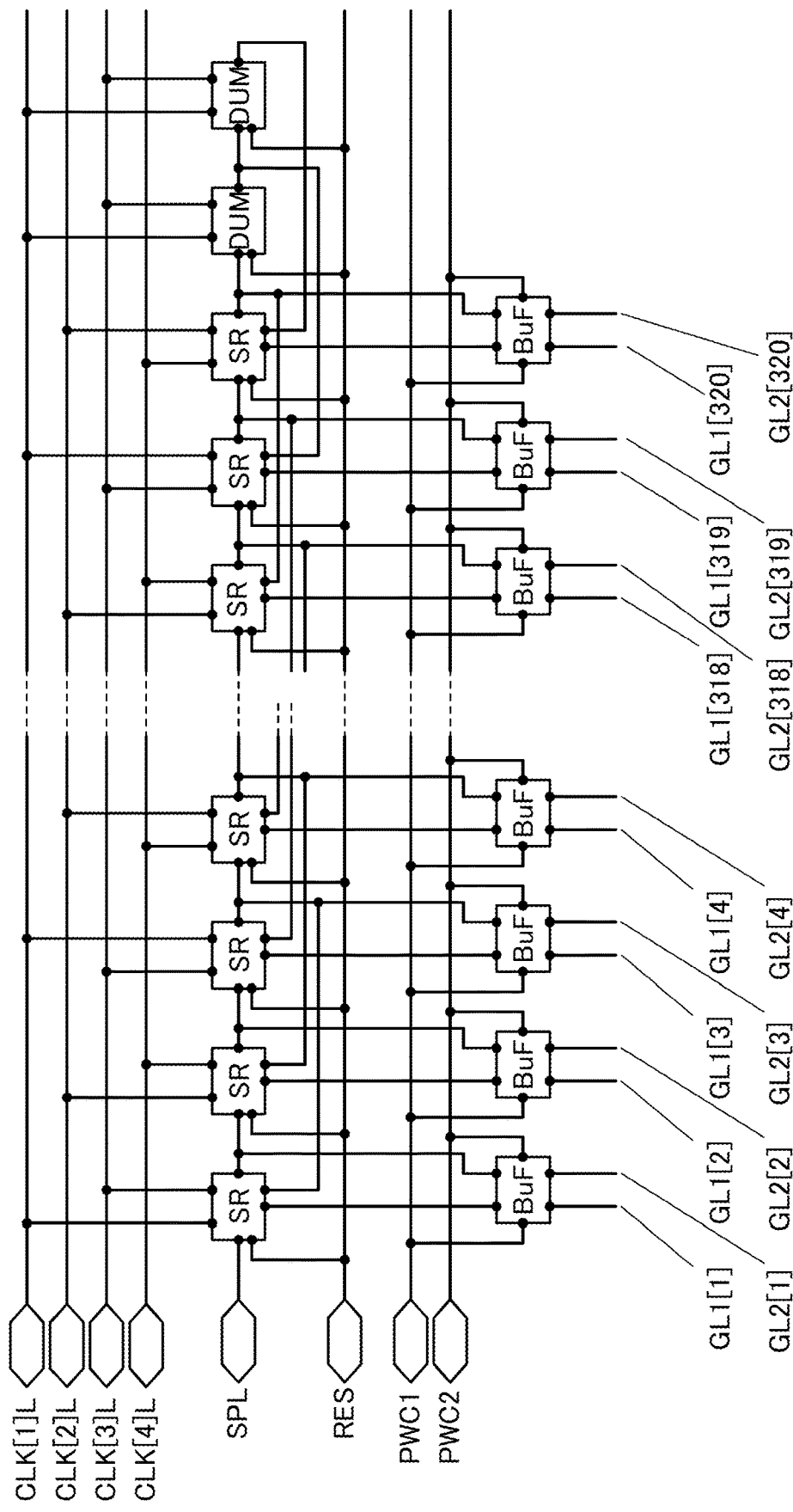
FIG. 13 A diagram illustrating a gate driver.

FIG. 13 is an example of a block diagram of the gate driver 14*a*. The gate driver 14*a* includes shift register circuits composed of a plurality of set-reset flip-flops and buffer circuits (BuF). The shift register circuit of one stage is represented by "SR" and a dummy stage is represented by "DUM". RES is a reset signal, and all the outputs of the shift register circuits can be set to "L" with an "H" input.

"BuF" includes an AND circuit and can output signals to the gate lines (GL1 and/or GL2) with the use of the output signal of "SR" (SROUT signal), the PWC1 signal, and the PWC2 signal.

Figure 15B:
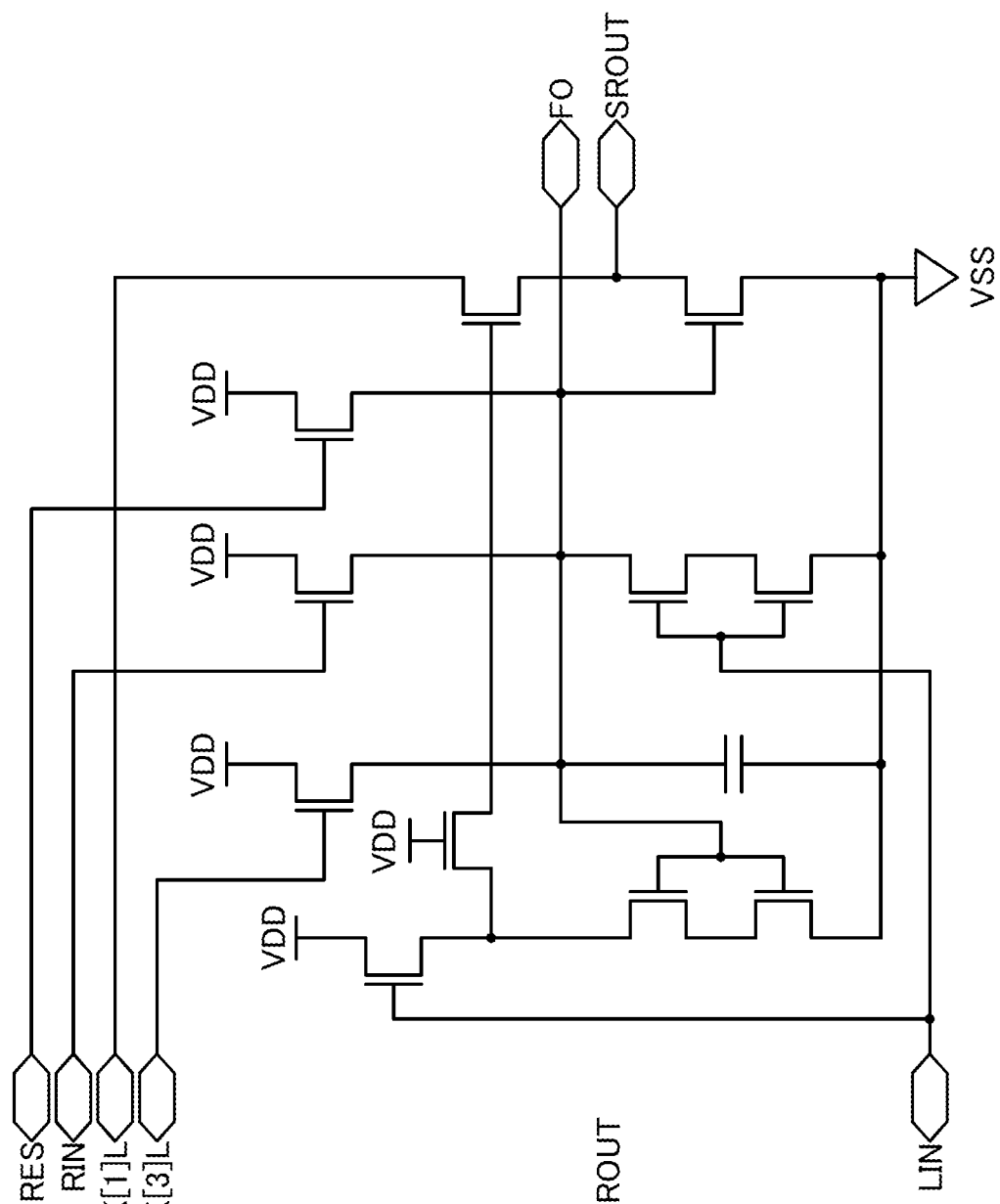
FIGS. 15(A) and (B) Diagrams illustrating a gate driver.
Figure 15A:
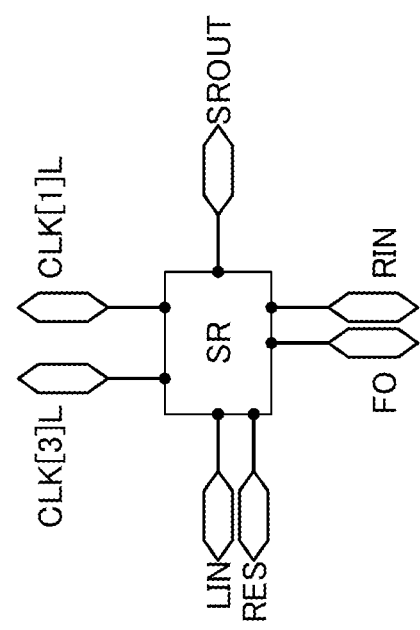

For example, "SR" can have a configuration of a block diagram in FIG. 15(A) and a circuit diagram in FIG. 15(B). Here, LIN represents a shift signal that is input from "SR" of the previous stage, FO represents an output signal that controls a transistor included in "Buf", and RIN represents a reset signal that is input from "SR" of the next stage. Note that clock signals to be input can be a combination of CLK[1]L and CLK[3]L or a combination of CLK[2]L and CLK[4]L, for example.

The buffer circuit (BuF) can have a configuration of a block diagram in FIG. 16(A) and a circuit diagram in FIG. 16(B). Here, FN represents a signal (FO) that is input from "SR", and LN represents a signal (SROUT) that is input from "SR".

Figure 14:
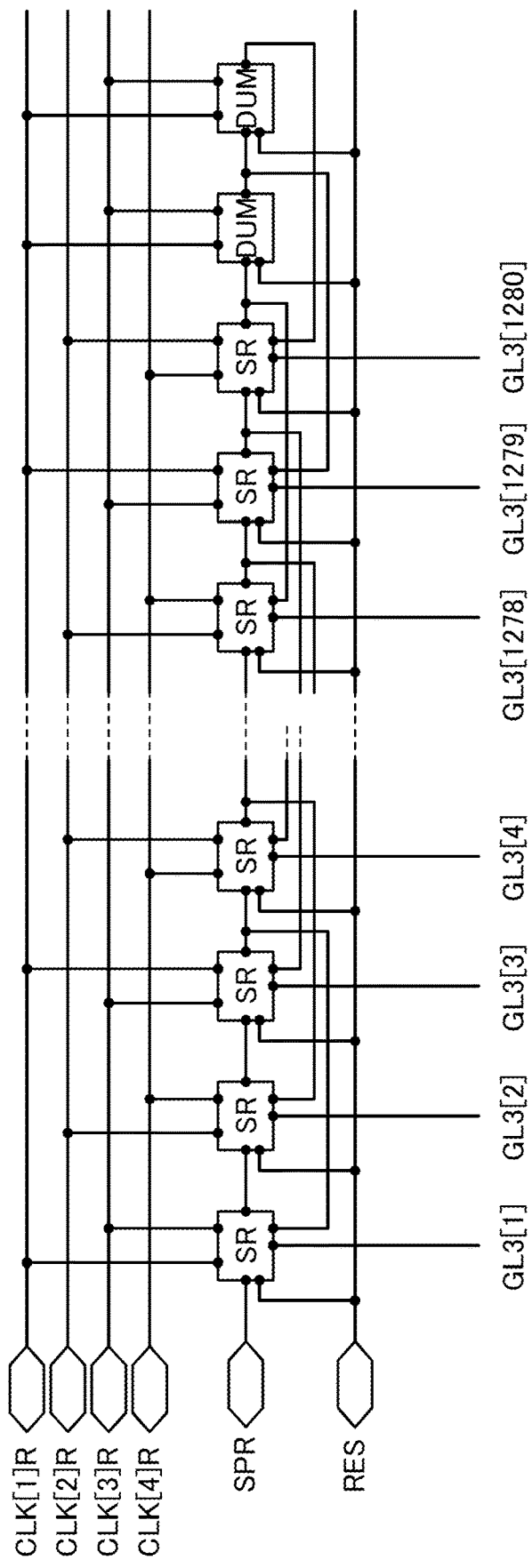
FIG. 14 A diagram illustrating a gate driver.

FIG. 14 is an example of a block diagram of the gate driver 14*b*. The shift register circuits composed of a plurality of set-reset flip-flops are included. The shift register circuit of one stage is represented by "SR" and a dummy stage is represented by "DUM". For example, "SR" can have a configuration of a block diagram in FIG. 17(A) and a circuit diagram in FIG. 17(B).

Figure 18:
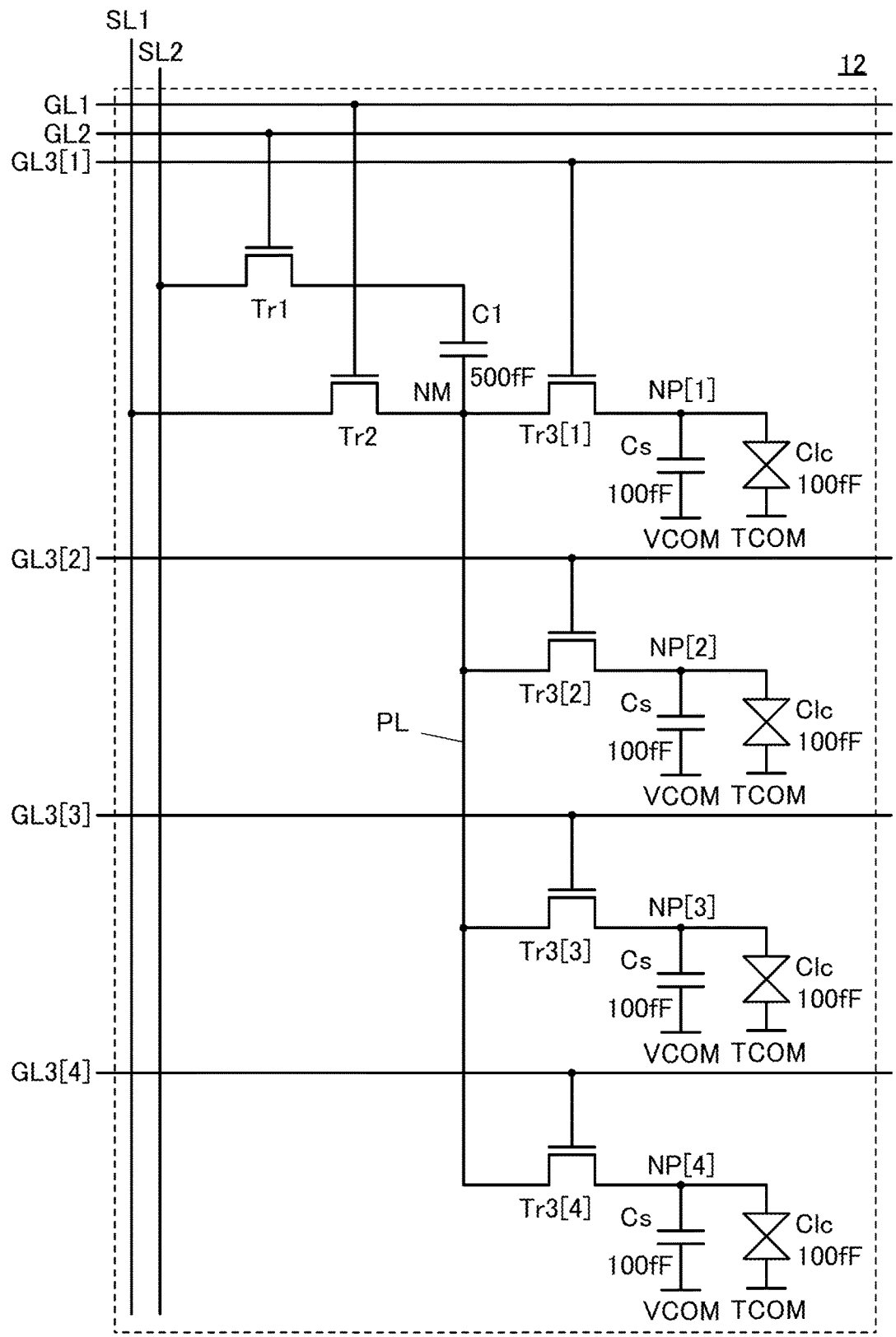
FIG. 18 A diagram illustrating a configuration of a pixel block used for simulation.
Figure 19:
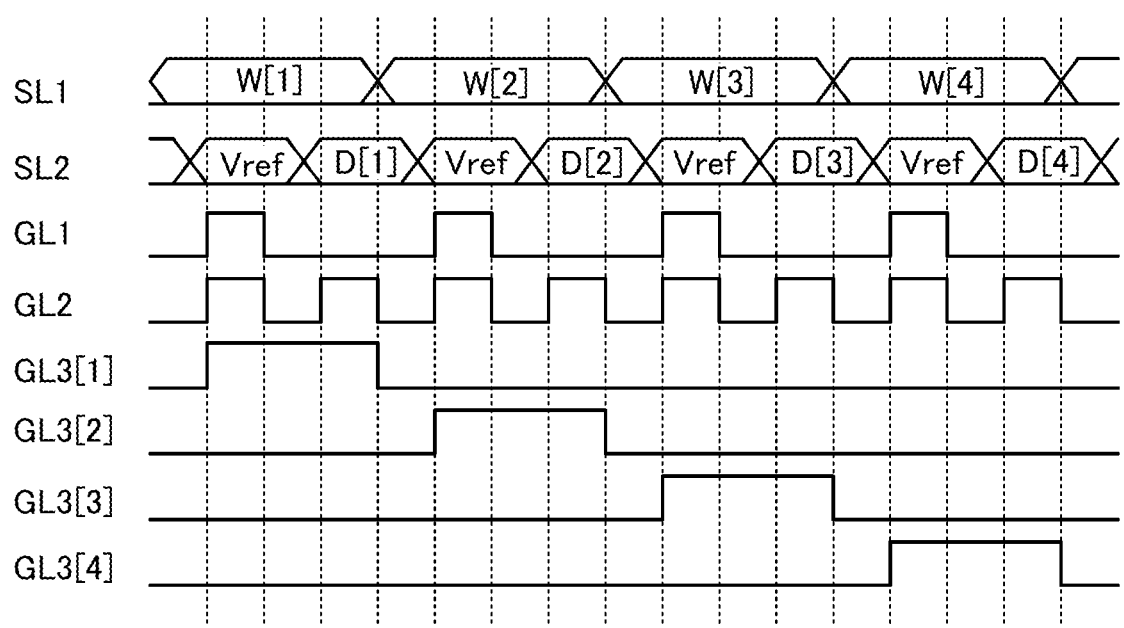
FIG. 19 A timing chart used for simulation.

Next, simulation results on the pixel block 12 are described. FIG. 18 illustrates a configuration of the pixel block 12 used for the simulation. FIG. 19 shows a timing chart used for the simulation. The number of pixels included in the pixel block 12 was 4, and the circuit block 110 had the configuration illustrated in FIG. 9(A) (a liquid crystal element and a capacitor). The simulation was performed on voltage changes of the nodes NP at the time when the pixels were successively operated.

Parameters used in the simulation were as follows: the transistor size was L/W=4 μm/4 μm (the transistors included in the pixel block 12), the capacitance value of a capacitor C1 was 500 fF, the capacitance value of a capacitor Cs was 100 fF, the capacitance value of a liquid crystal element C1c was 100 fF, and common electrodes VCOM and TCOM were set to 0 V. In addition, a voltage applied to the gate of the transistor was set to +15 V as "H" and −10 V as "L". Note that SPICE is used as circuit simulation software. Parasitic capacitance of a wiring PL in FIG. 18 is apart from the parameters here.

FIG. 19 is the timing chart used for the simulation. Here, weight (W[1] to W[4]) and data (D[1] to D[4]) were all 5 V. Furthermore, "$V_{ref}$" was 0 V.

Figure 20A:
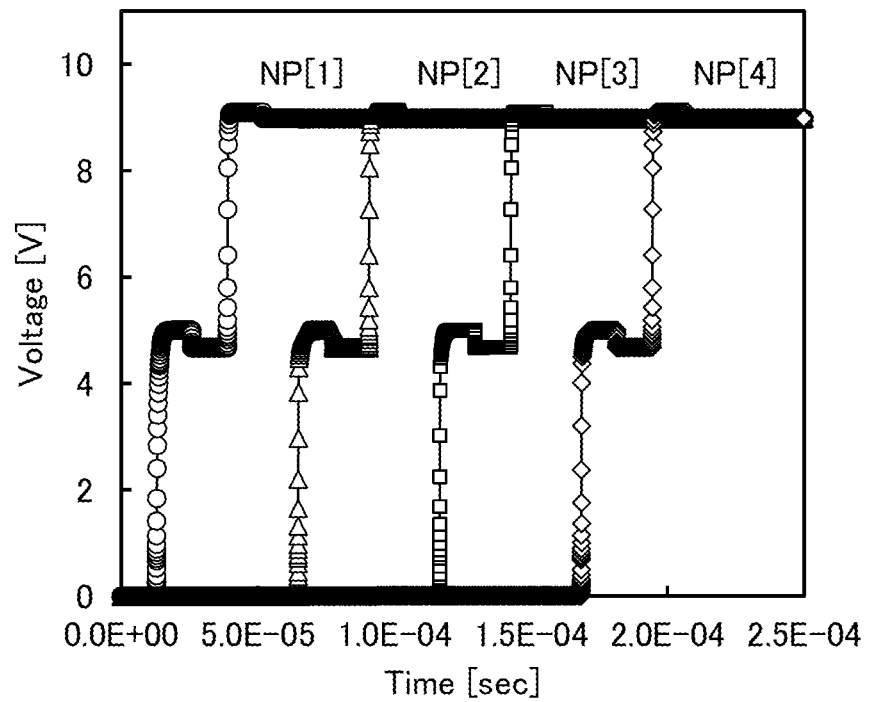
FIGS. 20(A) and (B) Diagrams showing simulation results.

FIG. 20(A) shows simulation results obtained when the weight (W[1] to W[4]) and the data (D[1] to D[4]) were all 5 V and "$V_{ref}$" was 0 V. The horizontal axis represents time and the vertical axis represents the voltage of the node NP. It was found that the weight (W) and the data (D) were added in each of the nodes NP in accordance with the capacitance ratio.

Figure 20B:
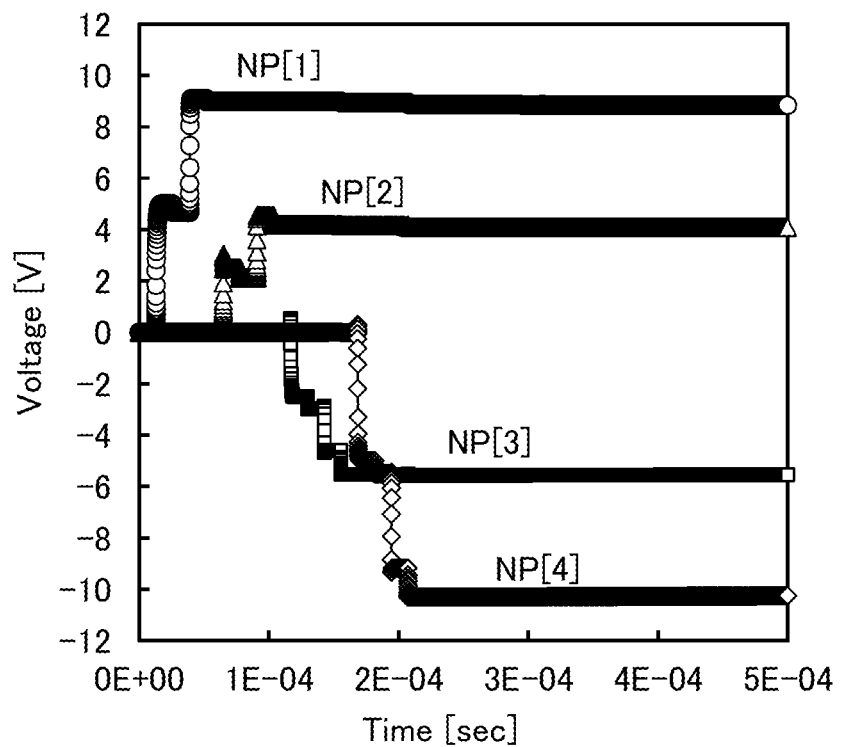

FIG. 20(B) shows simulation results obtained when the weight (W[1]) and the data (D[2]) were 5V, the weight (W[2]) and the data (D[2]) were 2.5 V, the weight (W[3]) and the data (D[3]) were −2.5 V, the weight (W[4]) and the data (D[4]) were −5 V, and "$V_{ref}$" was 0 V. It was found that the weight (W) and the data (D) were added in each of the nodes NP in accordance with the capacitance ratio. Furthermore, an addition operation was able to be performed in one pixel block 12 regardless of the polarities of the weight and the data, showing that application of gate line inversion driving is also possible.

Thus, it was confirmed that the pixel block 12, which is one embodiment of the present invention, was able to normally perform an operation of adding the weight (W) and the data (D) in the range where the parasitic capacitance of the wiring PL does not affect.

Figure 21:
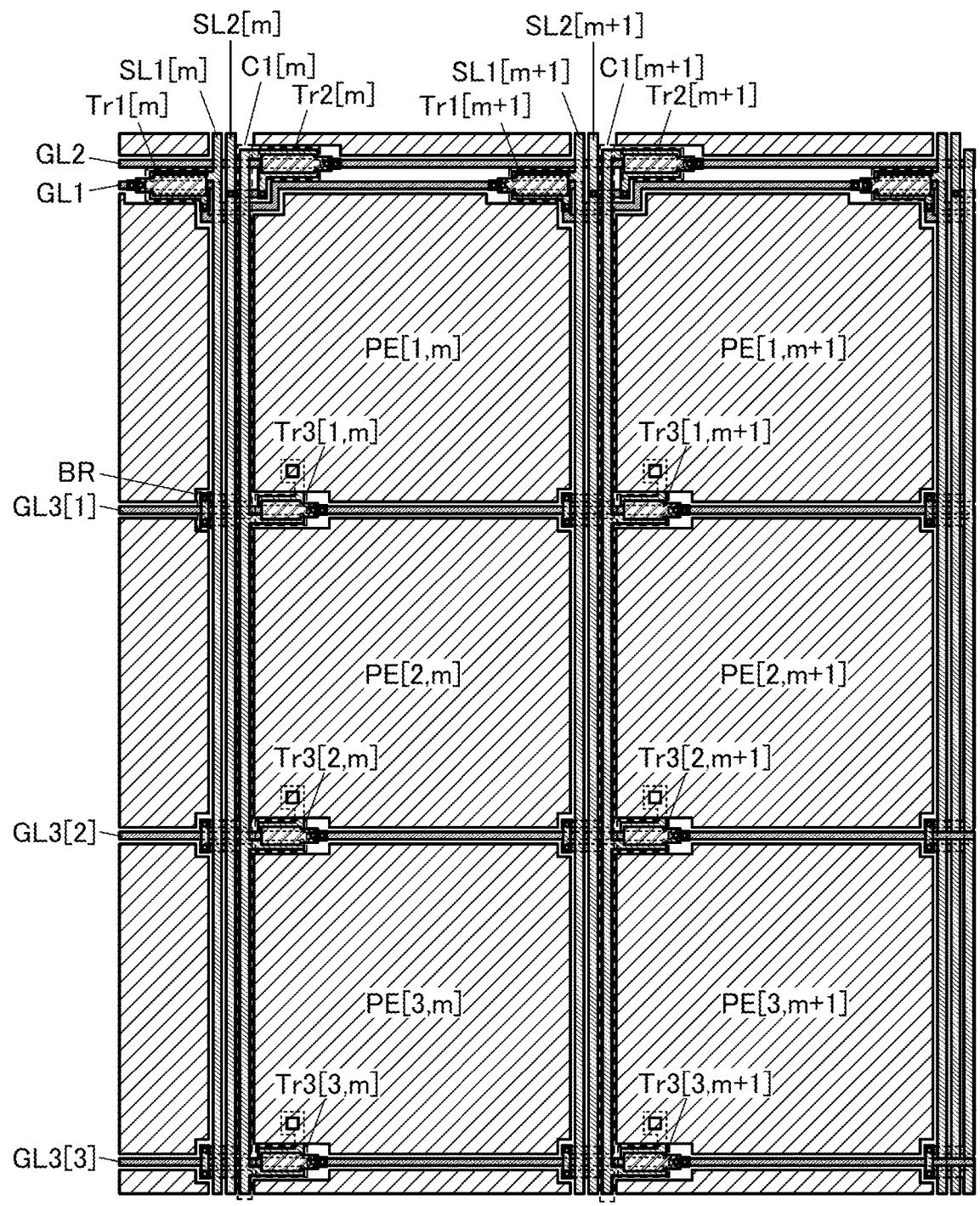
FIG. 21 A diagram illustrating a pixel layout.

Next, simulation results on the pixel layout are described. FIG. 21 is a diagram illustrating an example of the layout for vertical three pixels in the m-th column and the m+1-th column, in which the pixel block 12 illustrated in FIG. 18 is used as a basic configuration.

Note that FIG. 21 shows the layout as far as pixel electrodes PE corresponding to the nodes NP, and Cs is omitted. Bottom-gate transistors (with back gates) are illustrated as an example.

Transistors Tr1 and Tr2 are placed to be included in a pixel in the first row of the pixel block 12. Therefore, as for the transistor(s) included in each row, three transistors, transistors Tr1, Tr2, and Tr3, are included in the first row; and one transistor, the transistor Tr3, is included in each of the second and subsequent rows. Note that each size of the transistors Tr1 and Tr2 is assumed to L/W=4 μm/30 μm, and the size of the transistor Tr3 is assumed to L/W=4 μm/10 μm. The pixel pitch is assumed to approximately 136 μm (which differs between the first row and the second and subsequent rows).

A conductive layer formed through the same process as that of the gate wiring and a conductive layer formed through the same process as that of the source wiring are used as a pair of electrodes in C1. The two conductive layers are placed parallel to source lines SL1 and SL2 and have a region in each pixel, in which they overlap with each other with an insulating layer (e.g., a gate insulating film) provided therebetween. That is, one capacitor is provided in each pixel. Furthermore, the capacitors are connected in parallel and thus have a value equivalent to that of one large capacitor.

That is, the capacitor C1 is divided and placed; therefore, the aperture ratio and transmittance of the pixel can be improved. Note that a connection wiring BR that serves as a bridge between gate lines is preferably used for electrical connection between one of the conductive layers of one capacitor and one of the conductive layers of another capacitor. The connection wiring BR can be formed through the same process as that of the source line, for example.

Figure 22A:
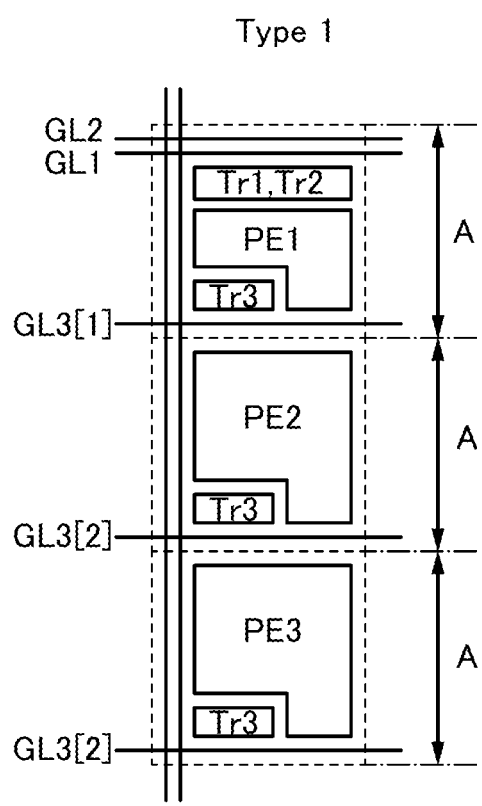
FIGS. 22(A) and (B) Diagrams each illustrating a pixel layout.

Here, since the transistors Tr1 and Tr2 and the gate lines for driving them are provided in the pixel in the first row, the number of components is larger than those of other rows. As shown in a type 1 illustrated in FIG. 22(A), in the case where the lengths in the vertical direction of all the pixels are standardized to A, a pixel electrode PE1 is smaller than pixel electrodes PE2 and PE3. Therefore, display of the first row might be recognized as a dark line.

Figure 22B:
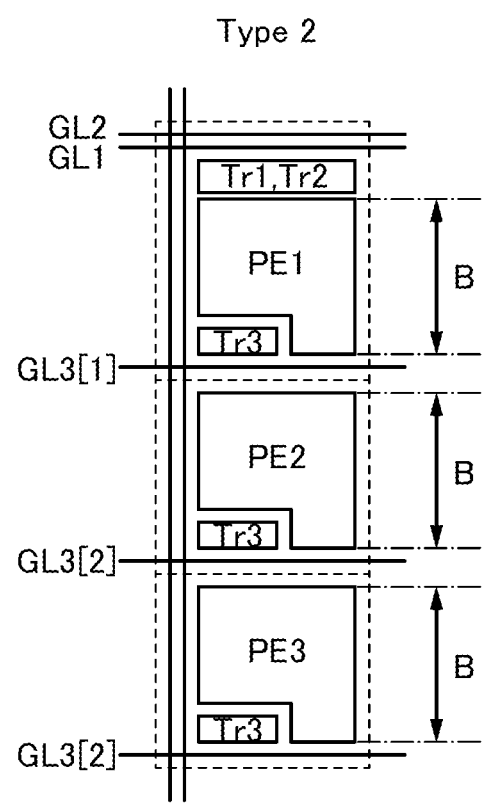

Thus, as shown in a type 2 illustrated in FIG. 22(B), the lengths in the vertical direction of all the pixel electrodes may be standardized to B, and the length in the vertical direction of the pixel in the first row may be larger than the lengths in the vertical direction of the pixels in the second and subsequent rows. Alternatively, the lengths in the vertical direction of the pixels may be adjusted so that the pixel electrode PE1 is larger than the pixel electrodes PE2 and PE3. Such configurations can prevent the display of the first row from being recognized as a dark line.

Figure 23:
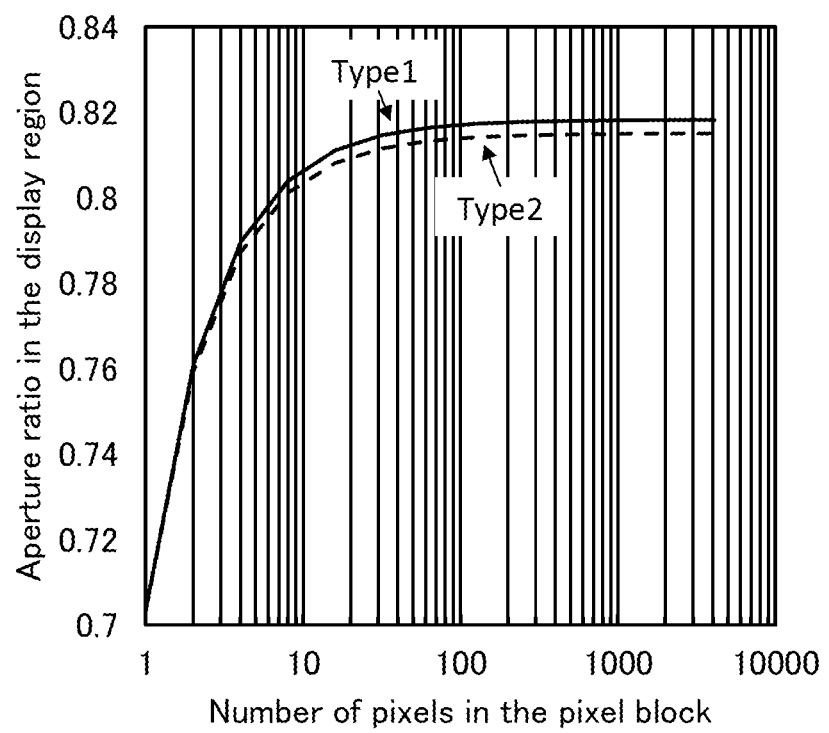
FIG. 23 A diagram showing calculation results of an aperture ratio.

FIG. 23 shows calculated values of the aperture ratio in the case where the pixel block of the type 1 or the type 2 in FIG. 22 is applied to the display region. The aperture ratio described here is (the area of all the pixel electrodes in the pixel block)/(the area of the pixel block). In an estimation, the number of pixels included in the pixel block was 1 to 4000. Note that all the pixels in the type 1 are each assumed to a square pixel with a side length of 136 µm. In the type 2, a square pixel with a side length of 136 µm is used in the case where the number of the pixels is one, and the lengths in the vertical direction are adjusted so that the pixel electrodes have the same size in the case where the number of the pixels is two or more. Note that the length in the vertical direction of the pixel block is the same as that in the case of using a square pixel with a side length of 136 µm in order to enable comparison with the type 1.

As illustrated in FIG. 23, in each of the type 1 and the type 2, the aperture ratio increases rapidly until the number of the pixels in the pixel block reaches about 10, and the aperture ratio reaches 81% when the number of the pixels in the pixel block is about 20. After that, the aperture ratio increases gently and reaches nearly 82% when the number of the pixels in the pixel block is 100. Thus, in the case of regarding the aperture ratio as important, the number of the pixels in the pixel block is preferably as large as possible. Note that in consideration of an efficient effect due to the pixel layout, the number of the pixels in the pixel block is preferably about 5 to 100, further preferably about 10 to 50, still further preferably about 20 to 40.

The above simulation results show the effect of one embodiment of the present invention.

This embodiment can be implemented in combination with any of the structures described in the other embodiments and the like, as appropriate.

Embodiment 2

In this embodiment, a structure example of a display device using a liquid crystal element and a structure example of a display device using a light-emitting element are described. Note that the description of the components, operations, and functions of the display device described in Embodiment 1 is omitted in this embodiment.

Figure 24A:
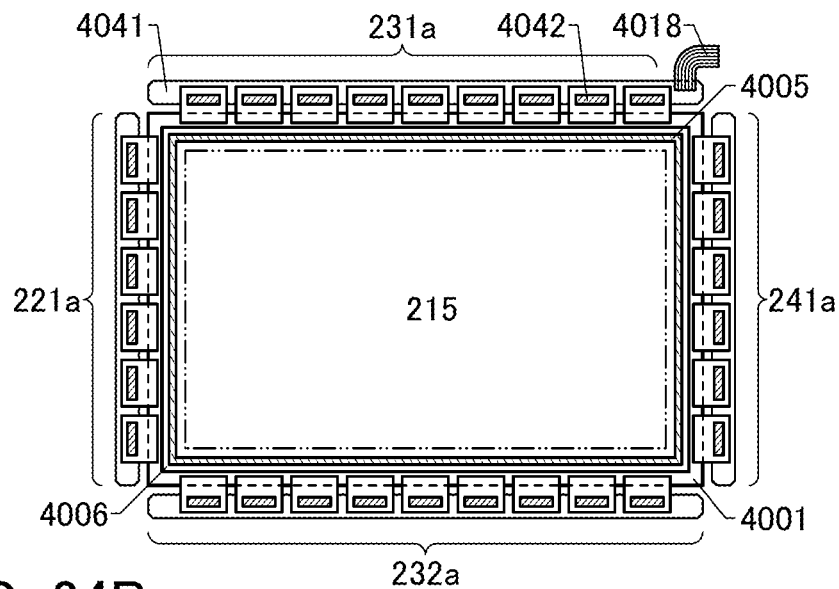
FIG. 24(A) to (C) Diagrams each illustrating a display device.
Figure 24B:
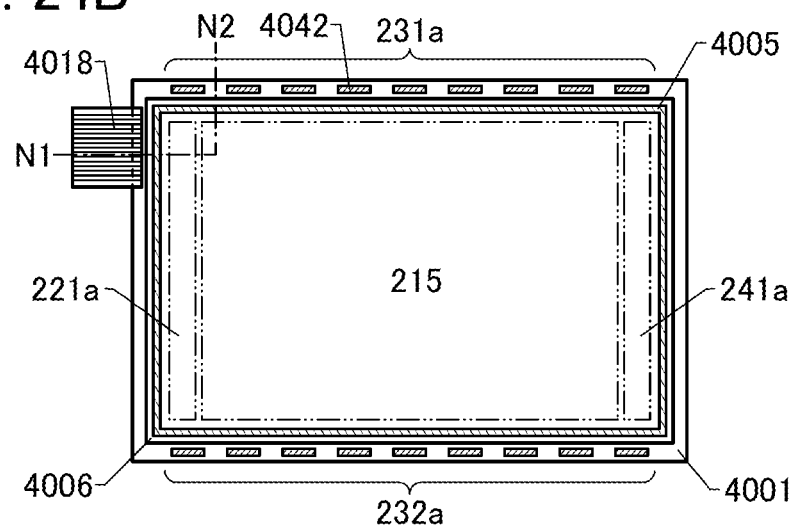
Figure 24C:
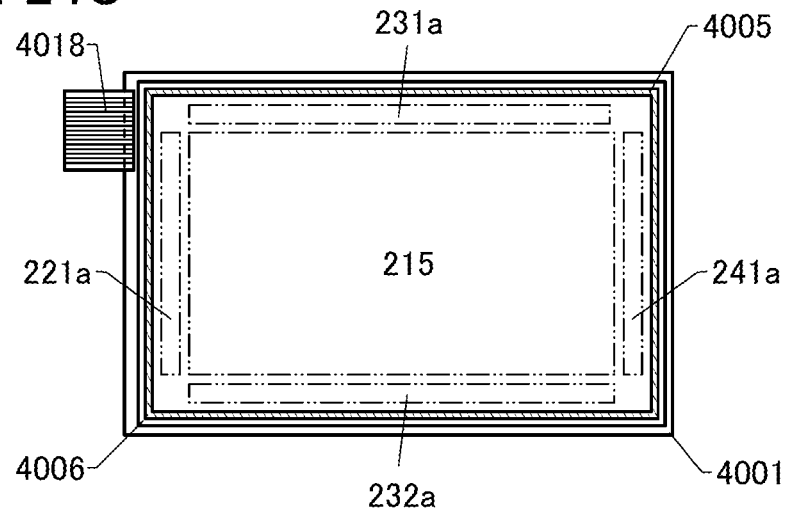

FIGS. 24(A) to 24(C) are diagrams each illustrating a structure of a display device in which one embodiment of the present invention can be used.

In FIG. 24(A), a sealant 4005 is provided to surround a display portion 215 provided over a first substrate 4001, and the display portion 215 is sealed with the sealant 4005 and a second substrate 4006.

The pixel block 12 and the like described in Embodiment 1 can be provided in the display portion 215. Note that a scan line driver circuit and a signal line driver circuit which are described below correspond to the gate driver and the source driver, respectively.

In FIG. 24(A), a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings 128, 129, 132, 133, 135, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

FIG. 24(B) illustrates an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example illustrated in FIG. 24(B), the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 24(B), the sealant 4005 is provided to surround the display portion 215, the scan line driver circuit 221a, and the common line driver circuit 241a provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with display elements with the use of the first substrate 4001, the sealant 4005, and the second substrate 4006.

Although the signal line driver circuit 231a and the signal line driver circuit 232a are separately formed and mounted on the first substrate 4001 in the example illustrated in FIG. 24(B), one embodiment of the present invention is not limited to this structure. The scan line driver circuit may be separately formed and then mounted, part of the signal line driver circuits or part of the scan line driver circuits may be separately formed and then mounted. The signal line driver circuit 231a and the signal line driver circuit 232a may be formed over the same substrate as the display portion 215, as illustrated in FIG. 24(C).

In some cases, the display device encompasses a panel in which the display element is sealed, and a module in which an IC or the like including a controller is mounted on the panel.

The display portion and the scan line driver circuit provided over the first substrate each include a plurality of transistors. As the transistors, the transistor described in the above embodiment can be used.

Transistors included in a peripheral driver circuit and transistors included in the pixel circuits of the display portion may have the same structure or different structures. The transistors included in the peripheral driver circuit may be transistors having the same structure, or transistors having two or more kinds of structures may be included. Similarly, the transistors included in the pixel circuits may be transistors having the same structure, or transistors having two or more kinds of structures may be included.

An input device 4200 can be provided over the second substrate 4006. The display devices illustrated in FIGS. 24(A) to 24(C) and provided with an input device 4200 can function as a touch panel.

There is no particular limitation on a sensor element included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferred because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 25A:
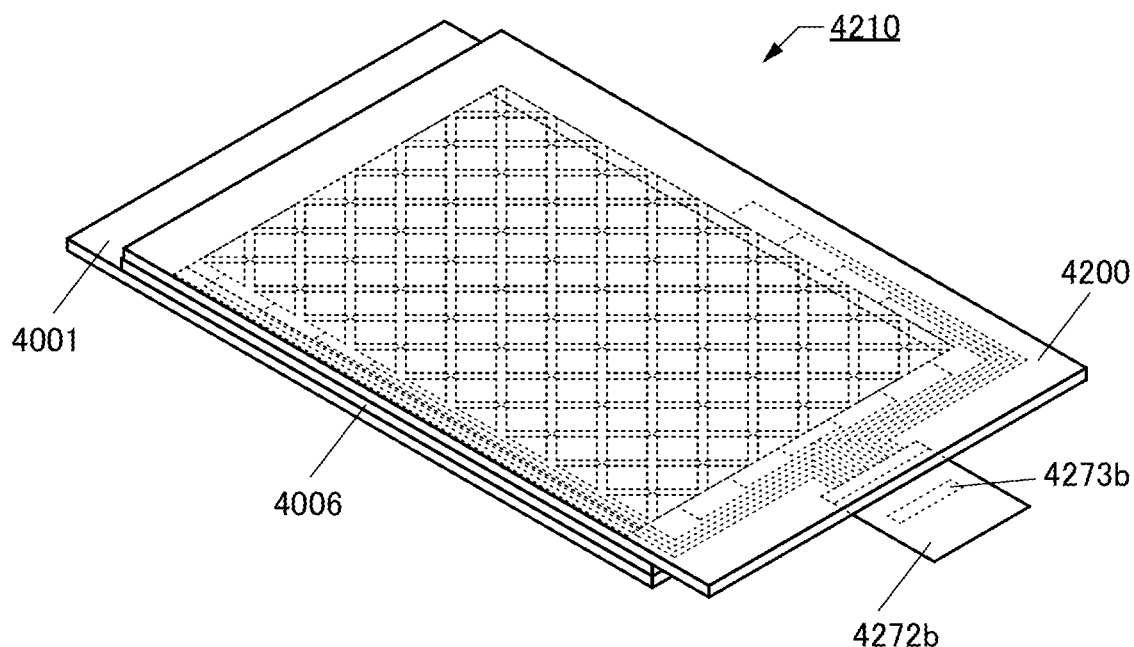
FIGS. 25(A) and (B) Diagrams illustrating a touch panel.
Figure 25B:
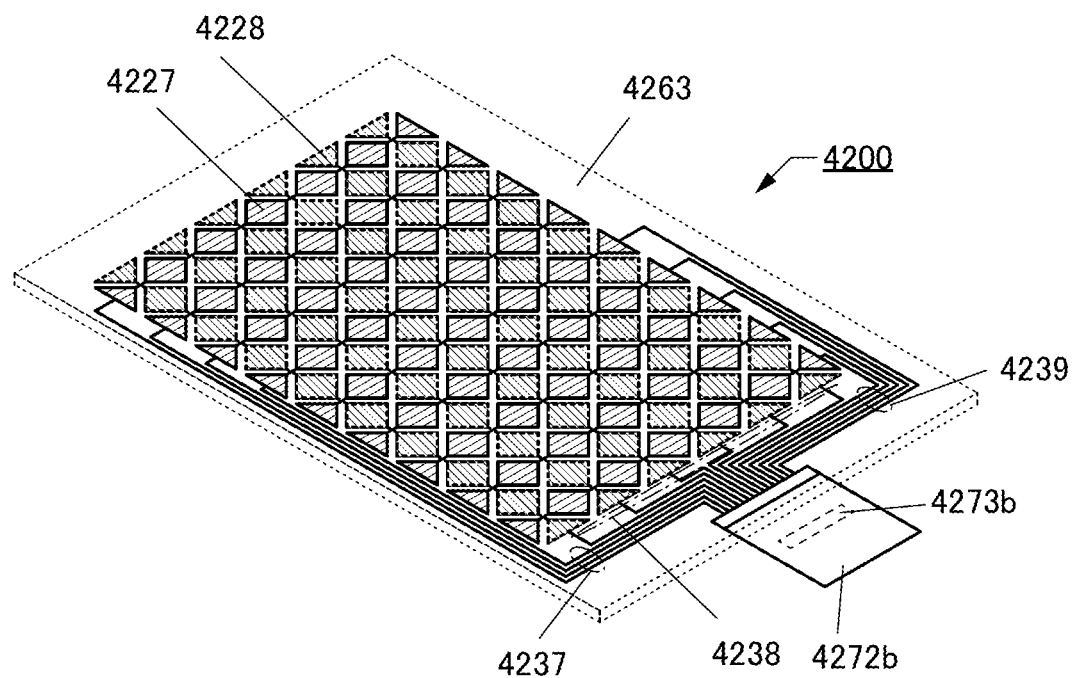

FIGS. 25(A) and 25(B) illustrate an example of the touch panel. FIG. 25(A) is a perspective view of a touch panel 4210. FIG. 25(B) is a schematic perspective view of the input device 4200. Note that for clarity, only typical components are shown.

The touch panel 4210 has a structure in which a display device and a sensor element that are separately formed are attached to each other.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the plurality of wirings 4238. An IC 4273b can be provided for the FPC 4272b.

Alternatively, a touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

FIGS. 26(A) and 26(B) are cross-sectional views of a portion indicated by chain line N1-N2 in FIG. 24(B).

Display devices illustrated in FIGS. 26(A) and 26(B) each include an electrode 4015, and the electrode 4015 is electrically connected to a terminal included in the FPC 4018 through an anisotropic conductive layer 4019. In FIGS. 26(A) and 26(B), the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors. In FIGS. 26(A) and 26(B), the transistor 4010 included in the display portion 215 and the transistor 4011 included in the scan line driver circuit 221a are shown as an example. Note that in the examples illustrated in FIGS. 26(A) and 26(B), the transistor 4010 and the transistor 4011 are bottom-gate transistors but may be top-gate transistors.

In FIGS. 26(A) and 26(B), the insulating layer 4112 is provided over the transistor 4010 and the transistor 4011. In FIG. 26(B), a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display devices illustrated in FIGS. 26(A) and 26(B) each include a capacitor 4020. The capacitor 4020 includes an electrode 4021 formed in the same step as a gate electrode of the transistor 4010, and an electrode formed in the same step as the source electrode and the drain electrode. The electrodes overlap with each other with an insulating layer 4103 therebetween.

In general, the capacitance of a capacitor provided in a pixel portion of a display device is set in consideration of the leakage current or the like of transistors provided in the pixel portion so that charges can be held for a predetermined period. The capacitance of the capacitor is set in consideration of the off-state current of the transistors or the like.

The transistor 4010 provided in the display portion 215 is electrically connected to the display element. FIG. 26(A) illustrates an example of a liquid crystal display device using a liquid crystal element as the display element. In FIG. 26(A), a liquid crystal element 4013 serving as the display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A liquid crystal element having a variety of modes can be used as the liquid crystal element 4013. For example, a liquid crystal element using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Bend) mode, an FLC (Ferroelectric Liquid Crystal) mode, an AFLC (AntiFerroelectric Liquid Crystal) mode, an ECB (Electrically Controlled Birefringence) mode, a VA-IPS mode, a guest-host mode, or the like can be used.

As the liquid crystal display device described in this embodiment, a normally black liquid crystal display device such as a transmissive liquid crystal display device employing a vertical alignment (VA) mode may be used. As the vertical alignment mode, an MVA (Multi-Domain Vertical Alignment) mode, a PVA (Patterned Vertical Alignment) mode, an ASV (Advanced Super View) mode, and the like can be used.

Note that the liquid crystal element is an element that controls transmission and non-transmission of light by the optical modulation action of liquid crystal. The optical modulation action of the liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Although an example of a liquid crystal display device including a liquid crystal element with a vertical electric field mode is illustrated in FIG. 26, one embodiment of the present invention can be applied to a liquid crystal display device including a liquid crystal element with a horizontal electric field mode. In the case of employing a horizontal electric field mode, a liquid crystal exhibiting a blue phase for which an alignment film is not used may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material of 5 weight % or more is mixed is used for the liquid crystal layer 4008 in order to improve the temperature range. The liquid crystal composition that contains a liquid crystal exhibiting a blue phase and a chiral material has a short response speed and exhibits optical isotropy. In addition, the liquid crystal composition containing a liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the liquid crystal display device in the manufacturing process can be reduced.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display device illustrated in FIG. 26(A), a light-blocking layer 4132, a coloring layer 4131, and an insulating layer 4133 are provided between the substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Examples of a material that can be used for the coloring layer include a metal material, a resin material, and a resin material containing a pigment or a dye. The light-blocking layer and the coloring layer can be formed by an inkjet method, for example.

The display devices shown in FIGS. 26(A) and 26(B) each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

A light-emitting element can be used as the display element included in the display device. As the light-emitting element, for example, an EL element that utilizes electroluminescence can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined, the light-emitting organic compound forms an excited state, and light is emitted when the excited state returns to a ground state. Owing to such a mechanism, this light-emitting element is referred to as a current-excitation light-emitting element.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is positioned between dielectric layers, which are further positioned between electrodes, and its light emission mechanism is localization type light emission that utilizes inner-shell electron transition of metal ions. Note that the description is made here using an organic EL element as the light-emitting element.

In order to extract light emitted from the light-emitting element, at least one of the pair of electrodes needs to be transparent. A transistor and a light-emitting element are formed over a substrate. The light-emitting element can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting element having any of the emission structures can be used.

FIG. 26(B) shows an example of a light-emitting display device using a light-emitting element as a display element (also referred to as an "EL display device"). A light-emitting element 4513 serving as the display element is electrically connected to the transistor 4010 provided in the display portion 215. Note that the structure of the light-emitting element 4513 is a stacked-layer structure of the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The partition wall 4510 is formed using an organic insulating material or an inorganic insulating material. It is particularly preferable that the partition wall 4510 be formed using a photosensitive resin material to have an opening portion over the first electrode layer 4030 such that a side surface of the opening portion slopes with continuous curvature.

The light-emitting layer 4511 may be formed using a single layer or a plurality of layers stacked.

The emission color of the light-emitting element 4513 can be white, red, green, blue, cyan, magenta, yellow, or the like depending on the material for the light-emitting layer 4511.

As a color display method, there are a method in which the light-emitting element 4513 that emits white light is combined with a coloring layer and a method in which the light-emitting element 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method.

In the latter method, the color purity can be further increased when the light-emitting element 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic-based resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 27:
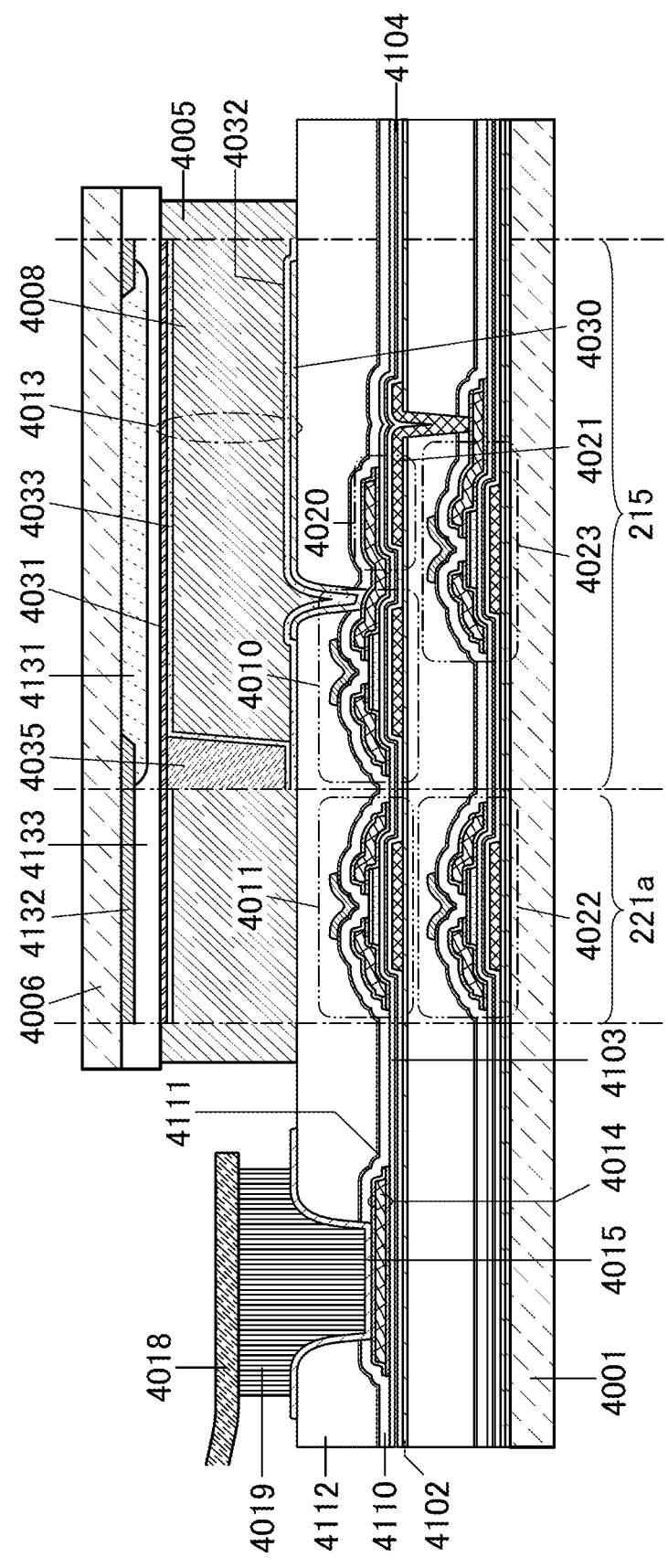
FIG. 27 A diagram illustrating a display device.

Note that as illustrated in FIG. 27, a stacked structure including a region where a transistor and a capacitor overlap with each other in the height direction may be employed. For example, when the transistor 4011 and a transistor 4022 included in the driver circuit are provided to overlap with each other, a display device with a narrow bezel can be provided. Furthermore, when the transistor 4010, a transistor 4023, the capacitor 4020, and the like included in the pixel circuit are provided to at least partly overlap with each other, the aperture ratio and the resolution can be improved. Although an example in which the stacked structure is employed for the liquid crystal display device illustrated in FIG. 26(A) is illustrated in FIG. 27, the stacked structure may be employed for the EL display device illustrated in FIG. 26(B).

In addition, a light-transmitting conductive film with high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

The display device may have a structure with a combination of a liquid crystal display device and a light-emitting device.

The light-emitting device is disposed on the side opposite to the display surface or on an end portion of the display surface. The light-emitting device has a function of supplying light to the display element. The light-emitting device can also be referred to as a backlight.

Here, the light-emitting device can include a plate-like or sheet-like light guide portion (also referred to as a light guide plate) and a plurality of light-emitting elements which emit light of different colors. When the light-emitting elements are disposed in the vicinity of the side surface of the light guide portion, light can be emitted from the side surface of the light guide portion to the inside. The light guide portion has a mechanism that changes an optical path (also referred to as a light extraction mechanism), and this enables the light-emitting device to emit light uniformly to a pixel portion of a display panel. Alternatively, the light-emitting device may be provided directly under the pixel without providing the light guide portion.

The light-emitting device preferably includes light-emitting elements of three colors, red (R), green (G), and blue (B). In addition, a light-emitting element of white (W) may be included. A light emitting diode (LED) is preferably used as these light-emitting elements.

Furthermore, the light-emitting elements preferably have extremely high color purities; the full width at half maximum (FWHM) of the emission spectrum of the light-emitting element is less than or equal to 50 nm, preferably less than or equal to 40 nm, more preferably less than or equal to 30 nm, still more preferably less than or equal to 20 nm. Note that the full width at half maximum of the emission spectrum is preferably as small as possible, and can be, for example, greater than or equal to 1 nm. Thus, when color display is performed, a vivid image with high color reproducibility can be displayed.

As the red light-emitting element, an element whose wavelength of an emission spectrum peak is in a range from 625 nm to 650 nm is preferably used. As the green light-emitting element, an element whose wavelength of an emission spectrum peak is in a range from 515 nm to 540 nm is preferably used. As the blue light-emitting element, an element whose wavelength of an emission spectrum peak is in a range from 445 nm to 470 nm is preferably used.

The display device can make the light-emitting elements for the three colors blink sequentially, drive the pixels in synchronization with these light-emitting elements, and perform color display on the basis of the successive additive color mixing method. This driving method can also be referred to as a field-sequential driving.

By the field-sequential driving, a clear color image can be displayed. In addition, a smooth moving image can be displayed. When the above-described driving method is used, one pixel does not need to be formed with subpixels of different colors, which can make an effective reflection area (also referred to as an effective display area or an aperture ratio) per pixel large; thus, a bright image can be displayed. Furthermore, the pixels do not need to be provided with color filters, and thus can have improved transmittance and achieve brighter image display. In addition, the manufacturing process can be simplified, and the manufacturing costs can be reduced.

FIGS. 28(A) and 28(B) each illustrate an example of a schematic cross-sectional view of a display device capable of the field-sequential driving. A backlight unit capable of emitting light of RGB colors is provided on the substrate 4001 side of the display device. Note that in the field-sequential driving, the RGB colors are expressed through time division light emission, and thus color filters are not needed.

A backlight unit 4340a illustrated in FIG. 28(A) has a structure in which a plurality of light-emitting elements 4342 are provided directly under a pixel with a diffusing plate 4352 positioned therebetween. The diffusing plate 4352 have functions of diffusing light emitted from the light-emitting element 4342 to the substrate 4001 side and making the luminance in a display portion uniform. Between the light-emitting element 4342 and the diffusing plate 4352, a polarizing plate may be provided if necessary. The diffusing plate 4352 is not necessarily provided if not needed. The light-blocking layer 4132 may be omitted.

The backlight unit 4340a can include a large number of light-emitting elements 4342, which enables bright image display. Moreover, there are advantages that a light guide plate is not needed and light efficiency of the light-emitting element 4342 is less likely to be lowered. Note that the light-emitting element 4342 may be provided with a light diffusion lens 4344 if necessary.

A backlight unit 4340b illustrated in FIG. 28(B) has a structure in which a light guide plate 4341 is provided directly under a pixel with the diffusing plate 4352 positioned therebetween. The plurality of light-emitting elements 4342 are provided at an end portion of the light guide plate 4341. The light guide plate 4341 has an uneven shape on the side opposite to the diffusing plate 4352, and can scatter waveguided light with the uneven shape to emit the light in the direction of the diffusing plate 4352.

The light-emitting element 4342 can be fixed to a printed circuit board 4347. Note that in FIG. 28(B), the light-emitting elements 4342 of RGB colors overlap with each other; however, the light-emitting elements 4342 of RGB colors can be arranged to be lined up in the depth direction. A reflective layer 4348 that reflects visible light may be provided on the side surface of the light guide plate 4341 which is opposite to the light-emitting element 4342.

The backlight unit 4340b can reduce the number of light-emitting elements 4342, leading to reductions in cost and thickness.

A light-scattering liquid crystal element may be used as the liquid crystal element. The light-scattering liquid crystal element is preferably an element containing a composite material of liquid crystal and a polymer molecule. For example, a polymer dispersed liquid crystal element can be used. Alternatively, a polymer network liquid crystal (PNLC) element may be used.

The light-scattering liquid crystal element has a structure in which a liquid crystal portion is provided in a three-dimensional network structure of a resin portion sandwiched between a pair of electrodes. As a material used in the liquid crystal portion, for example, a nematic liquid crystal can be used. A photocurable resin can be used for the resin portion. The photocurable resin can be a monofunctional monomer, such as acrylate or methacrylate; a polyfunctional monomer, such as diacrylate, triacrylate, dimethacrylate, or trimethacrylate; or a polymerizable compound obtained by mixing these.

The light-scattering liquid crystal element performs display by transmitting or scattering light utilizing the anisotropy of a refractive index of a liquid crystal material. The resin portion may have the anisotropy of a refractive index. When liquid crystal molecules are arranged in a certain direction in accordance with a voltage applied to the light-scattering liquid crystal element, a direction is generated at which a difference in a refractive index between the liquid crystal portion and the resin portion is small. Incident light along the direction passes without being scattered in the liquid crystal portion. Thus, the light-scattering liquid crystal element is perceived in a transparent state from the direction. In contrast, when liquid crystal molecules are arranged randomly in accordance with the applied voltage, a large difference in refractive index between the liquid crystal portion and the resin portion is not generated, and incident light is scattered in the liquid crystal portion. Thus, the light-scattering liquid crystal element is in an opaque state regardless of the viewing direction.

FIG. 29(A) illustrates a structure in which the liquid crystal element 4013 of the display device illustrated in FIG. 28(A) is replaced with a light-scattering liquid crystal element 4016. The light-scattering liquid crystal element 4016 includes a composite layer 4009 including a liquid crystal portion and a resin portion and electrode layers 4030 and 4031. Although components relating to the field-sequential driving are the same as those in FIG. 28(A), when the light-scattering liquid crystal element 4016 is used, an alignment film and a polarizing plate are not necessary. Note that the spherical spacer 4035 is illustrated, but the spacer 4035 may have a columnar shape.

FIG. 29(B) illustrates a structure in which the liquid crystal element 4013 of the display device illustrated in FIG. 28(B) is replaced with the light-scattering liquid crystal element 4016. In the structure of FIG. 28(B), it is preferable that light be transmitted when a voltage is not applied to the light-scattering liquid crystal element 4016, and light be scattered when a voltage is applied. With such a structure, the display device can be transparent in a normal state (without display). In that case, color display can be performed when light scattering operation is performed.

FIGS. 30(A) to 30(E) illustrate modification examples of the display device in FIG. 29(B). Note that in FIGS. 30(A) to 30(E), some components in FIG. 29(B) are used and the other components are not illustrated for simplicity.

Figure 30A:
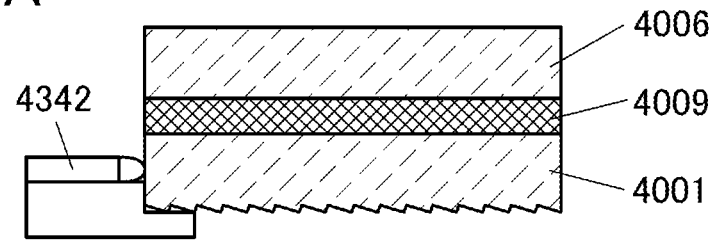
FIGS. 30(A) to (E) Diagrams illustrating a display device.

FIG. 30(A) illustrates a structure in which the substrate 4001 has a function of a light guide plate. An uneven surface may be provided on an outer surface of the substrate 4001. With this structure, a light guide plate does not need to be provided additionally, leading to a reduction in a manufacturing cost. Furthermore, the attenuation of light caused by the light guide plate also does not occur; accordingly, light emitted from the light-emitting element 4342 can be efficiently utilized.

Figure 30B:
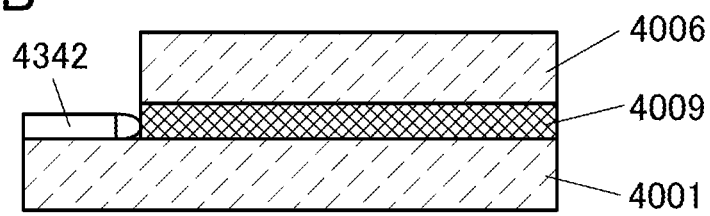

FIG. 30(B) illustrates a structure in which light enters from the vicinity of an end portion of the composite layer 4009. By utilizing total reflection at the interface between the composite layer 4009 and the substrate 4006 and the interface between the composite layer 4009 and the substrate 4001, light can be emitted to the outside from the light-scattering liquid crystal element. For the resin portion of the composite layer 4009, a material having a refractive index higher than that of the substrate 4001 and that of the substrate 4006 is used.

Figure 30C:
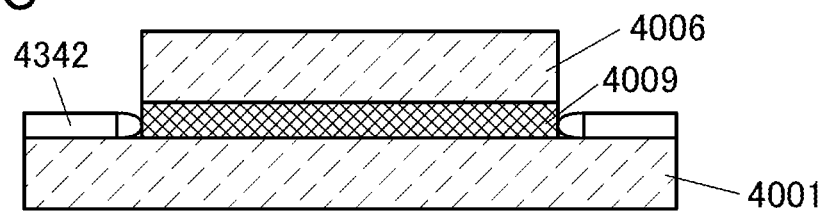

Note that the light-emitting element 4342 is not limited to be provided on one side of the display device, and may be provided on each of two sides facing each other as illustrated in FIG. 30(C). Furthermore, the light-emitting elements 4342 may be provided on three sides or four sides. When the light-emitting elements 4342 are provided on a plurality of sides, attenuation of light can be compensated for and application to a large-area display element is possible.

Figure 30D:
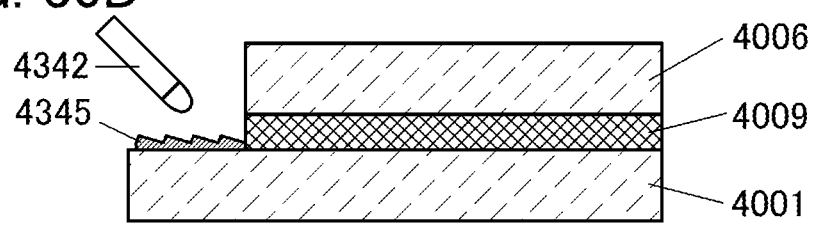

FIG. 30(D) illustrates a structure in which light emitted from the light-emitting element 4342 is guided to the display device through a mirror 4345. With this structure, light can be guided easily with a certain angle to the display device; thus, total reflection light can be obtained efficiently.

Figure 30E:
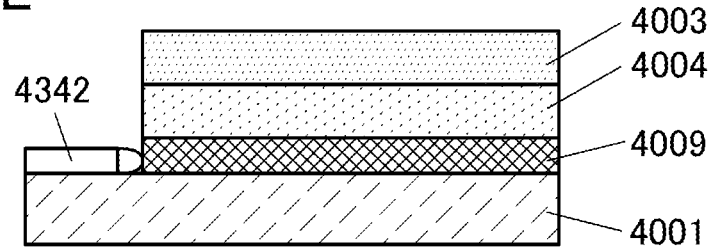

FIG. 30(E) illustrates a structure in which a layer 4003 and a layer 4004 are stacked over the composite layer 4009. One of the layer 4003 and the layer 4004 is a support such as a glass substrate, and the other can be formed of an inorganic film, a coating film of an organic resin, a film, or the like. For the resin portion of the composite layer 4009, a material having a refractive index higher than that of the layer 4004 is used. For the layer 4004, a material having a refractive index higher than that of the layer 4003 is used.

A first interface is formed between the composite layer 4009 and the layer 4004, and a second interface is formed between the layer 4004 and the layer 4003. With this structure, light passing through without being totally reflected at the first interface is totally reflected at the second interface and can be returned to the composite layer 4009. Accordingly, light emitted from the light-emitting element 4342 can be efficiently utilized.

Note that the structures in FIG. 29(B) and FIGS. 30(A) to 30(E) can be combined with each other.

This embodiment can be implemented in combination with any of the structures described in the other embodiments and the like, as appropriate.

Embodiment 3

In this embodiment, examples of transistors which can be used as the transistors described in the above embodiments are described with reference to drawings.

The display device of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

[Bottom-Gate Transistor]

FIG. 31(A1) is a cross-sectional view of a channel-protective transistor 810, which is a type of bottom-gate transistor, in the channel length direction. In FIG. 31(A1), the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

Furthermore, an insulating layer 741 is provided over a channel formation region in the semiconductor layer 742. Furthermore, an electrode 744a and an electrode 744b are provided to be partly in contact with the semiconductor layer 742 and over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 31(A2) is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or an arbitrary potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 31(B1) is a cross-sectional view of a channel-protective transistor 820, which has a structure different from FIG. 31(A1), in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 729 that overlaps with the semiconductor layer 742. The semiconductor layer 742 is electrically connected to the electrode 744b through another opening portion formed by selectively removing part of the insulating layer 729 that overlaps with the semiconductor layer 742. A region of the insulating layer 729 that overlaps with the channel formation region can function as a channel protective layer.

A transistor 821 illustrated in FIG. 31(B2) is different from the transistor 820 in that the electrode 723 that can function as a back gate electrode is provided over the insulating layer 729.

With the insulating layer 729, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

FIG. 31(C1) is a cross-sectional view of a channel-etched transistor 825, which is a type of bottom-gate transistor, in the channel length direction. In the transistor 825, the electrode 744a and the electrode 744b are formed without the insulating layer 729. Thus, part of the semiconductor layer 742 that is exposed at the time of forming the electrode 744a and the electrode 744b might be etched. However, since the insulating layer 729 is not provided, the productivity of the transistor can be increased.

The transistor 825 illustrated in FIG. 31(C2) is different from the transistor 820 in that the electrode 723 that can function as a back gate electrode is provided over the insulating layer 729.

FIGS. 32(A1) to 32(C2) are cross-sectional views of the transistors 810, 811, 820, 821, 825, and 826 in the channel width direction, respectively.

In each of the structures illustrated in FIGS. 32(B2) and 32(C2), the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be electrically surrounded by electric fields of the gate electrode and the back gate electrode. The transistor device structure in which the semiconductor layer 742 in which the channel formation region is formed is electrically surrounded by electric fields of the gate electrode and the back gate electrode, as in the transistor 821 or the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

[Top-Gate Transistor]

A transistor 842 illustrated in FIG. 33(A1) is a type of top-gate transistor. The transistor 842 is different from the transistor 830 or the transistor 840 in that the electrode 744a and the electrode 744b are formed after the formation of the insulating layer 729. The electrode 744a and the electrode 744b are electrically connected to the semiconductor layer 742 through opening portions formed in the insulating layer 728 and the insulating layer 729.

Part of the insulating layer 726 that does not overlap with the electrode 746 is removed, and an impurity 755 is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced not through the insulating layer 726. Thus, an LDD (Lightly Doped Drain) region is formed in the region of the semiconductor layer 742 that does not overlap with the electrode 746.

A transistor 843 illustrated in FIG. 33(A2) is different from the transistor 842 in that the electrode 723 is included. The transistor 843 includes the electrode 723 that is formed over the substrate 771. The electrode 723 includes a region overlapping with the semiconductor layer 742 with the insulating layer 772 therebetween. The electrode 723 can function as a back gate electrode.

As in a transistor 844 illustrated in FIG. 33(B1) and a transistor 845 shown in FIG. 33(B2), the insulating layer 726 in a region that does not overlap with the electrode 746 may be completely removed. Alternatively, as in a transistor 846 illustrated in FIG. 33(C1) and a transistor 847 illustrated in FIG. 33(C2), the insulating layer 726 may be left.

Also in the transistor 842 to the transistor 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIGS. 34(A1) to 34(C2) are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in combination with any of the structures described in the other embodiments and the like, as appropriate.

Embodiment 4

Examples of an electronic device that can use the display device of one embodiment of the present invention include display devices, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 35 show specific examples of such electronic devices.

Figure 35A:
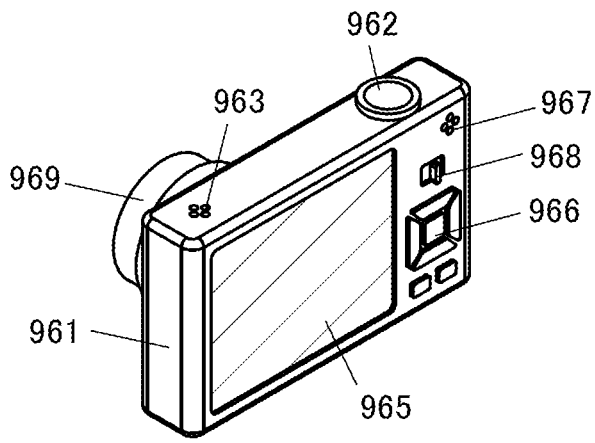
FIG. 35(A) to (F) Diagrams each illustrating an electronic device.

FIG. 35(A) shows a digital camera, which includes a housing 961, a shutter button 962, a microphone 963, a speaker 967, a display portion 965, operation keys 966, a zoom lever 968, a lens 969, and the like. The use of the display device of one embodiment of the present invention for the display portion 965 enables display of a variety of images.

Figure 35B:
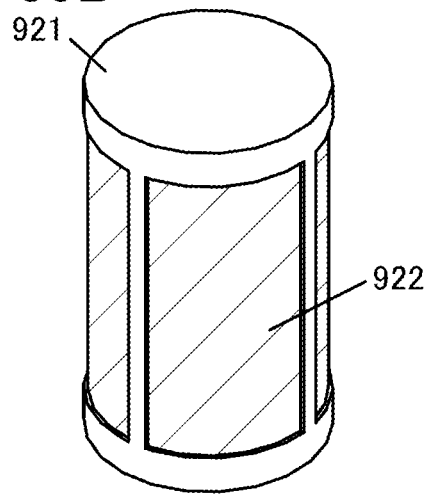

FIG. 35(B) shows a digital signage, which has large display portions 922. The digital signage can be installed on the side surface of a pillar 921, for example. The use of the display device of one embodiment of the present invention for the display portion 922 enables display with high display quality.

Figure 35C:
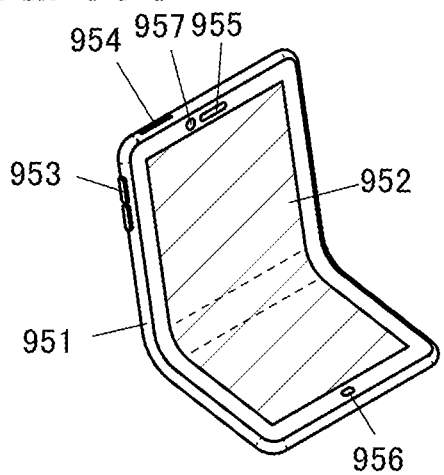

FIG. 35(C) shows an example of a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. A housing 901 and the display portion 952 have flexibility and can be used in a bent state as shown in the figure. The use of the display device of one embodiment of the present invention for the display portion 952 enables display of a variety of images.

Figure 35D:
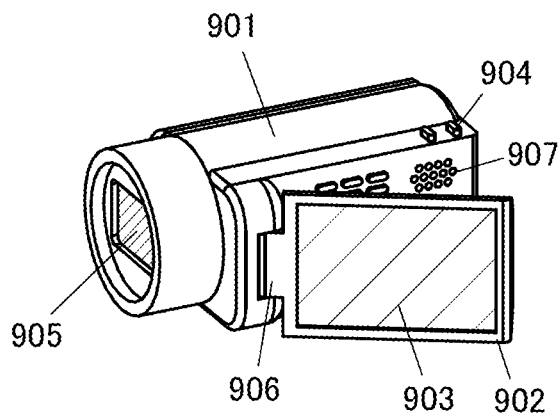

FIG. 35(D) is a video camera, which includes a first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. The use of the display device of one embodiment of the present invention for the display portion 903 enables display of a variety of images.

Figure 35E:
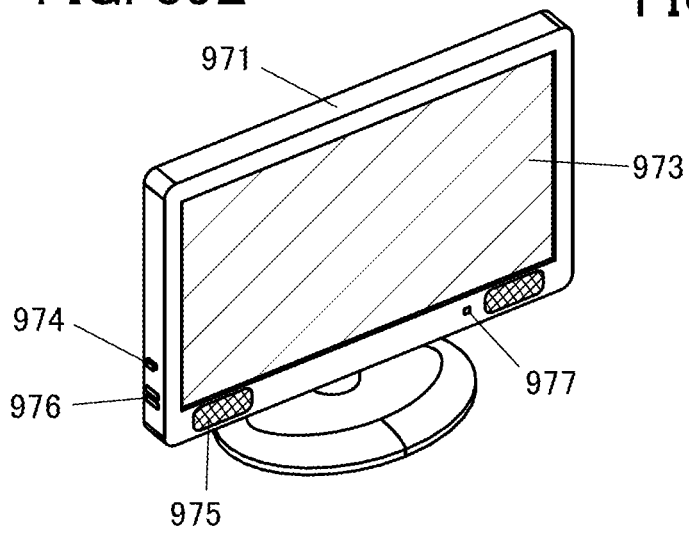

FIG. 35(E) shows a television, which includes a housing 971, a display portion 973, an operation key 974, speakers 975, a communication connection terminal 976, an optical sensor 977, and the like. The display portion 973 includes a touch sensor that enables input operation. The use of the display device of one embodiment of the present invention for the display portion 973 enables display of a variety of images.

Figure 35F:
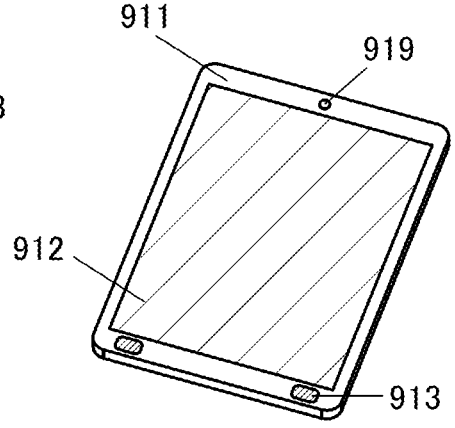

FIG. 35(F) shows a portable data terminal, which includes a housing 911, a display portion 912, speakers 913, a camera 919, and the like. A touch panel function of the display portion 912 enables input and output of information. The use of the display device of one embodiment of the present invention for the display portion 912 enables display of a variety of images.

This embodiment can be implemented in combination with any of the structures described in the other embodiments and the like, as appropriate.

REFERENCE NUMERALS

10: circuit, 11: circuit, 12: pixel block, 13: source driver, 14a: gate driver, 14b: gate driver, 15: circuit, 20: pixel, 101: transistor, 102: transistor, 103: transistor, 104: capacitor, 105: transistor, 106: transistor, 107: capacitor, 110: circuit block, 111: transistor, 112: transistor, 113: capacitor, 114: light-emitting element, 115: transistor, 116: capacitor, 117: liquid crystal element, 118: transistor, 119: transistor, 120: circuit, 121: wiring, 122: wiring, 123: wiring, 125: wiring, 126: wiring, 127: wiring, 128: wiring, 129: wiring, 130: wiring, 131: wiring, 132: wiring, 133: wiring, 134: wiring, 135: wiring, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 826: transistor, 830: transistor, 840: transistor, 842: transistor, 843: transistor, 844: transistor, 845: transistor, 846: transistor, 847: transistor, 901: housing, 902: housing, 903: display portion, 904: operation key, 905: lens, 906: connection portion, 907: speaker, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 4001: substrate, 4003: layer, 4004: layer, 4005: sealant, 4006: substrate, 4008: liquid crystal layer, 4009: composite layer, 4010: transistor, 4011: transistor, 4013: liquid crystal element, 4014: wiring, 4015: electrode, 4016: light-scattering liquid crystal element, 4017: electrode, 4018: FPC, 4019: anisotropic conductive layer, 4020: capacitor, 4021: electrode, 4022: transistor, 4023: transistor, 4030: electrode layer, 4031: electrode layer, 4032: insulating layer, 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4340a: backlight unit, 4340b: backlight unit, 4341: light guide plate, 4342: light-emitting element, 4344: lens, 4345: mirror, 4347: printed circuit board, 4348: reflective layer, 4352: diffusing plate, 4510: partition wall, 4511: light-emitting layer, 4513: light-emitting element, 4514: filler

The invention claimed is:

1. A display device comprising a plurality of pixel blocks,
wherein each of the plurality of pixel blocks comprises a first circuit and a plurality of second circuits,
wherein the first circuit and the plurality of second circuits are electrically connected to each other,
wherein each of the plurality of pixel blocks comprises a plurality of pixels,
wherein one of the plurality of pixels comprises a plurality of components of the first circuit, and
wherein a length in a source line direction of the one of the plurality of pixels is larger than a length in the source line direction of another one of the plurality of pixels.

2. The display device according to claim 1,
wherein the first circuit comprises a first transistor, a second transistor, and a first capacitor,
wherein one of a source and a drain of the first transistor is electrically connected to one electrode of the first capacitor,
wherein the other electrode of the first capacitor is electrically connected to one of a source and a drain of the second transistor,
wherein a gate of the first transistor is electrically connected to a first gate line, and
wherein a gate of the second transistor is electrically connected to a second gate line.

3. The display device according to claim 2,
further comprising a third transistor,
wherein one of a source and a drain of the third transistor is electrically connected to the other electrode of the first capacitor, and
wherein the other of the source and the drain of the first transistor and the other of the source and the drain of the second transistor are electrically connected to each other, and
wherein a gate of the third transistor is electrically connected to a third gate line.

4. The display device according to claim 2,
wherein each of the plurality of second circuits comprises the third transistor and a third circuit,
wherein the one of the source and the drain of the third transistor is electrically connected to the one of the source and the drain of the first transistor,
wherein the other of the source and the drain of the third transistor is electrically connected to the third circuit, and
wherein the third circuit comprises a display element.

5. The display device according to claim 4,
wherein the third circuit comprises a fourth transistor, a second capacitor, and a light-emitting element as the display element,
wherein a gate of the fourth transistor is electrically connected to the other of the source and the drain of the third transistor,
wherein one of a source and a drain of the fourth transistor is electrically connected to one electrode of the light-emitting element,
wherein the one electrode of the light-emitting element is electrically connected to one electrode of the second capacitor, and
wherein the other electrode of the second capacitor is electrically connected to the gate of the fourth transistor.

6. The display device according to claim 5,
further comprising a fifth transistor,
wherein one of a source and a drain of the fifth transistor is electrically connected to the one electrode of the light-emitting element,
wherein the other of the source and the drain of the fifth transistor is electrically connected to one of the source and the drain of the fourth transistor, and
wherein the other of the source and the drain of the fifth transistor is electrically connected to the one electrode of the second capacitor.

7. The display device according to claim 4,
wherein the third circuit comprises a liquid crystal element as the display element, and
wherein one electrode of the liquid crystal element is electrically connected to the one of the source and the drain of the third transistor.

8. The display device according to claim 7,
further comprising a third capacitor,
wherein one electrode of the third capacitor is electrically connected the one electrode of the liquid crystal element.

9. The display device according to claim 1,
further comprising a fourth circuit and a fifth circuit,
wherein the fourth circuit is configured to control the first circuit, and
wherein the fifth circuit is configured to control the plurality of second circuits.

10. The display device according to claim 1,
wherein a transistor included in the pixel block comprises metal oxide in a channel formation region, and wherein the metal oxide comprises In, Zn, and M (M is Al, Ti, Ga, Sn, Y, Zr, La, Ce, Nd, or Hf).

* * * * *